(12) United States Patent
Hagihara et al.

(10) Patent No.: US 7,271,432 B2
(45) Date of Patent: Sep. 18, 2007

(54) IMAGE-SENSING APPARATUS

(75) Inventors: Yoshio Hagihara, Amagasaki (JP); Kenji Takada, Itami (JP)

(73) Assignee: Minolta Co., Ltd., Osaka (JP)

( * ) Notice: Subject to any disclaimer, the term of this patent is extended or adjusted under 35 U.S.C. 154(b) by 92 days.

(21) Appl. No.: 11/198,807

(22) Filed: Aug. 5, 2005

(65) Prior Publication Data
US 2005/0280056 A1 Dec. 22, 2005

Related U.S. Application Data

(62) Division of application No. 09/619,435, filed on Jul. 19, 2000, now Pat. No. 6,950,136.

(30) Foreign Application Priority Data

Jul. 22, 1999 (JP) ............................... 11-208296
Sep. 27, 1999 (JP) ............................... 11-272584
Sep. 30, 1999 (JP) ............................... 11-279386

(51) Int. Cl.
*H01L 31/062* (2006.01)
(52) U.S. Cl. ..................... 257/292; 257/290
(58) Field of Classification Search ............... 257/431, 257/292, 290; 348/294–324
See application file for complete search history.

(56) References Cited

U.S. PATENT DOCUMENTS

| 5,241,575 A | 8/1993 | Miyatake et al. ............ 257/292 |
| 5,289,286 A | 2/1994 | Nakamura et al. .......... 348/223 |
| 5,541,654 A | 7/1996 | Roberts ...................... 348/302 |
| 5,837,993 A | 11/1998 | Philippe et al. .......... 250/208.1 |
| 6,323,479 B1 | 11/2001 | Hynecek et al. ............ 348/308 |
| 6,512,544 B1 | 1/2003 | Merrill et al. .............. 348/297 |
| 6,521,926 B1 | 2/2003 | Sasaki ........................ 257/292 |
| 6,734,907 B1 | 5/2004 | Hagihara et al. ........... 348/308 |
| 6,950,136 B1 * | 9/2005 | Hagihara et al. ........... 348/302 |

* cited by examiner

*Primary Examiner*—Roy Karl Potter
(74) *Attorney, Agent, or Firm*—Sidley Austin LLP

(57) ABSTRACT

In a solid-state image-sensing device, when image sensing is performed, in each pixel, MOS transistors T1 and T5 are turned on and a MOS transistor T6 is turned off so that a MOS transistor T2 operates in a subthreshold region. When resetting is preformed, in each pixel, the MOS transistors T1 and T5 are turned off and the MOS transistor T6 is turned on so that the gate voltage of the MOS transistor T2 is kept constant. In this state, the MOS transistor T2 is brought first into a conducting state and then, by turning a signal φVPS to a high level, into a cut-off state. This permits a signal proportional to the threshold value of the MOS transistor T2 to be output as compensation data.

11 Claims, 64 Drawing Sheets

IMAGE-SENSING APPARATUS

This application is a divisional application of application No. 09/619,435, filed Jul. 19, 2000, now U.S. Pat. No. 6,950,136, issued Sep. 27, 2005, which is based on application Nos. H11-208296, H11-272584, and H11-279386 filed in Japan on Jul. 22, 1999, Sep. 27, 1999, and Sep. 30, 1999, respectively, the entire contents of which are hereby incorporated by reference.

BACKGROUND OF THE INVENTION

1. Field of the Invention

The present invention relates to an image-sensing apparatus, and particularly to an image-sensing apparatus incorporating a solid-state image-sensing device having a plurality of pixels arranged therein.

2. Description of the Prior Art

Solid-state image-sensing devices designed for use in image-sensing apparatuses are not only small-sized, lightweight, and power-saving, but also free from image distortion, free from image burn-in, and resistant to unfavorable environmental conditions such as vibration and electric fields. Moreover, such image-sensing devices can be manufactured by a process common or analogous to one used to manufacture LSIs (large-scale integrated circuits), and therefore they are reliable and fit for mass production. For these reasons, solid-state image-sensing devices having pixels arranged in a line are widely used in facsimile machines, flat-bed scanners, and the like, and solid-state image-sensing devices having pixels arranged in a matrix are widely used in video cameras, digital cameras, and the like. Solid-state image-sensing devices are roughly grouped into two types according to the means they use to read out (extract) the photoelectric charges generated in their photoelectric conversion devices, namely a CCD type and a MOS type. A CCD-type image-sensing device accumulates photoelectric charges in potential wells while transferring them, and has the disadvantage of a comparatively narrow dynamic range. On the other hand, a MOS-type image-sensing device reads out electric charges accumulated in the pn-junction capacitances of photodiodes through MOS transistors.

Now, how each pixel is configured in a conventional MOS-type solid-state image-sensing device will be described with reference to FIG. 96. As shown in this figure, a photodiode PD has its cathode connected to the gate of a MOS transistor T101 and to the source of a MOS transistor T102. The MOS transistor T101 has its source connected to the drain of a MOS transistor T103, and this MOS transistor T103 has its source connected to an output signal line VOUT. A direct-current voltage VPD is applied to the drain of the MOS transistor T101 and to the drain of the MOS transistor T102, and a direct-current voltage VPS is applied to the anode of the photodiode.

When light enters the photodiode PD, a photoelectric charge is generated therein, and this electric charge is accumulated at the gate of the MOS transistor T101. Here, when a pulse signal $\phi V$ is fed to the gate of the MOS transistor T103 to turn this MOS transistor T103 on, a current proportional to the electric charge accumulated at the gate of the MOS transistor T101 flows through the MOS transistors T101 and T103 to the signal output line. In this way, it is possible to read an output current that is proportional to the amount of incident light. After this signal has been read, the MOS transistor T103 is turned off and thereby the MOS transistor T102 is turned on so that the gate voltage of the MOS transistor T101 will be initialized.

As described above, in a conventional MOS-type solid-state image-sensing device, at each pixel, the photoelectric charge generated in the photodiode PD and then accumulated at the gate of the MOS transistor T101 is directly read out. This, however, leads to a narrow dynamic range and thus demands accurate control of the amount of exposure. Moreover, even if the amount of exposure is controlled accurately, the obtained image tends to suffer from flat blackness in dim portions thereof and saturation in bright portions thereof.

On the other hand, the assignee of the present invention has once proposed a solid-state image-sensing device including a light-sensing means that generates a photoelectric current in accordance with the amount of incident light, a MOS transistor to which the generated photoelectric current is fed, and a bias-supplying means that supplies a bias to the MOS transistor to bring it into a state in which a subthreshold current flows therethrough so that the photoelectric current is subjected to logarithmic conversion (refer to U.S. Pat. No. 5,241,575). This solid-state image-sensing device offers a wide dynamic range, but tends to suffer from different threshold-value characteristics among the MOS transistors provided in the individual pixels and thus varying sensitivity from one pixel to another. To overcome this, the outputs from the individual pixels in actual shooting of a subject need to be corrected by using compensation data that is stored beforehand by reading the outputs from the pixels with the pixels illuminated with uniformly bright light (uniform light).

However, it is troublesome for a user to illuminate the pixels with an external light source, and moreover it is difficult to illuminate them sufficiently uniformly. On the other hand, providing an image-sensing apparatus with a mechanism for illuminating uniform light complicates the structure of the image-sensing apparatus. To overcome these inconveniences, the inventors of the present invention have been studying various circuit configurations that permit variations in sensitivity among pixels to be canceled without requiring irradiation of uniform light.

SUMMARY OF THE INVENTION

An object of the present invention is to provide a solid-state image-sensing device that, without requiring irradiation of uniform light beforehand, permits accurate acquisition of compensation data to be used to correct the outputs from individual pixels during shooting of a subject.

Another object of the present invention is to provide a solid-state image-sensing device in which variations in sensitivity among pixels are minimized by making the initial states of the individual pixels substantially identical.

Still another object of the present invention is to provide a solid-state image-sensing device in which variations in sensitivity among pixels are minimized by keeping the potentials at the surfaces of gate portions of the individual pixels substantially identical.

To achieve the above objects, according to one aspect of the present invention, an image-sensing apparatus is provided with a photoelectric conversion portion having a photosensitive element that produces an electric signal in accordance with the amount of incident light and a transistor having a first electrode and a control electrode connected to the photosensitive element and a second electrode. This photoelectric conversion portion outputs the electric signal output from the photosensitive element and converted natural-logarithmically by making the transistor operate in a subthreshold region. Moreover, the image-sensing apparatus is further provided with a lead-out path by way of which the electric signal output from the photoelectric conversion portion is fed to an output signal line, a constant-current source, and a controller that resets the transistor by feeding a current from the constant-current source to the transistor in such a way as to make the voltage at the control electrode of the transistor equal to a predetermined voltage corresponding to the transistor.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Image-Sensing Apparatus

Figure 1:
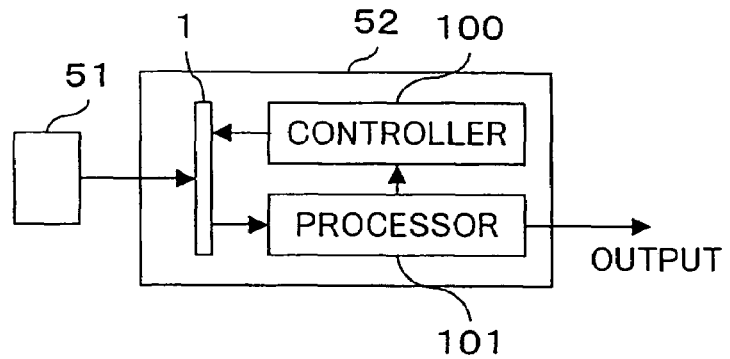
FIG. 1 is a block diagram showing the internal configuration of an image-sensing apparatus according to the invention.

First, an image-sensing apparatus according to the present invention will be described with reference to the drawings. FIG. 1 is a block diagram showing the internal configuration of an image-sensing apparatus according to the invention. The image-sensing apparatus 52 shown in FIG. 1 includes the following components. A solid-state image-sensing device 1 receives the light from a subject through an objective lens 51. A controller 100 controls the operation of the solid-state image-sensing device 1. A processor 101 checks whether the output of the solid-state image-sensing device 1 is compensation data or image data, and outputs it.

In this image-sensing apparatus 52 configured as described above, the controller 100, by switching the voltage of a signal φS or φSW1 fed to the individual pixels provided in the solid-state image-sensing device 1, switches the operation of the individual pixels between image sensing operation and resetting operation. Moreover, the controller 100, by feeding a pulse signal φV to the individual pixels, makes them feed the electric signals obtained as image data or compensation data as a result of photoelectric conversion to the processor 101.

In this way, the solid-state image-sensing device 1 is controlled by the controller 100 by being fed with various signals as mentioned above. The output of the solid-state image-sensing device 1 is fed to the processor 101, and the processor 101 checks, on the basis of the timing with which the output is yielded, whether the output is image data or compensation data, and then outputs it to the succeeding stage. At this time, to permit the controller 100 to recognize whether the signal currently being fed to the succeeding stage is image data or compensation data, the processor 101 feeds the controller 100 with information on the signal that it is currently outputting.

The above-described configuration and operation of the image-sensing apparatus are common to all of the descriptions to follow. Now, the solid-state image-sensing device provided in this image-sensing apparatus will be described.

First Example of the Pixel Configuration

Figure 2:
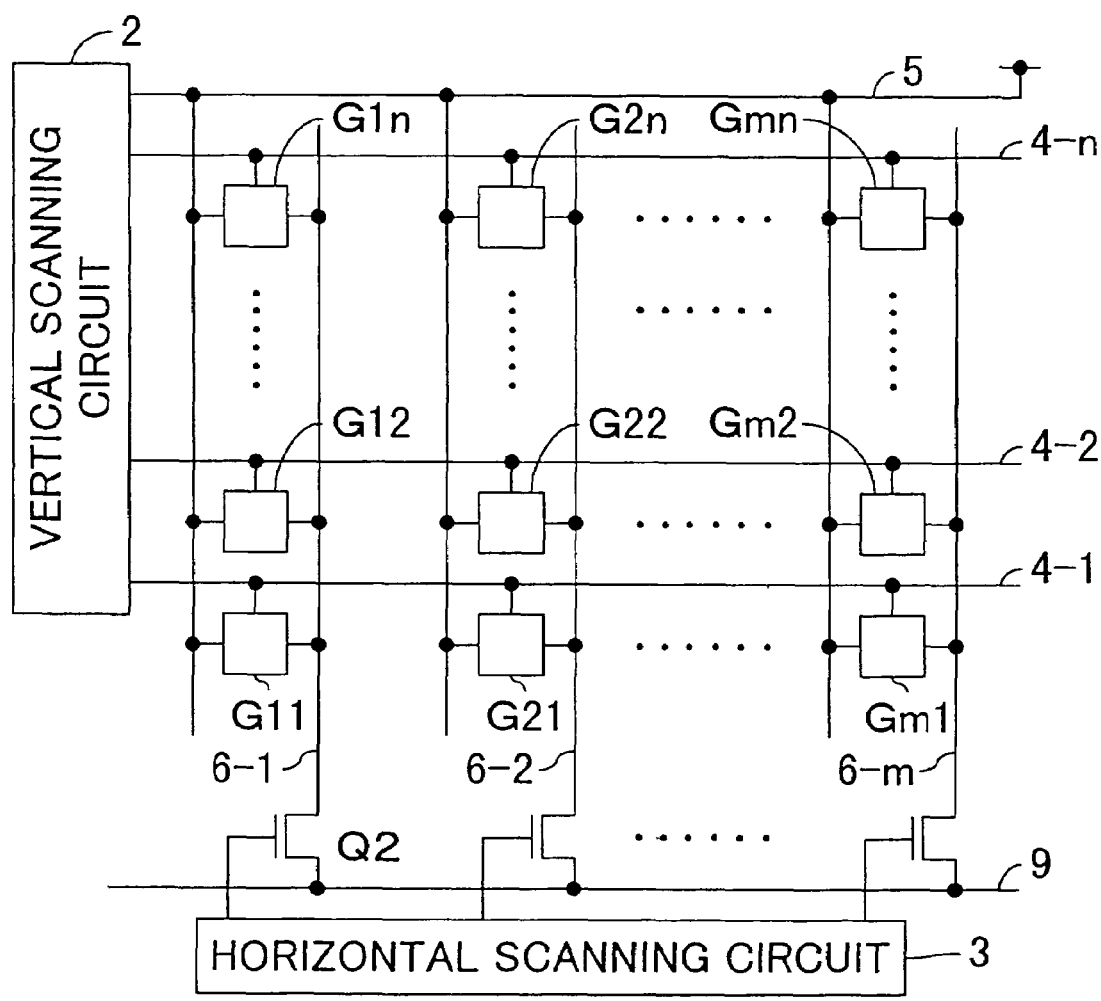
FIG. 2 is a block circuit diagram illustrating the overall configuration of a two-dimensional solid-state image-sensing device embodying the invention.

Hereinafter, solid-state image-sensing devices embodying the present invention will be described with reference to the drawings. FIG. 2 schematically shows the configuration of part of a two-dimensional MOS-type solid-state image-sensing device embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. The individual pixels are connected not only to the lines 4-1, 4-2, . . . , 4-n, to the output signal lines 6-1, 6-2, . . . , 6-m, and to the power line 5 mentioned above, but also to other lines (for example clock lines and bias supply lines). These other lines, however, are omitted in FIG. 2.

As shown in FIG. 2, for each of the output signal lines 6-1, 6-2, . . . , 6-m, one N-channel MOS transistor Q2 is provided. Here, a description will be given only with respect to the output signal line 6-1 as their representative. The MOS transistor Q2 has its drain connected to the output signal line 6-1, has its source connected to a signal line 9 serving as a final destination line, and has its gate connected to the horizontal scanning circuit 3. As will be described later, within each pixel, another N-channel MOS transistor (a fourth MOS transistor) T4 functioning as a switch is provided. Whereas this MOS transistor T4 serves to select a row, the MOS transistor Q2 serves to select a column.

First Embodiment

Now, a first embodiment (FIG. 3) of the invention, which is applicable to each pixel of the first example of the pixel configuration shown in FIG. 2, will be described with reference to the drawings.

Figure 3:
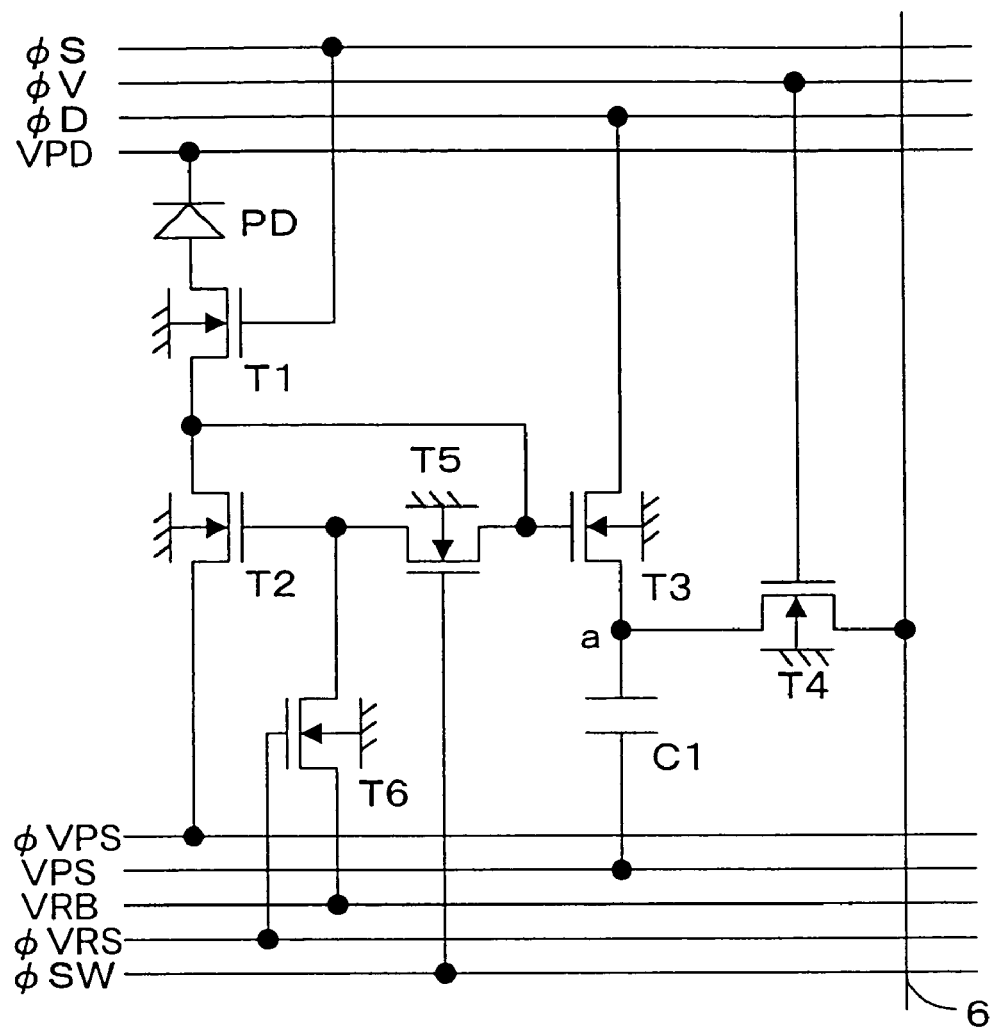
FIG. 3 is a circuit diagram showing the configuration of each pixel in a first embodiment of the invention.

In FIG. 3, a pn photodiode PD serves as a photosensitive element (photoelectric conversion element). The anode of this photodiode PD is connected to the drain of a first MOS transistor T1. The source of this MOS transistor T1 is connected to the drain of a second MOS transistor T2, to the gate of a third MOS transistor T3, and to the drain of the fifth MOS transistor T5. The source of the MOS transistor T3 is connected to the drain of a fourth MOS transistor T4 for selecting a row. The source of this MOS transistor T4 is connected to the output signal line 6 (this output signal line 6 corresponds to the output signal lines 6-1, 6-2, . . . , 6-m in FIG. 2). The MOS transistors T1 to T6 are all N-channel MOS transistors, and have their back gates grounded.

A direct-current voltage VPD is applied to the cathode of the photodiode PD. On the other hand, a signal φVPS is applied to the source of the MOS transistor T2. The source of the MOS transistor T2 is connected to one end of a capacitor C1 that receives a direct-current voltage VPS at the other end. A direct-current voltage VRB is applied to the source of the MOS transistor T6, and a signal φVRS is fed to the gate of the same MOS transistor T6. The drain of this MOS transistor T6 is connected to the gate of the MOS transistor T2 and also to the source of the MOS transistor T5. A signal φD is fed to the drain of the MOS transistor T3.

Moreover, a signal φSW is fed to the gate of the MOS transistor T5, and a signal φS is fed to the gate of the MOS transistor T1. Furthermore, a signal φV is fed to the gate of the MOS transistor T4. In this embodiment, the signal φVPS is a ternary signal that takes one of three predetermined levels, i.e. a low level, a high level, or an intermediate level, at a time. Here, a high level is, for example, a voltage approximately equal to the direct-current voltage VPD, a low level is, for example, a voltage equal to the ground level, and an intermediate level is a voltage that is intermediate between those two voltages and that causes the MOS transistor T2 to operate in a subthreshold region. An intermediate level is, for example, a voltage approximately equal to the direct-current voltage VPS.

(1) How to Convert the Light Incident on the Individual Pixels into an Electric Signal First, the signals φS and φSW are turned to a high level to bring the MOS transistors T1 and T5 into a conducting state. Moreover, the signal φVPS is turned to an intermediate level, so that the MOS transistor T2 operates in a subthreshold region. At this time, a low level is fed as the signal φVRS to the gate of the MOS transistor T6; accordingly, the MOS transistor T6 is off, and can thus be regarded as practically absent. In this state, when light enters the photodiode PD, a photoelectric current is generated therein, and, due to the subthreshold characteristics of MOS transistors, a voltage having the value obtained by converting the photoelectric current natural-logarithmically appears at the gates of the MOS transistors T2 and T3. This voltage causes a current to flow through the MOS transistor T3, and, as a result, an electric charge that is equivalent to the value obtained by converting the integral of the photoelectric current natural-logarithmically is accumulated in the capacitor C1. That is, a voltage proportional to the value obtained by converting the integral of the photoelectric current natural-logarithmically appears at the node "a" between the capacitor C1 and the source of the MOS transistor T3. Here, the MOS transistor T4 remains off.

Next, the pulse signal φV is fed to the gate of the MOS transistor T4 to turn on this MOS transistor T4. This causes the electric charge accumulated in the capacitor C1 to be fed as the output current to the output signal line 6. This current thus fed to the output signal line 6 has the value obtained by converting the integral of the photoelectric current natural-logarithmically. In this way, it is possible to read a signal (output current) that is proportional to the logarithm of the amount of incident light. After this signal has been read, the MOS transistor T4 is turned off. When the output current is so controlled as to vary natural-logarithmically with respect to the amount of incident light in this way, the signal φVRS is kept at a low level all the time.

(2) How to Detect Variations in Sensitivity of the Individual Pixels

Figure 4:
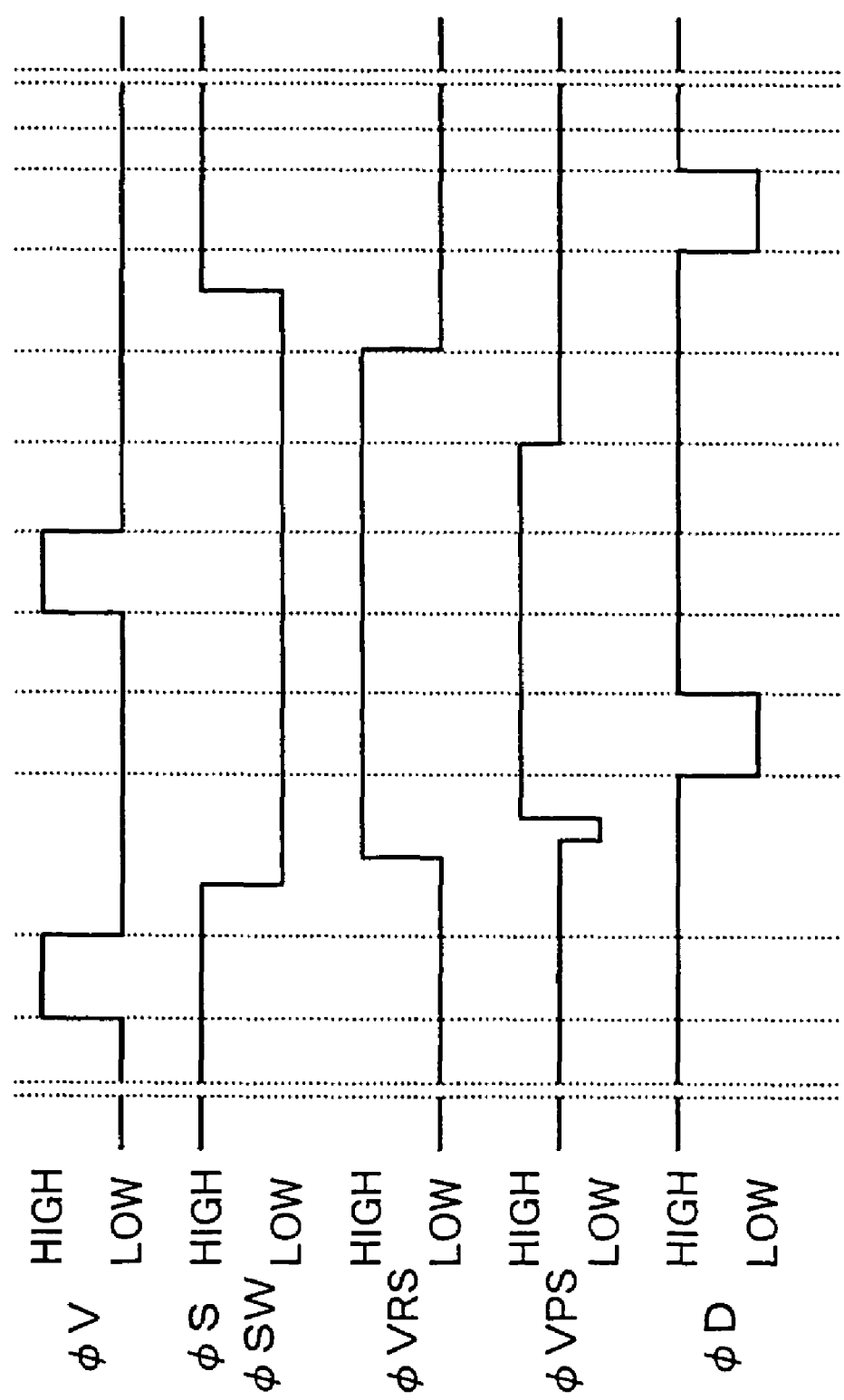
FIG. 4 is a timing chart of the signals fed to each pixel in the first embodiment.
Figure 5A:
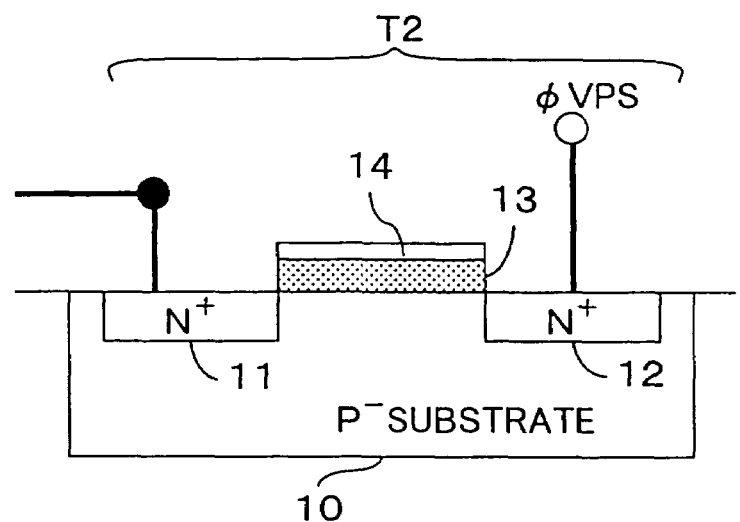
FIGS. 5A to 5C are diagrams showing the structure of and the potential relationship observed in the pixel shown in FIG. 3.
Figure 5B:
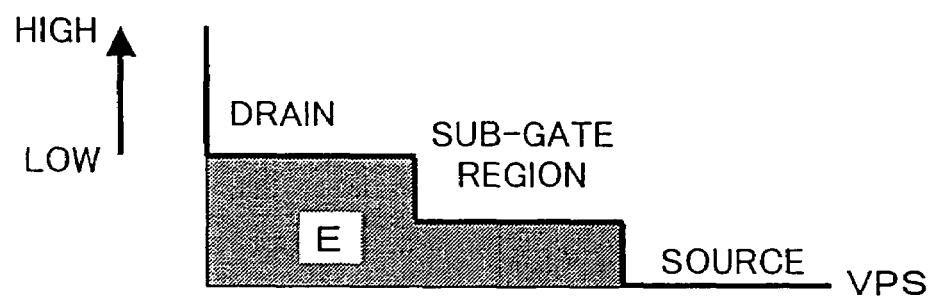
Figure 5C:
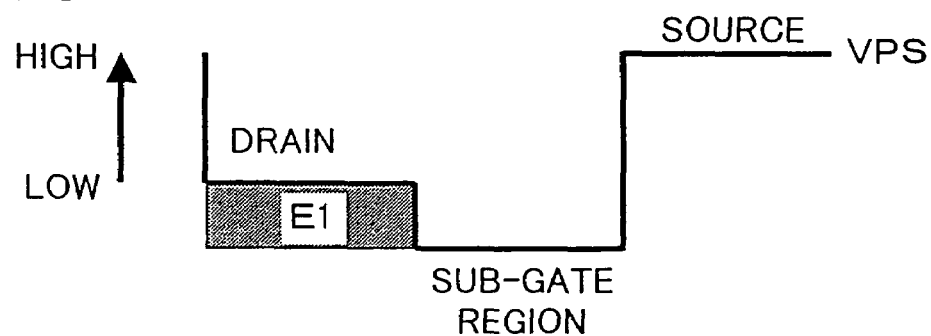

Now, how the variation in sensitivity of the pixel having the circuit configuration shown in FIG. 3 is detected will be described with reference to the drawings. FIG. 4 is a timing chart of the signals fed to the signal lines connected to the individual circuit elements constituting each pixel during resetting. FIG. 5A is a diagram showing the structure of the MOS transistor T2. FIGS. 5B and 5C are diagrams showing the potential relationship in the MOS transistor T2. In FIGS. 5B and 5C, the arrow at the left indicates the direction in which the potential increases.

Incidentally, as shown in FIG. 5A, the MOS transistor T2 is formed, for example, by forming N-type diffusion layers 11 and 12 in a P-type semiconductor substrate (hereafter referred to as the "P-type substrate") 10 and then forming, on top of the channel left between those N-type diffusion layers 11 and 12, an oxide film 13 and, further on top thereof, a polysilicon layer 14. Here, the N-type diffusion layers 11 and 12 function as the drain and the source, respectively, of the MOS transistor T2, and the oxide film 13 and the polysilicon layer 14 function as the gate insulating film and the gate electrode, respectively, thereof. Here, in the P-type substrate 10, the region between the N-type diffusion layers 11 and 12 is called the sub-gate region.

As described under (1) above, after the output signal has been output as a result of the pulse signal φV being fed to the gate of the MOS transistor T4, first, the voltage of the signal φS is turned to a low level to turn off the MOS transistor T1, and the voltage of the signal φSW is turned to a low level to turn off the MOS transistor T5. In this way, the MOS transistor T2 is disconnected from the photodiode PD, and the gate of the MOS transistor T2 is disconnected from the gate of the MOS transistor T3. Then, the voltage of the signal φVRS is turned to a high level to turn on the MOS transistor T6, and thereby the direct-current voltage VRB is applied to the gate of the MOS transistor T2. At this time, the voltage of the signal φD is at a high level (a potential equal to or close to the direct-current voltage VPD).

In this state, when the voltage of the signal φVPS is turned to a low level, the potentials in the MOS transistor T2 come to have a relationship as shown in FIG. 5B, in which the source, sub-gate region, and drain of the MOS transistor T2 have increasingly high potentials in this order. Accordingly, a negative electric charge flows into the MOS transistor T2 via the source thereof. At this time, since the path leading to the photodiode PD is cut off, the MOS transistor T2 receives no positive electric charge via its drain. As a result, the negative electric charge is accumulated between the drain and source of the MOS transistor T2.

Then, the voltage of the signal φVPS is turned to a high level, i.e. a potential equal to or close to the direct-current voltage VPD. As shown in FIG. 5C, this causes the potential at the source of the MOS transistor T2 to become higher than the potential at the sub-gate regions thereof. As a result, the negative electric charge accumulated between the drain and source of the MOS transistor T2 flows out to the signal line of the signal φVPS. However, still the potential at the drain of the MOS transistor T2 is higher than the potential at the sub-gate region thereof, and therefore part E1 of the negative electric charge accumulated at the drain of the MOS transistor T2 remains at the drain of the MOS transistor T2. This negative electric charge accumulated at the drain of the MOS transistor T2 is determined by, and thus has the value proportional to, the threshold voltage of the MOS transistor T2.

At this time, the drain voltage of the MOS transistor T2 has a value that corresponds to the negative electric charge E1 accumulated at the drain thereof, and appears at the gate of the MOS transistor T3. Thus, the voltage appearing at the gate of the MOS transistor T3 is proportional to the negative electric charge E1 accumulated at the drain of the MOS transistor T2, and is therefore proportional to the threshold voltage of the MOS transistor T2. After the MOS transistors T2 and T3 have been brought into the states described above, the signal φD is turned to a low level momentarily to reset the voltage at the capacitor C1, and thus at the node "a", and is then turned back to a high level.

Then, the gate voltage of the MOS transistor T3 causes a current to flow through the MOS transistor T3. This causes an electric charge to be accumulated in the capacitor C1 thus reset, and thereby makes the potential at the node "a" to rise. Then, the signal φV is turned to a high level to turn on the MOS transistor T4, and this causes the electric charge accumulated in the capacitor C1 to be fed as the output current to the output signal line 6. In this way, a current proportional to the threshold voltage of the MOS transistor T2 of one pixel after another is fed to the output signal line 6 and is acquired as compensation data to be used to correct the outputs from the individual pixels.

Figure 95:
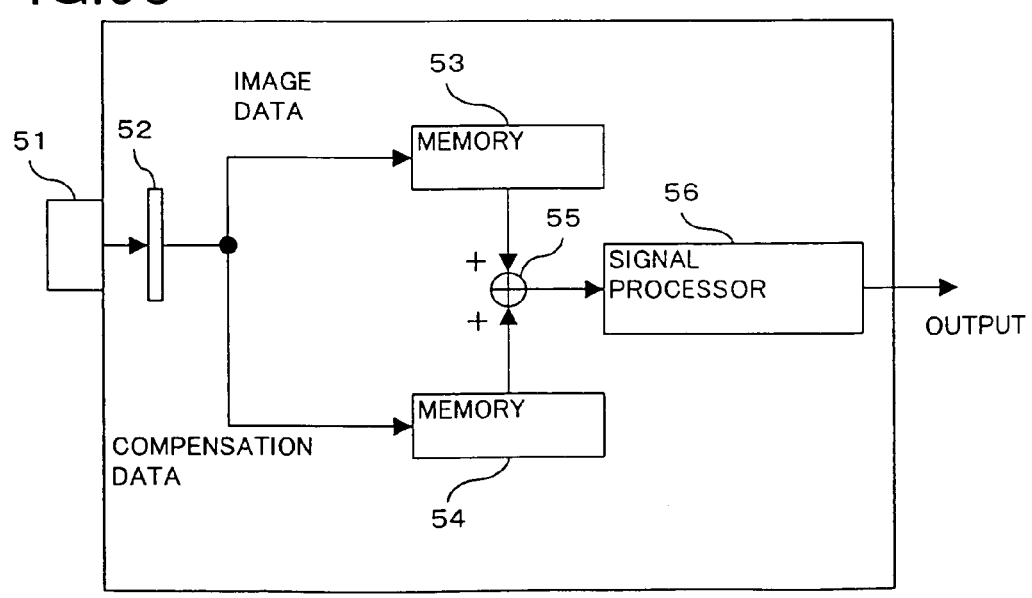
FIG. 95 is a block diagram showing the internal configuration of an image input apparatus provided with a solid-state image-sensing device having pixels configured according to one of the embodiments of the invention.

More specifically, this current proportional to the threshold voltage is output serially, from one pixel after another, by way of the signal line 9 shown in FIG. 2 to the succeeding circuit so as to be stored as pixel-by-pixel compensation data in a memory provided therein. Then, by correcting pixel by pixel the output current obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

After acquisition of compensation data as described above, the MOS transistor T4 is turned off. Thereafter, the signal φVPS is turned back to an intermediate level to reset the MOS transistor T2, and the signal φVRS is turned to a low level to turn off the MOS transistor T6. Then, the signals φS and φSW are turned to a high level to turn on the MOS transistors T1 and T5, and then the signal φD is turned to a low level so that the electric charge accumulated in the capacitor C1 is discharged therefrom through the MOS transistor T3 to the signal line of the signal φD and thereby the potential at the capacitor C1, and thus at the node "a", is initialized, making the pixel ready for the next round of image sensing.

Second Embodiment

Figure 6:
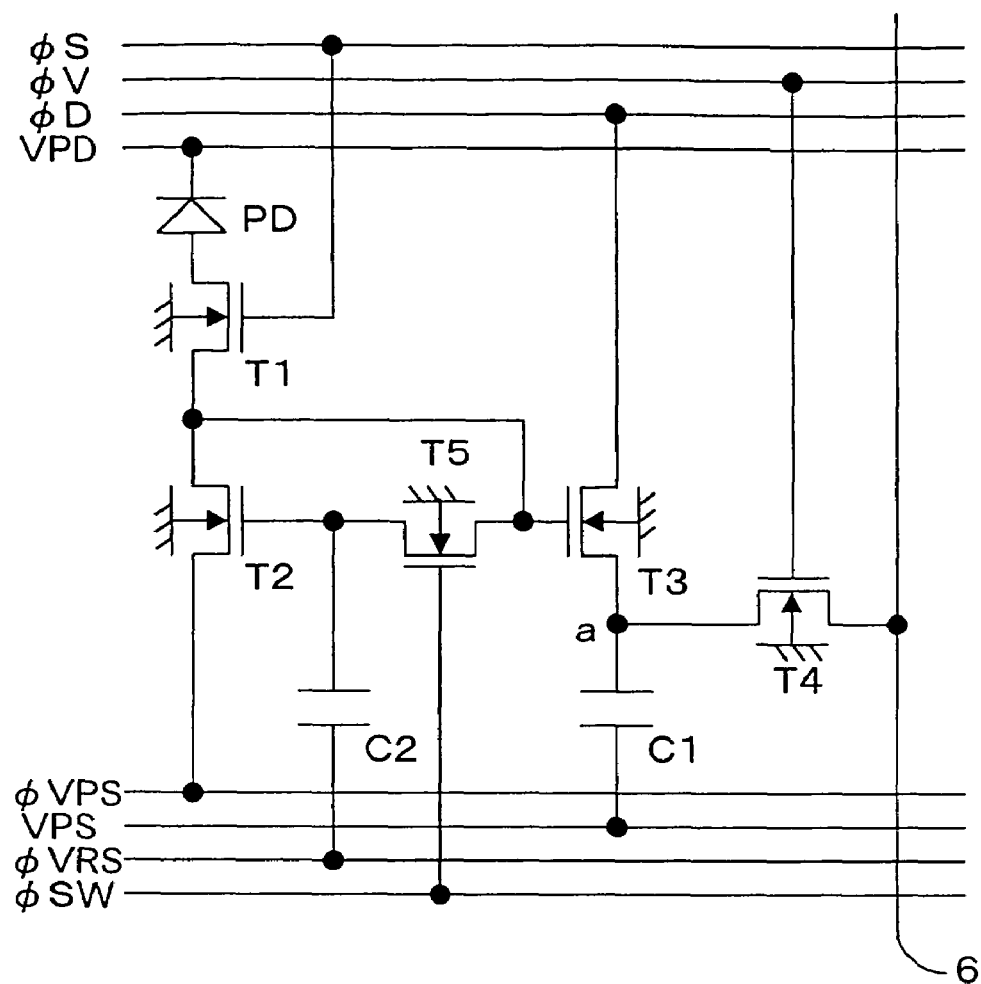
FIG. 6 is a circuit diagram showing the configuration of each pixel in a second embodiment of the invention.

Next, a second embodiment of the invention will be described with reference to the drawings. FIG. 6 is a circuit diagram showing the configuration of each pixel of the solid-state image-sensing device of this embodiment. It is to be noted that such elements, signal lines, and others as are used for the same purposes here as in the pixel shown in FIG. 3 are identified with the same reference symbols, and their detailed descriptions will be omitted.

As shown in FIG. 6, in this embodiment, the MOS transistors T1 to T5 and the capacitor C1 are configured in the same manner as in the pixel of the first embodiment (FIG. 3), and the only difference is that, instead of the MOS transistor T6 used in the first embodiment, a capacitor C2 is used in this embodiment. Specifically, the capacitor C2 has one end connected to the node between the gate of the MOS transistor T2 and the source of the MOS transistor T5, and receives at the other end the signal φVRS. The signal φVRS is a binary signal that takes one of two predetermined levels, i.e. either a low level or a high level, at a time. Here, a low level refers to a voltage equal to the ground level, and a high level refers to a voltage that permits a voltage higher than that voltage to be applied to the gate.

(1) How to Convert the Light Incident on the Individual Pixels into an Electric Signal In this pixel having the circuit configuration shown in FIG. 6, the signal φVRS fed to the capacitor C2 is turned to a low level so that the MOS transistor T2 operates in a subthreshold region. Moreover, the signals φS and φSW are turned to a high level to turn on the MOS transistors T1 and T5. Turning the signal φVRS to a low level in this way causes the capacitor C2 to function in the same manner as the capacitors formed by insulating oxide films at the gate and back-gate of the MOS transistors T2 and T3. Making the MOS transistor T2 operate in a subthreshold region in this way causes a voltage obtained by logarithmically converting the photoelectric current output from the photodiode PD to appear at the node "a". In this state, when the MOS transistor T4 is turned on, an output signal obtained through logarithmic conversion is fed to the output signal line 6.

(2) How to Detect Variations in Sensitivity of the Individual Pixels

The variation in sensitivity of the pixel is detected, as in the first embodiment, while resetting is performed as shown in the timing chart of FIG. 4. Now, how this detection is achieved will be described with reference to the timing chart of FIG. 4 and the potential transition diagrams of FIGS. 5B and 5C. When, after the feeding of the pulse signal φV, the signals φS and φSW are turned to a low level to turn off the MOS transistors T1 and T5, resetting starts. Then, the signal φVRS is turned to a high level to raise the potential at the sub-gate region of the MOS transistor T2, and moreover the voltage of the signal φVPS is turned to a low level. As a result, the potentials in the MOS transistor T2 come to have a relationship as shown in FIG. 5B. This causes a negative electric charge to flow into the MOS transistor T2 via the source thereof.

After this negative electric charge E having flown into the MOS transistor T2 has been accumulated therein as shown in FIG. 5B, the signal φVPS is turned to a high level approximately equal to the direct-current voltage VPD. This makes the potential at the source of the MOS transistor T2 higher than the potential at the sub-gate region thereof, and thus causes part of the accumulated negative electric charge E to flow out of the MOS transistor T2 via the source thereof. As a result, as shown in FIG. 5C, now the negative electric charge E1 remains accumulated at the drain and gate of the MOS transistor T2. Now that the negative electric charge E1 remains accumulated in this way, the gate voltage of the MOS transistor T3 is determined by the negative electric charge E1, which is determined by the threshold voltage of the MOS transistor T2.

With this state maintained, the signal φD is turned to a low level momentarily to reset the capacitor C1. Then, the signal φD is turned back to a high level so that the capacitor C1 is charged with a current amplified by the gate voltage of the MOS transistor T3. Then, by feeding the pulse signal φV, the voltage appearing at the node "a" as a result of the capacitor C1 being charged in this way is fed, as the output signal, through the MOS transistor T4 to the output signal line 6.

More specifically, this current proportional to the threshold voltage is output serially, from one pixel after another, by way of the signal line 9 shown in FIG. 2 to the succeeding circuit so as to be stored as pixel-by-pixel compensation data in a memory provided therein. Then, by correcting pixel by pixel the output current obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

After the signal having the value proportional to the threshold voltage of the MOS transistor T2, of which the variation leads to variations in sensitivity of the individual pixels, has been output in this way, the signal φVPS is turned to an intermediate level to reset the MOS transistor T2. Thereafter, the signal φVRS is turned to a low level. Then, the signals φS and φSW are turned to a high level to bring the MOS transistors T1 and T5 into a conducting state, and then the signal φD is turned to a low level momentarily and then back to a high level to reset the capacitor C1.

Third Embodiment

Figure 7:
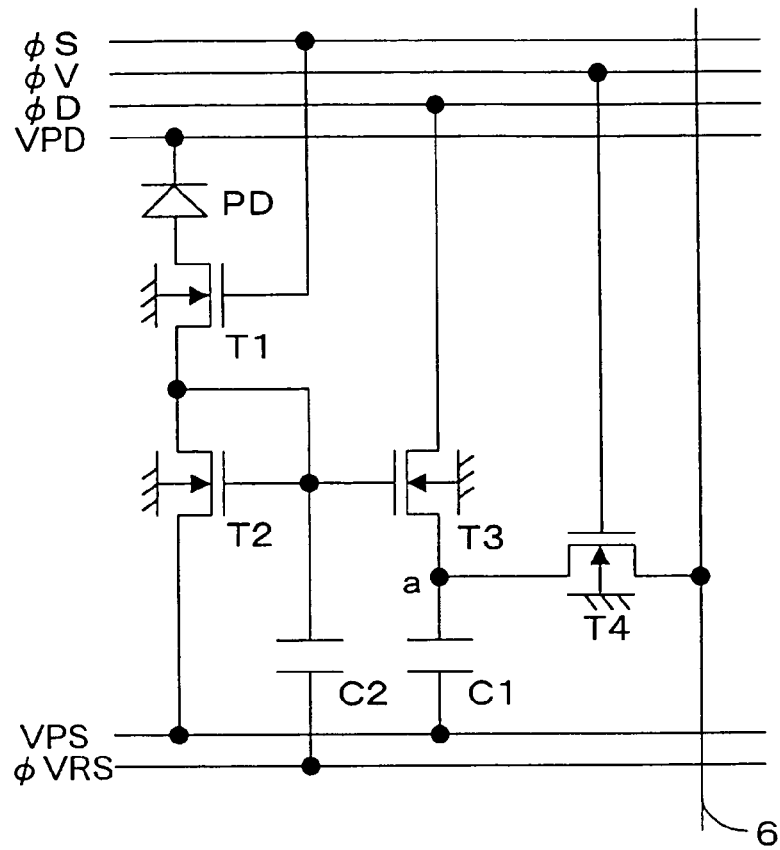
FIG. 7 is a circuit diagram showing the configuration of each pixel in a third embodiment of the invention.

Now, a third embodiment of the invention will be described with reference to the drawings. FIG. 7 is a circuit diagram showing the configuration of each pixel of the solid-state image-sensing device of this embodiment. It is to be noted that such elements, signal lines, and others as are used for the same purposes here as in the pixel shown in FIG. 6 are identified with the same reference symbols, and their detailed descriptions will be omitted.

As shown in FIG. 7, according to the circuit configuration of this embodiment, as compared with the pixel of the second embodiment (FIG. 6), the MOS transistor T5 is omitted. Specifically, the gates of the MOS transistors T2 and T3 are connected together, and the direct-current voltage VPS is applied to the source of the MOS transistor T2.

(1) How to Convert the Light Incident on the Individual Pixels into an Electric Signal In this pixel configured as described above, image sensing is achieved in the same manner as in the second embodiment (FIG. 6). Specifically, the signal φS is turned to a high level to bring the MOS transistor T1 into a conducting state. In addition, the signal φVRS is turned to a low level so that the MOS transistor T2 operates in a subthreshold region. Making the MOS transistor T2 operate in a subthreshold region in this way causes a voltage obtained by logarithmically converting the photoelectric current output from the photodiode PD to appear at the node "a". In this state, when the MOS transistor T4 is turned on, an output signal obtained through logarithmic conversion is fed to the output signal line 6.

(2) How to Reset the Individual Pixels

Figure 8:
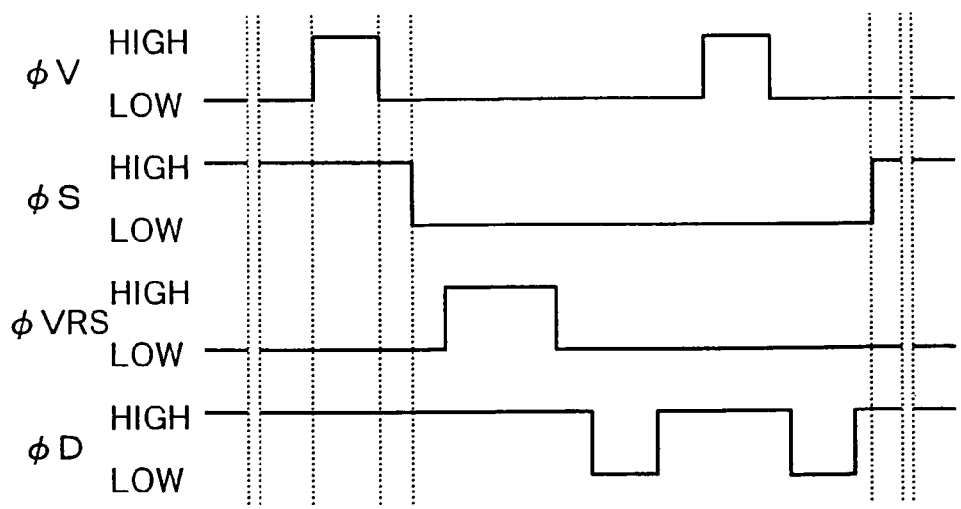
FIG. 8 is a timing chart of the signals fed to each pixel in the third embodiment.
Figure 9A:
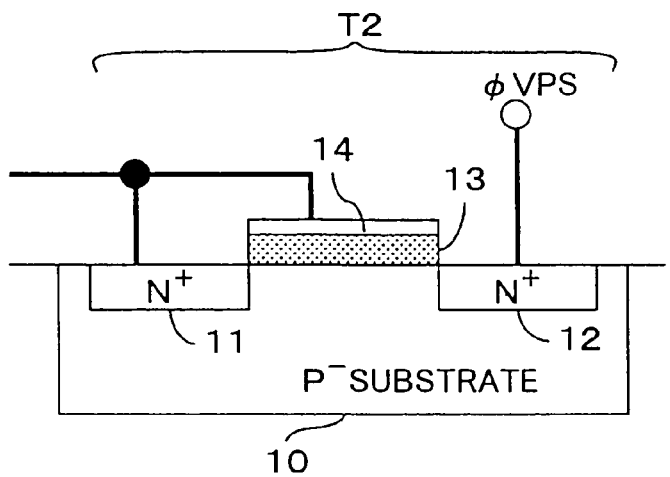
FIGS. 9A to 9E are diagrams showing the structure of and the potential relationship observed in the pixel shown in FIG. 7.

Now, how resetting is achieved in the pixel having the circuit configuration shown in FIG. 7 will be described with reference to the drawings. FIG. 8 is a timing chart of the signals fed to the signal lines connected to the individual circuit elements constituting each pixel during resetting. FIG. 9A is a sectional view, like FIG. 5A, showing the structure of the MOS transistor T1. FIGS. 9B to 9E are diagrams showing the relationship among the potentials at various parts of the sectional view shown in FIG. 9A. In FIGS. 9B to 9E, the arrow at the left indicates the direction in which the potential increases.

As described under (1) above, in the pixel having the circuit configuration shown in FIG. 7, when the pulse signal φV is fed to the gate of the MOS transistor T4, an electric signal (output signal) obtained by converting the amount of incident light logarithmically is output to the output signal line 6. After this output signal has been output, the pulse signal φV turns to a low level, and resetting starts. Now, how this resetting is achieved will be described with reference to FIGS. 8 and 9A to 9E.

Figure 9B:
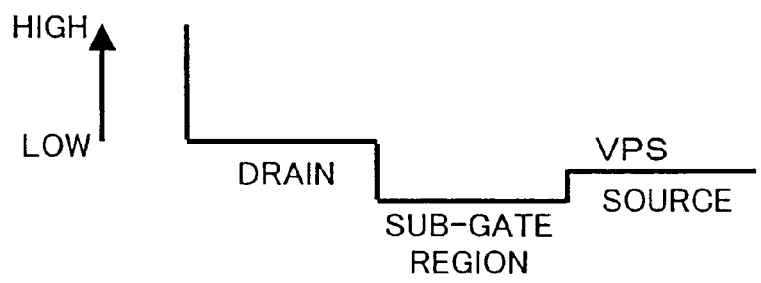

After the output signal has been output as a result of the pulse signal φV being fed to the gate of the MOS transistor T4, the signal φS is turned to a low level to turn off the MOS transistor T1. This causes a negative electric charge to flow into the MOS transistor T2 via the source thereof, and thereby permits recombination therewith of the positive electric charges accumulated at the gate and drain of the MOS transistor T2, at the gate of the MOS transistor T3, and in the capacitor C2. As a result, as shown in FIG. 9B, the potentials at the drain and sub-gate region of the MOS transistor T2 drop down to certain levels.

Figure 9C:
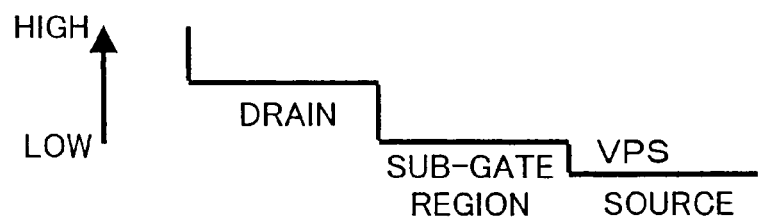

In this way, the potentials at the drain and sub-gate region of the MOS transistor T2 start being reset to their original levels, but the speed of resetting becomes slow when those potentials reach certain levels. This is particularly noticeable when a thus far brightly-lit subject has suddenly become dimly-lit. To avoid this, next, the voltage φVRS fed to the capacitor C2 is made higher so as to make the gate voltage of the MOS transistor T2 higher. By making the gate voltage of the MOS transistor T2 higher in this way, the potentials in the MOS transistor T2 change so as to have a relationship as shown in FIG. 9C; that is, the potentials at the sub-gate region and drain of the MOS transistor T2 become higher. This increases the amount of negative electric charge that flows into the MOS transistor T2 via the source thereof, and thereby permits quick recombination of the positive electric charges accumulated at the gate and drain of the MOS transistor T2, at the gate of the MOS transistor T3, and in the capacitor C2.

Figure 9D:
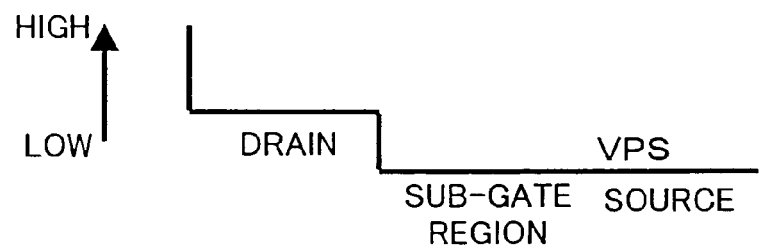
Figure 9E:
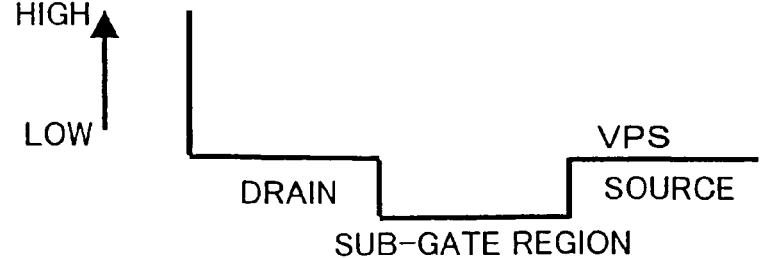

As a result, as shown in FIG. 9D, the potentials at the drain and sub-gate region of the MOS transistor T2 become lower than in the state shown in FIG. 9C. When the potentials in the MOS transistor T2 have changed so as to have a relationship as shown in FIG. 9D, the voltage φVRS fed to the capacitor C2 is turned to a low level, and the gate voltage of the MOS transistor T2 is lowered. This causes the potentials at the drain and sub-gate region of the MOS transistor T2 to have a relationship as shown in FIG. 9E, and thus causes those potentials to be reset to their original levels. After the potentials in the MOS transistor T2 have been reset to their original levels in this way, the voltage of the signal φD is turned to a low level so that the capacitor C1 is discharged and thereby the potential at the node "a" is reset to its original level. Thereafter, the voltage of the signal φD is turned back to a high level.

Thereafter, the pulse signal φV is fed to the MOS transistor T4 so that the output current obtained on resetting is fed to the output signal line 6 and is acquired as compensation data to be used to correct the outputs from the individual pixels. Then, the voltage of the signal φD is once again turned to a low level momentarily to reset the capacitor C1 to its original state, and is then turned back to a high level. Subsequently, the signal φS is turned to a high level to bring the MOS transistor T1 into a conducting state and thereby make the pixel ready for image sensing. As in the first embodiment, this output signal obtained on resetting is output serially, from one pixel after another, by way of the signal line 9 shown in FIG. 2 to the succeeding circuit so as to be stored as pixel-by-pixel compensation data in a memory provided therein. Then, by correcting pixel by pixel the output current obtained during actual image sensing with the compensation data thus stored, it is possible to eliminate components resulting from variations in sensitivity of the individual pixels from the output signal. A practical example of how this compensation is achieved is shown in FIG. 9S and will be described later. This compensation may be realized by providing memories, such as line memories, within the pixels.

As described above, in this embodiment, by turning the signal φVRS fed to the capacitor C2 connected to the gate of the MOS transistor T2 to a high level, it is possible to initialize the gate voltage of the MOS transistor T2 quickly. This helps improve the response of the solid-state image-sensing device, and thereby makes it possible to perform satisfactory image shooting free from after-images even when a dimly-lit subject is shot or when a thus far brightly-lit subject has suddenly become dimly-lit. Moreover, feeding the signal φVRS commonly to the individual pixels makes it possible to initialize the gate voltage of the MOS transistor T2 of each pixel substantially to an identical level, and thereby permits variations in sensitivity of the individual pixels to be canceled in their initial state.

Fourth Embodiment

Figure 10:
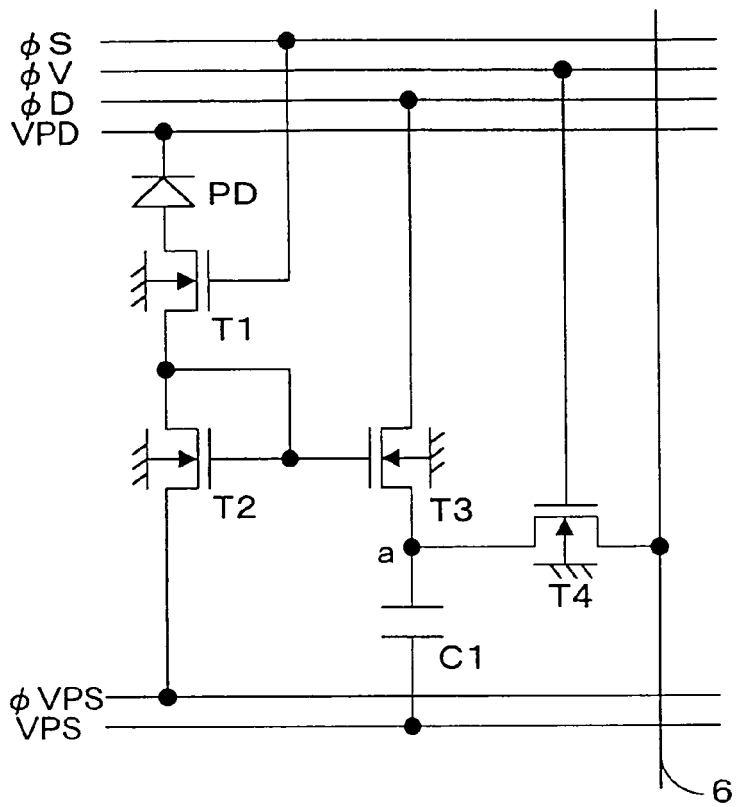
FIG. 10 is a circuit diagram showing the configuration of each pixel in a fourth embodiment of the invention.

Next, a fourth embodiment of the invention will be described with reference to the drawings. FIG. 10 is a circuit diagram showing the configuration of each pixel of the solid-state image-sensing device of this embodiment. It is to be noted that such elements, signal lines, and others as are used for the same purposes here as in the pixel shown in FIG. 7 are identified with the same reference symbols, and their detailed descriptions will be omitted.

As shown in FIG. 10, according to the circuit configuration of this embodiment, as compared with the pixel of the third embodiment (FIG. 7), the capacitor C2 is omitted. Moreover, the signal φVPS is fed to the source of the MOS transistor T2. The signal φVPS is a binary signal that takes one of two predetermined levels, i.e. either a low level or a high level, at a time. Here, a high level refers to a voltage that is approximately equal to the direct-current voltage VPS and that causes the MOS transistor T2 to operate in a subthreshold region, and a low level refers to a voltage that is lower than that voltage and that causes a higher current to flow through the MOS transistor T2 than when a high-level voltage is fed thereto.

(1) How to Convert the Light Incident on the Individual Pixels into an Electric Signal In this pixel configured as described above, image sensing is achieved in the same manner as in the third embodiment (FIG. 7). Specifically, the signal φS is turned to a high level to bring the MOS transistor T1 into a conducting state. In addition, the signal φVPS is turned to a high level so that the MOS transistor T2 operates in a subthreshold region. Making the MOS transistor T2 operate in a subthreshold region in this way causes a voltage obtained by logarithmically converting the photoelectric current output from the photodiode PD to appear at the node "a". In this state, when the MOS transistor T4 is turned on, an output signal obtained through logarithmic conversion is fed to the output signal line 6.

(2) How to Reset the Individual Pixels

Figure 11:
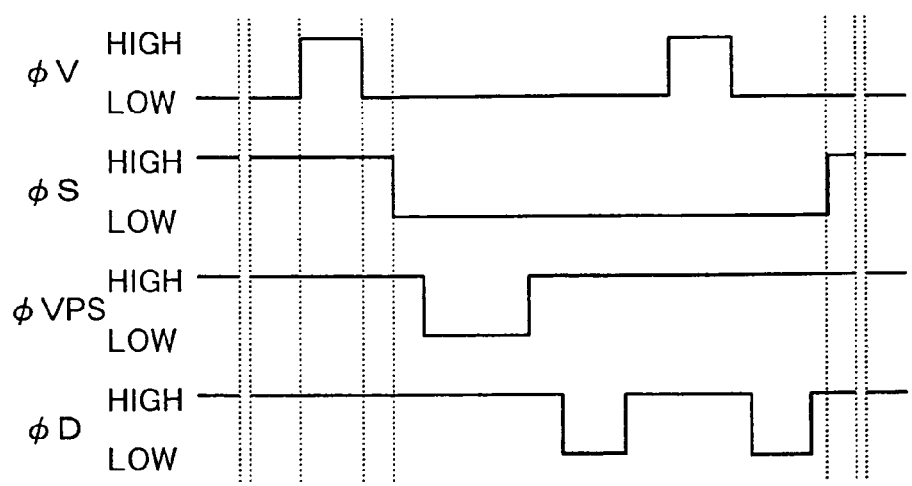
FIG. 11 is a timing chart of the signals fed to each pixel in the fourth embodiment.
Figure 12A:
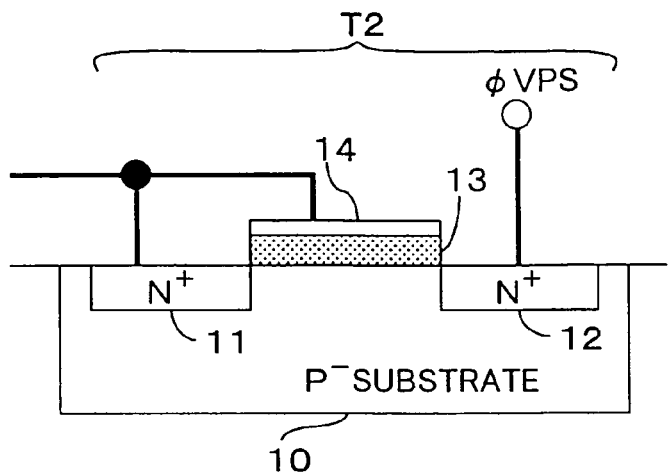
FIGS. 12A to 12E are diagrams showing the structure of and the potential relationship observed in the pixel shown in FIG. 10.

Now, how resetting is achieved in the pixel having the circuit configuration shown in FIG. 10 will be described with reference to the drawings. FIG. 11 is a timing chart of the signals fed to the signal lines connected to the individual circuit elements constituting each pixel during resetting. FIG. 12A is a sectional view, like FIG. 5A, showing the structure of the MOS transistor T1. FIGS. 12B to 12E are diagrams showing the relationship among the potentials at various parts of the sectional view shown in FIG. 12A. In FIGS. 12B to 12E, the arrow at the left indicates the direction in which the potential increases.

As described under (1) above, in the pixel having the circuit configuration shown in FIG. 10, when the pulse signal $\phi V$ is fed to the gate of the MOS transistor T4, an electric signal (output signal) obtained by converting the amount of incident light logarithmically is output to the output signal line 6. After this output signal has been output, the pulse signal $\phi V$ turns to a low level, and resetting starts. Now, how this resetting is achieved will be described with reference to FIGS. 11 and 12A to 12E.

Figure 12B:
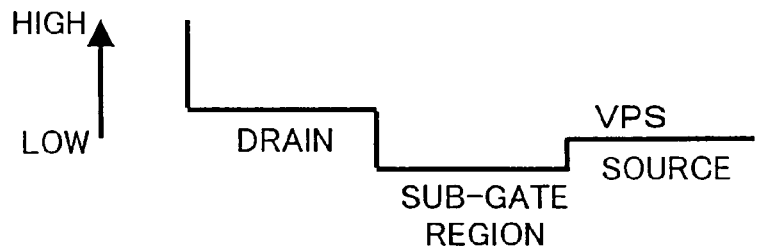

After the output signal has been output as a result of the pulse signal $\phi V$ being fed to the gate of the MOS transistor T4, the signal $\phi S$ is turned to a low level to turn off the MOS transistor T1. This causes a negative electric charge to flow into the MOS transistor T2 via the source thereof, and thereby permits recombination therewith of the positive electric charges accumulated at the gate and drain of the MOS transistor T2, and at the gate of the MOS transistor T3. As a result, as shown in FIG. 12B, the potentials at the drain and sub-gate region of the MOS transistor T2 drop down to certain levels.

Figure 12C:
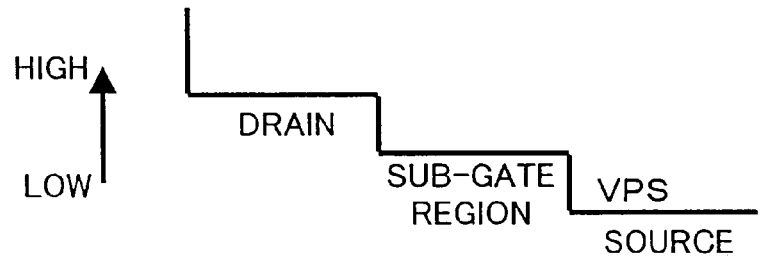

In this way, the potentials at the drain and sub-gate region of the MOS transistor T2 start being reset to their original levels, but the speed of resetting becomes slow when those potentials reach certain levels. This is particularly noticeable when a thus far brightly-lit subject has suddenly become dimly-lit. To avoid this, next, the voltage $\phi VPS$ fed to the source of the MOS transistor T2 is turned to a low level. By making the source voltage of the MOS transistor T2 lower in this way, the potentials in the MOS transistor T2 change so as to have a relationship as shown in FIG. 12C. This increases the amount of negative electric charge that flows into the MOS transistor T2 via the source thereof, and thereby permits quick recombination of the positive electric charges accumulated at the gate and drain of the MOS transistor T2, and at the gate of the MOS transistor T3.

Figure 12D:
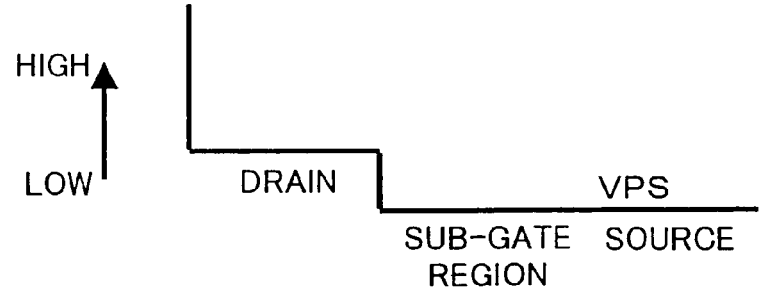
Figure 12E:
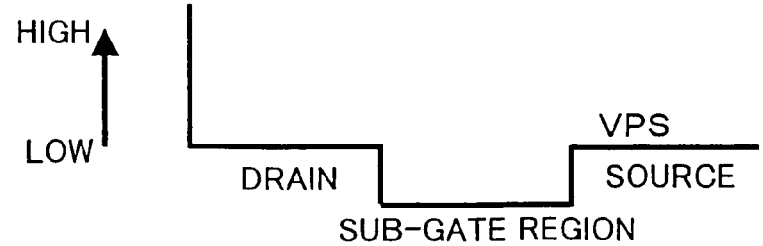

As a result, as shown in FIG. 12D, the potentials at the drain and sub-gate region of the MOS transistor T2 become lower than in the state shown in FIG. 12C. When the potentials in the MOS transistor T2 have changed so as to have a relationship as shown in FIG. 12D, the voltage $\phi VPS$ fed to the source of the MOS transistor T2 is turned to a high level. This causes the potentials in the MOS transistor T2 to have a relationship as shown in FIG. 12E, and thus causes those potentials to be reset to their original levels. After the potentials in the MOS transistor T2 have been reset to their original levels in this way, the voltage of the signal $\phi D$ is turned to a low level so that the capacitor C1 is discharged and thereby the potential at the node "a" is reset to its original level. Thereafter, the voltage of the signal $\phi D$ is turned back to a high level.

Thereafter, the pulse signal $\phi V$ is fed to the MOS transistor T4 so that the output current obtained on resetting is fed to the output signal line 6 and is acquired as compensation data to be used to correct the outputs from the individual pixels. Then, the voltage of the signal $\phi D$ is once again turned to a low level to reset the capacitor C1 to its original state, and is then turned back to a high level. Subsequently, the signal $\phi S$ is turned to a high level to bring the MOS transistor T1 into a conducting state and thereby make the pixel ready for image sensing. As in the first embodiment, this output signal obtained on resetting is output serially, from one pixel after another, by way of the signal line 9 shown in FIG. 2 to the succeeding circuit so as to be stored as pixel-by-pixel compensation data in a memory provided therein. Then, by correcting pixel by pixel the output current obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

As described above, in this embodiment, by turning the signal $\phi VPS$ fed to the source of the MOS transistor T2 to a low level, it is possible to initialize the gate voltage of the MOS transistor T2 quickly. This helps improve the response of the solid-state image-sensing device, and thereby makes it possible to perform satisfactory image shooting free from after-images even when a dimly-lit subject is shot or when a thus far brightly-lit subject has suddenly become dimly-lit. Moreover, feeding the signal $\phi VPS$ commonly to the individual pixels makes it possible to initialize the gate voltage of the MOS transistor T2 of each pixel substantially to an identical level, and thereby permits variations in sensitivity of the individual pixels to be canceled in their initial state.

Second Example of the Pixel Configuration

Figure 13:
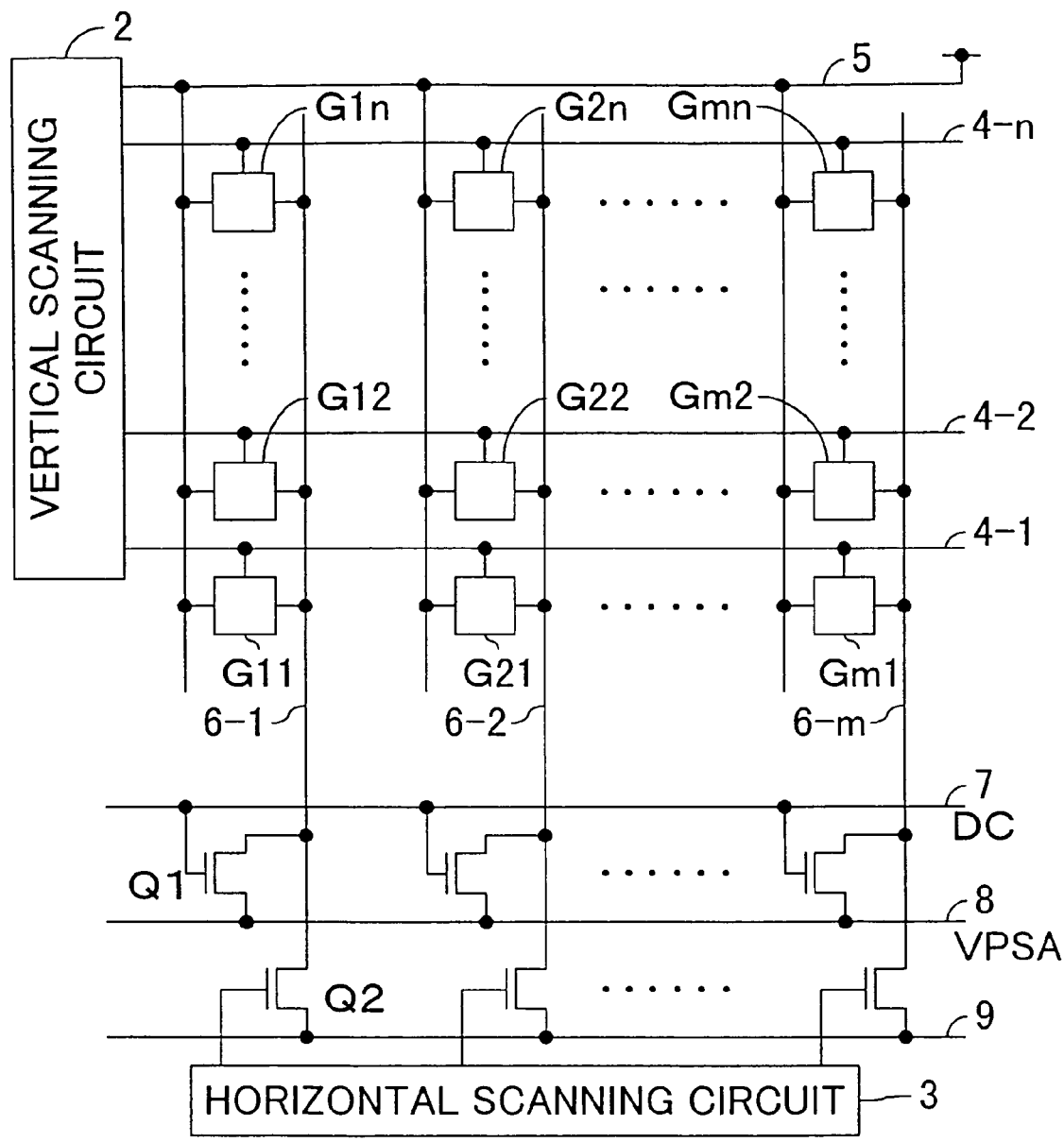
FIG. 13 is a block circuit diagram illustrating the overall configuration of another two-dimensional solid-state image-sensing device embodying the invention.

FIG. 13 schematically shows the configuration of part of another two-dimensional MOS-type solid-state image-sensing device employed in an image-sensing apparatus embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. The individual pixels are connected not only to the lines 4-1, 4-2, . . . , 4-n, to the output signal lines 6-1, 6-2, . . . , 6-m, and to the power line 5 mentioned above, but also to other lines (for example clock lines and bias supply lines). These other lines, however, are omitted in FIG. 13.

As shown in FIG. 13, for each of the output signal lines 6-1, 6-2, . . . , 6-m, a pair of N-channel MOS transistors Q1 and Q2 is provided. Here, a description will be given only with respect to the output signal line 6-1 as their representative. The MOS transistor Q1 has its gate connected to a direct-current voltage line 7, has its drain connected to the output signal line 6-1, and has its source connected to a direct-current voltage VPSA line 8. On the other hand, the MOS transistor Q2 has its drain connected to the output signal line 6-1, has its source connected to a signal line 9 serving as a final destination line, and has its gate connected to the horizontal scanning circuit 3.

Figure 14A:
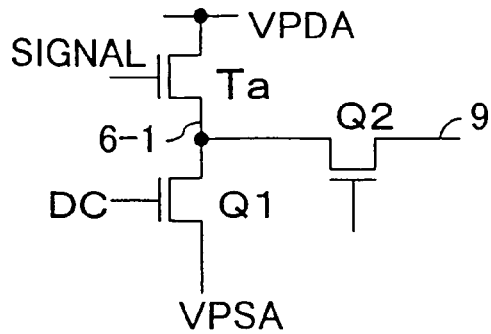
FIGS. 14A and 14B are circuit diagrams of a portion of the circuit shown in FIG. 13.

As will be described later, the pixels G11 to Gmn are each provided with an N-channel MOS transistor Ta that outputs a signal in accordance with the photoelectric charge generated in each pixel. How this MOS transistor Ta is connected to the above-mentioned MOS transistor Q1 is shown in FIG. 14A. This MOS transistor Ta corresponds to a seventh MOS transistor T7 in the fifth, sixth, eleventh, and twelfth embodiments, and corresponds to a third MOS transistor T3 in the seventh to tenth and thirteenth embodiments. Here, the direct-current voltage VPSA connected to the source of the MOS transistor Q1 and the direct-current voltage VPDA connected to the drain of the MOS transistor Ta fulfill the relation VPDA>VPSA, where the direct-current voltage VPSA is equal to, for example, the ground-level voltage. In this circuit configuration, the signal from a pixel is fed to the gate of the upper-stage MOS transistor Ta, and a direct-current voltage DC is kept applied to the gate of the lower-stage MOS transistor Q1. Thus, the lower-stage MOS transistor Q1 is equivalent to a resistor or constant-current source, and therefore the circuit shown in FIG. 14A forms an amplifier circuit of a source-follower type. Here, it can safely be assumed that, as a result of amplification, the MOS transistor Ta outputs a current.

Figure 14B:
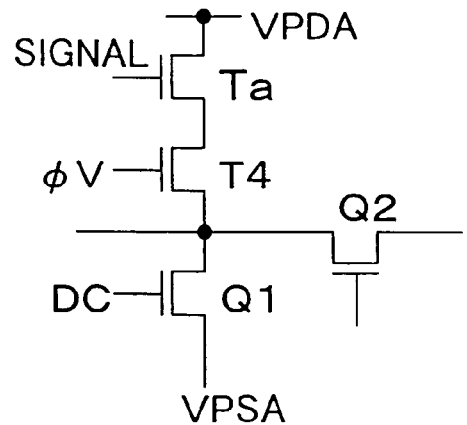

The MOS transistor Q2 is controlled by the horizontal scanning circuit 3 so as to function as a switching device. As will be described later, in all of the embodiments of the invention shown in FIG. 15 and the following figures, within each pixel, another, i.e. a fourth, N-channel MOS transistor T4 functioning as a switch is provided. If this MOS transistor T4 is illustrated explicitly, the circuit shown in FIG. 14A has, more precisely, a circuit configuration as shown in FIG. 14B. Specifically, the MOS transistor T4 is inserted between the MOS transistor Q1 and the MOS transistor Ta. Here, the MOS transistor T4 serves to select a row, and the MOS transistor Q2 serves to select a column. It is to be noted that the circuit configurations shown in FIGS. 13, 14A, and 14B are common to the fifth to thirteenth embodiments of the invention described hereafter.

The circuit configuration shown in FIGS. 14A and 14B permits the signal to be output with a high gain. Accordingly, even in a case where the photoelectric current generated in a photosensitive element is converted natural-logarithmically to obtain a wider dynamic range and thus the output signal obtained is comparatively low, this amplifier circuit amplifies the signal so as to make it sufficiently high and thus easier to process in the succeeding signal processing circuit (not shown). Here, the MOS transistor Q1 that serves as the load resistor of the amplifier circuit is provided within each pixel; however, such transistors may be provided, instead, one for each of the output signal lines 6-1, 6-2, ..., 6-m, i.e. one for each of the groups of pixels that individually constitute columns, with the pixels constituting each column collectively connected to one of the output signal lines 6-1, 6-2, ..., 6-m. This helps reduce the number of load resistors or constant-current sources required, and thus reduce the area occupied by the amplifying circuits on a semiconductor chip.

Fifth Embodiment

Figure 15:
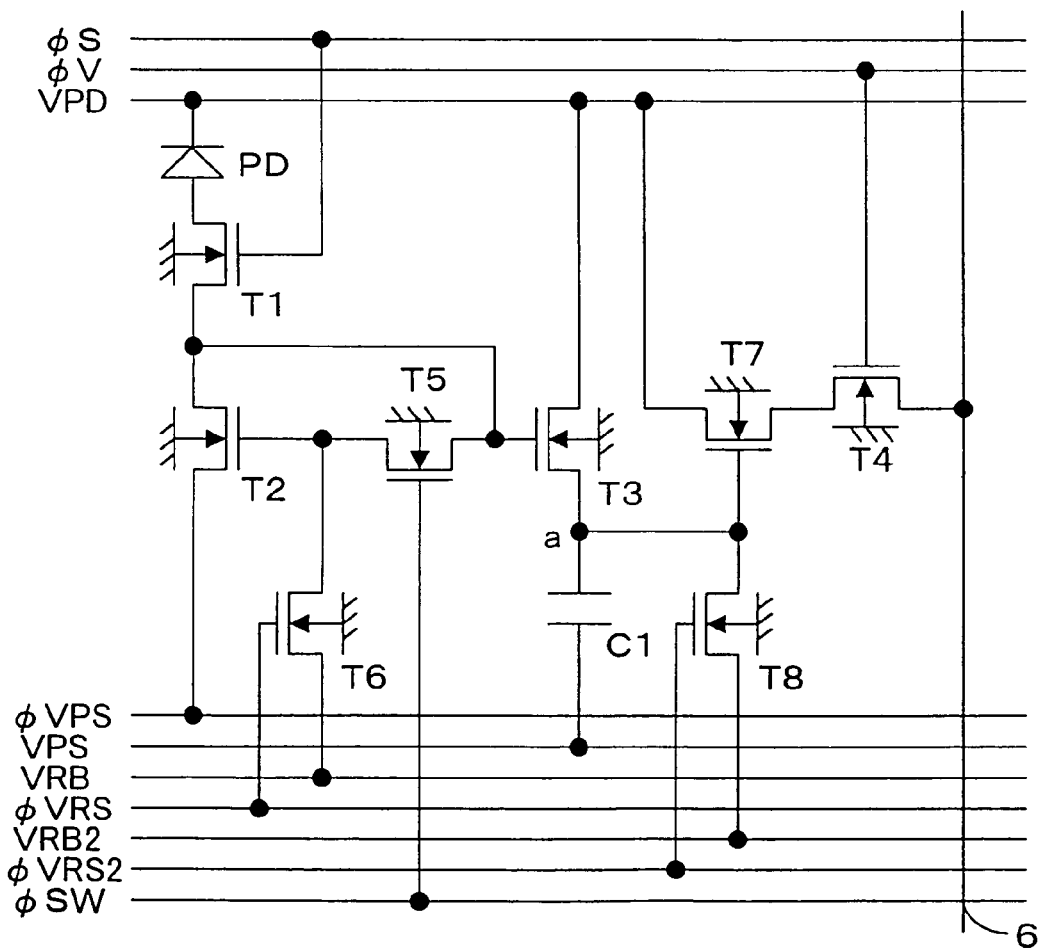
FIG. 15 is a circuit diagram showing the configuration of each pixel in a fifth embodiment of the invention.

Next, a fifth embodiment of the invention, which is applicable to each pixel of the second example of the pixel configuration shown in FIG. 13, will be described with reference to the drawings. FIG. 15 is a circuit diagram showing the configuration of each pixel of the solid-state image-sensing device of this embodiment. It is to be noted that such elements, signal lines, and others as are used for the same purposes here as in the pixel shown in FIG. 3 are identified with the same reference symbols, and their detailed descriptions will be omitted.

As shown in FIG. 15, in this embodiment, as compared with the pixel shown in FIG. 3, there are provided additionally a seventh MOS transistor T7 having its gate connected to the node "a" for performing current amplification in accordance with the voltage at the node "a", a fourth MOS transistor T4 having its drain connected to the source of the MOS transistor T7 for row selection, and an eighth MOS transistor T8 having its drain connected to the node "a" for initializing the potential at the capacitor C1, and thus at the node "a". The source of the MOS transistor T4 is connected to the output signal line 6 (this output signal line 6 corresponds to the output signal lines 6-1, 6-2, ... 6-m shown in FIG. 6). Just like the MOS transistors T1 to T6, the MOS transistors T7 and T8 are all N-channel MOS transistors, and have their back gates grounded.

A direct-current voltage VPD is applied to the drain of the MOS transistor T7, and a signal $\phi V$ is fed to the gate of the MOS transistor T4. A direct-current voltage VRB2 is applied to the source of the MOS transistor T8, and a signal $\phi VRS2$ is fed to the gate of the same MOS transistor T8. The direct-current voltage VPD is applied also to the drain of the MOS transistor T3. In this embodiment, the MOS transistors T1 to T6 and the capacitor C1 operate in the same manner as in the first embodiment (FIG. 3) so as to detect variations in sensitivity of the individual pixels and perform image sensing. Now, how these are achieved will be described.

(1) How to Convert the Light Incident on the Individual Pixels into an Electric Signal First, a description will be given of the operation performed when the signals $\phi S$ and $\phi SW$ are turned to a high level to bring the MOS transistors T1 and T5 into a conducting state and the signal $\phi VPS$ is turned to an intermediate level so that the MOS transistors T2 and T3 are so biased as to operate in a subthreshold region. At this time, as in the first embodiment, a low level is fed as the signal $\phi VRS$ to the gate of the MOS transistor T6; accordingly, the MOS transistor T6 is off, and can thus be regarded as practically absent.

In this state, when light enters the photodiode PD, a photoelectric current is generated therein, and, due to the subthreshold characteristics of MOS transistors, a voltage having the value obtained by converting the photoelectric current natural-logarithmically appears at the gates of the MOS transistors T2 and T3. This voltage causes a current to flow through the MOS transistor T3, and, as a result, an electric charge that is equivalent to the value obtained by converting the integral of the photoelectric current natural-logarithmically is accumulated in the capacitor C1. That is, a voltage proportional to the value obtained by converting the integral of the photoelectric current natural-logarithmically appears at the node "a" between the capacitor C1 and the source of the MOS transistor T3. Here, the MOS transistors T4 and T8 remain off.

Next, the pulse signal $\phi V$ is fed to the gate of the MOS transistor T4 to turn on this MOS transistor T4. This causes a current proportional to the voltage applied to the gate of the MOS transistor T7 to be fed through the MOS transistors T4 and T7 to the output signal line 6. Here, since the voltage applied to the gate of the MOS transistor T4 is equal to the voltage at the node "a", the current fed to the output signal line 6 has the value obtained by converting the integral of the photoelectric current natural-logarithmically. In this way, it is possible to read a signal (output current) that is proportional to the logarithm of the amount of incident light.

(2) How to Detect Variations in Sensitivity of the Individual Pixels

Figure 16:
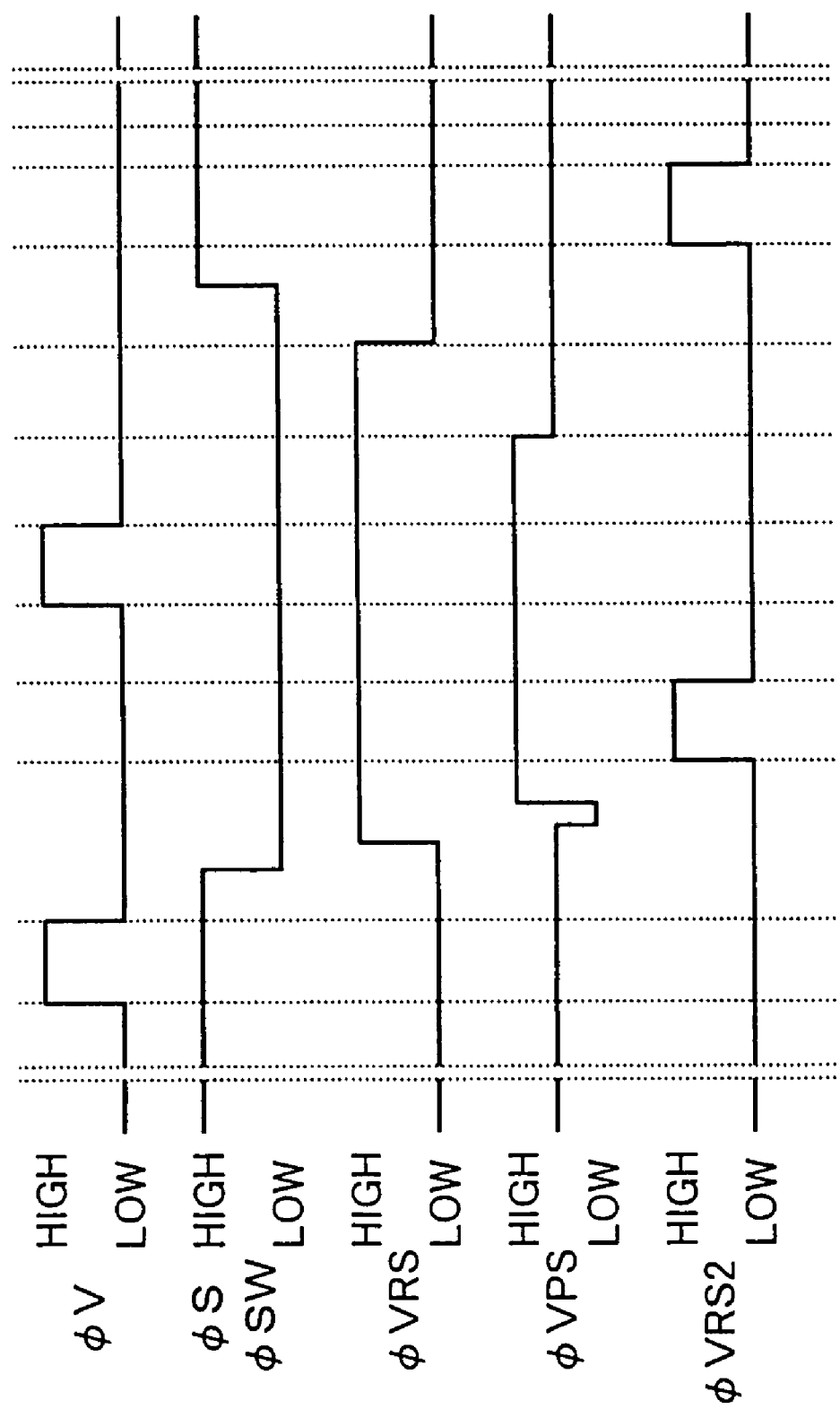
FIG. 16 is a timing chart of the signals fed to each pixel in the fifth embodiment.

Now, how the variation in sensitivity of the pixel having the circuit configuration shown in FIG. 15 is detected will be described with reference to the drawings. FIG. 16 is a timing chart of the signals fed to the signal lines connected to the individual circuit elements constituting each pixel during resetting.

As described under (1) above, after the output signal has been output as a result of the pulse signal φV being fed to the gate of the MOS transistor T4, first, the voltage of the signal φS is turned to a low level to turn off the MOS transistor T1, and the voltage of the signal φSW is turned to a low level to turn off the MOS transistor T5. In this way, the MOS transistor T2 is disconnected from the photodiode PD, and the gate of the MOS transistor T2 is disconnected from the gate of the MOS transistor T3. Then, the voltage of the signal φVRS is turned to a high level to turn on the MOS transistor T6, and thereby the direct-current voltage VRB is applied to the gate of the MOS transistor T2. In this state, when the voltage of the signal φVPS is turned to a low level, a negative electric charge flows into the MOS transistor T2 via the source thereof, and is accumulated between the drain and source of the MOS transistor T2.

Next, the voltage of the signal φVPS is turned to a high level, i.e. a potential equal to or close to the direct-current voltage VPD. This causes part of the negative electric charge accumulated between the drain and source of the MOS transistor T2 to flow out to the signal line of the signal φVPS. However, still the potential at the drain of the MOS transistor T2 is higher than the potential at the sub-gate region thereof, and therefore part of the negative electric charge accumulated at the drain of the MOS transistor T2 remains at the drain of the MOS transistor T2. This negative electric charge accumulated at the drain of the MOS transistor T2 is determined by, and thus has the value proportional to, the threshold voltage of the MOS transistor T2.

At this time, the drain voltage of the MOS transistor T2 has a value that corresponds to the negative electric charge accumulated at the drain thereof, and appears at the gate of the MOS transistor T3. Thus, the voltage appearing at the gate of the MOS transistor T3 is proportional to the negative electric charge accumulated at the drain of the MOS transistor T2, and is therefore proportional to the threshold voltage of the MOS transistor T2. After the MOS transistors T2 and T3 have been brought into the states described above, the signal φVRS2 is turned to a high level momentarily to reset the voltage at the capacitor C1, and thus at the node "a", and is then turned back to a low level.

Then, the gate voltage of the MOS transistor T3 causes a current to flow through the MOS transistor T3. This causes an electric charge to be accumulated in the capacitor C1 thus reset, and thereby makes the potential at the node "a" to rise. Then, the signal φV is turned to a high level to turn on the MOS transistor T4, and this causes the voltage at the node "a" to be subjected to current amplification by the MOS transistor T7 and fed to the output signal line 6. In this way, a current proportional to the threshold voltage of the MOS transistor T2 of one pixel after another is fed to the output signal line 6 and is acquired as compensation data to be used to correct the outputs from the individual pixels.

After acquisition of compensation data as described above, the MOS transistor T4 is turned off. Thereafter, the signal φVPS is turned to an intermediate level to reset the MOS transistor T2, and the signal φVRS is turned back to a low level to turn off the MOS transistor T6. Then, the signals φS and φSW are turned to a high level to turn on the MOS transistors T1 and T5, and then the signal φVRS2 is turned to a high level so that the electric charge accumulated in the capacitor C1 is discharged therefrom through the MOS transistor T8 and thereby the potential at the capacitor C1, and thus at the node "a", is initialized, making the pixel ready for the next round of image sensing.

Sixth Embodiment

Figure 17:
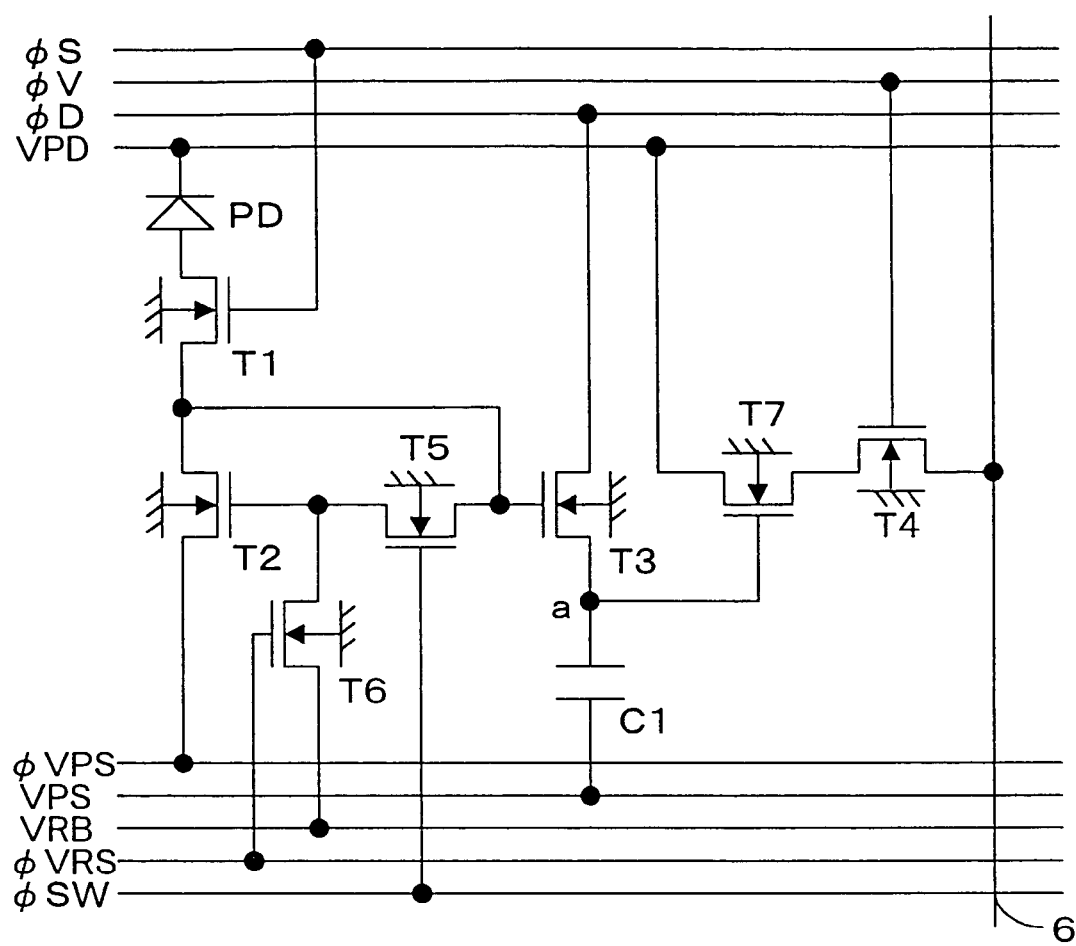
FIG. 17 is a circuit diagram showing the configuration of each pixel in a sixth embodiment of the invention.

Next, a sixth embodiment of the invention will be described with reference to the drawings. FIG. 17 is a circuit diagram showing the configuration of each pixel of the solid-state image-sensing device of this embodiment. It is to be noted that such elements, signal lines, and others as are used for the same purposes here as in the pixel shown in FIG. 15 are identified with the same reference symbols, and their detailed descriptions will be omitted.

As shown in FIG. 17, in this embodiment, the initialization of the potential at the capacitor C1, and thus at the node "a", is achieved by feeding the signal φD to the drain of the MOS transistor T3, and thus the MOS transistor T8 is omitted. In other respects, each pixel of this embodiment is configured in the same manner as in the fifth embodiment (FIG. 15). Here, while the signal φD is kept at a high level, the capacitor C1 performs integration as in the first embodiment (FIG. 3); while the signal φD is kept at a low level, the electric charge accumulated in the capacitor C1 is discharged through the MOS transistor T3 to make the voltage at the capacitor C1, and thus at the gate of the MOS transistor T7, approximately equal to the low-level voltage of the signal φD (that is, the voltage is reset). In this embodiment, the omission of the MOS transistor T8 helps simplify the circuit configuration.

In this embodiment, image sensing is achieved in the following manner. As in the fifth embodiment, the MOS transistors T1 and T5 are turned on. In addition, the signal φVRS is turned to a low level to turn off the transistor T6 so that the MOS transistor T2 operates in a subthreshold region. Moreover, the signal φD is turned to a high level so that an electric charge equivalent to the value obtained by converting the integral of the photoelectric current natural-logarithmically is accumulated in the capacitor C1. Then, with predetermined timing, the MOS transistor T4 is turned on. This causes a current proportional to the voltage applied to the gate of the MOS transistor T7 to be fed through the MOS transistors T4 and T7 to the output signal line 6.

On the other hand, resetting of the pixel is achieved in the following manner. As in the first embodiment, the signals are controlled with the timing shown in FIG. 4. Specifically, as in the first embodiment, after the feeding of the pulse signal φV, first, the signals φS and φSW are turned to a low level to turn off the MOS transistors T1 and T5, and resetting starts. Then, the signal φVRS is turned to a high level to apply the direct-current voltage VRB to the gate of the MOS transistor T2. Then, the signal φVPS is turned to a low level momentarily and is then turned to a high level so that a negative electric charge is accumulated at the drain of the MOS transistor T2. The amount of negative electric charge here is determined by the threshold voltage of the MOS transistor T2.

In this state, after the signal φD is turned to a low level momentarily to reset the capacitor C1 and the node "a", a current proportional to the threshold voltage of the MOS transistor T2 flows through the MOS transistor T3 into the capacitor C1, and thus the voltage appearing at the node "a" is proportional to that threshold voltage. When the pulse signal φV is fed to the gate of the MOS transistor T4, the voltage appearing at the node "a" is subjected to current amplification by the MOS transistor T7 and is fed out as the output signal. In this way, a current proportional to the threshold voltage of the MOS transistor T2 of one pixel after another is fed to the output signal line 6 and is acquired as compensation data to be used to correct the outputs from the individual pixels.

After acquisition of compensation data as described above, the MOS transistor T4 is turned off. Thereafter, the signal φVPS is turned to an intermediate level to reset the MOS transistor T2, and the signal φVRS is turned to a low level to turn off the MOS transistor T6. Then, the signals φS and φSW are turned to a high level to turn on the MOS transistors T1 and T5, and then the signal φD is turned to a low level so that the electric charge accumulated in the capacitor C1 is discharged therefrom through the MOS transistor T3 and thereby the potential at the capacitor C1, and thus at the node "a".

Seventh Embodiment

Figure 18:
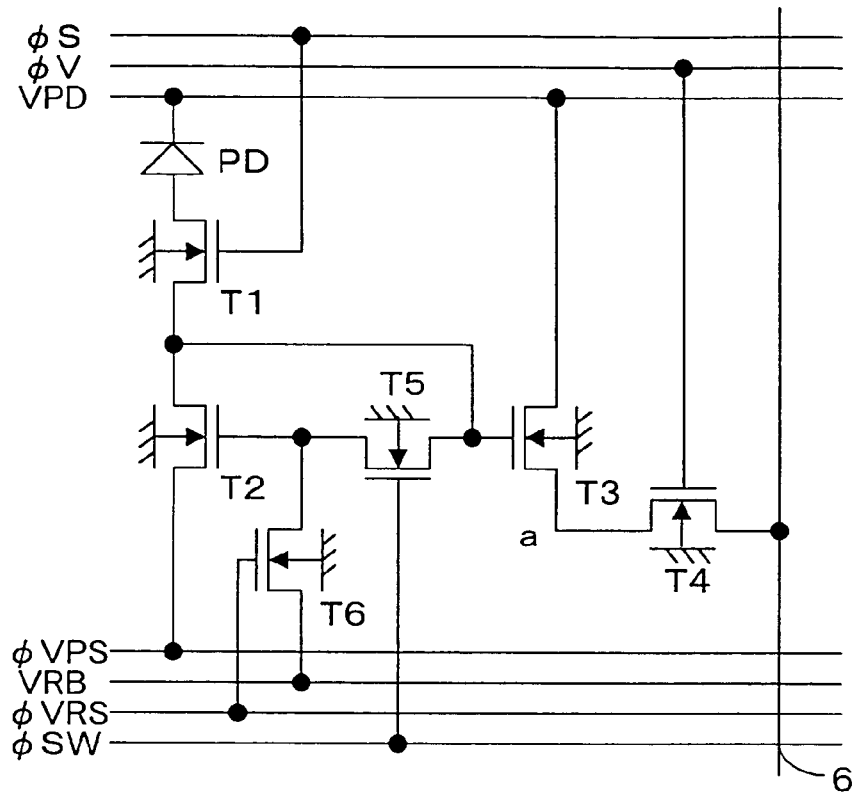
FIG. 18 is a circuit diagram showing the configuration of each pixel in a seventh embodiment of the invention.

Next, a seventh embodiment of the invention will be described with reference to the drawings. FIG. 18 is a circuit diagram showing the configuration of each pixel of the solid-state image-sensing device of this embodiment. It is to be noted that such elements, signal lines, and others as are used for the same purposes here as in the pixel shown in FIG. 17 are identified with the same reference symbols, and their detailed descriptions will be omitted.

As shown in FIG. 18, in this embodiment, the direct-current voltage VPD is applied to the drain of the MOS transistor T3, and the capacitor C1 and the MOS transistor T7 are omitted. That is, the MOS transistor T3 has its source connected to the drain of the MOS transistor T4. In other respects, each pixel of this embodiment is configured in the same manner as in the sixth embodiment (FIG. 16).

In this pixel configured as described above, image sensing is achieved in the following manner. As in the sixth embodiment, the MOS transistors T1 and T5 are turned on. In addition, the signal φVRS is turned to a low level to turn off the transistor T6 so that the MOS transistor T2 operates in a subthreshold region. Making the MOS transistor T2 operate in a subthreshold region in this way causes a current having the value natural-logarithmically proportional to the photoelectric current to flow through the MOS transistor T3 as its drain current.

Then, the pulse signal φV is fed to the gate of the MOS transistor T4 to turn on this MOS transistor T4. This causes a current having the value natural-logarithmically proportional to the photoelectric current to flow through the MOS transistor T4 as its drain current and then to the output signal line 6. At this time, the drain voltage of the MOS transistor Q1 (FIGS. 14A and 14B), which is determined by the on-state resistances of the MOS transistors T3 and Q1 and the current flowing therethrough, appears as the output signal on the output signal line 6. After this output signal has been read, the MOS transistor T4 is turned off.

Figure 19:
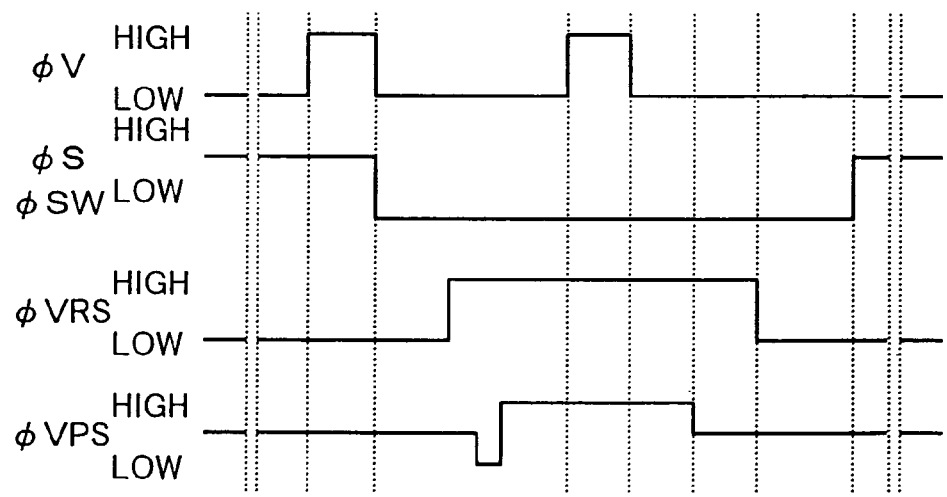
FIG. 19 is a timing chart of the signals fed to each pixel in the seventh embodiment.

On the other hand, resetting of the pixel is achieved by controlling the signals as shown in the timing chart of FIG. 19. After the feeding of the pulse signal φV, first, the signals φS and φSW are turned to a low level to turn off the MOS transistors T1 and T5, and resetting starts. Then, the signal φVRS is turned to a high level to apply the direct-current voltage VRB to the gate of the MOS transistor T2. Then, the signal φVPS is turned to a low level momentarily and is then turned to a high level so that a negative electric charge is accumulated at the drain of the MOS transistor T2. The amount of negative electric charge here is determined by the threshold voltage of the MOS transistor T2.

In this state, when the pulse signal φV is fed to the gate of the MOS transistor T4, a current proportional to the threshold voltage of the MOS transistor T2 is fed to the output signal line 6 and is acquired as compensation data to be used to correct the outputs from the individual pixels. After acquisition of compensation data as described above, the MOS transistor T4 is turned off. Thereafter, the signal φVPS is turned to an intermediate level to reset the MOS transistor T2, and then the signal φVRS is turned to a low level to turn off the MOS transistor T6. Subsequently, the signals φS and φSW are turned to a high level to turn on the MOS transistors T1 and T5 and thereby make the pixel ready for image sensing.

In this embodiment, it is not necessary to perform integration of the photoelectric signal by the use of a capacitor C1 as performed in the sixth embodiment described above, and thus no time is required for such integration, nor is it necessary to reset the capacitor C1. This ensures accordingly faster signal processing. Moreover, in this embodiment, as compared with the sixth embodiment, the capacitor C1 and the MOS transistor T7 can be omitted, and this helps further simplify the circuit configuration and reduce the pixel size.

Eighth Embodiment

Figure 20:
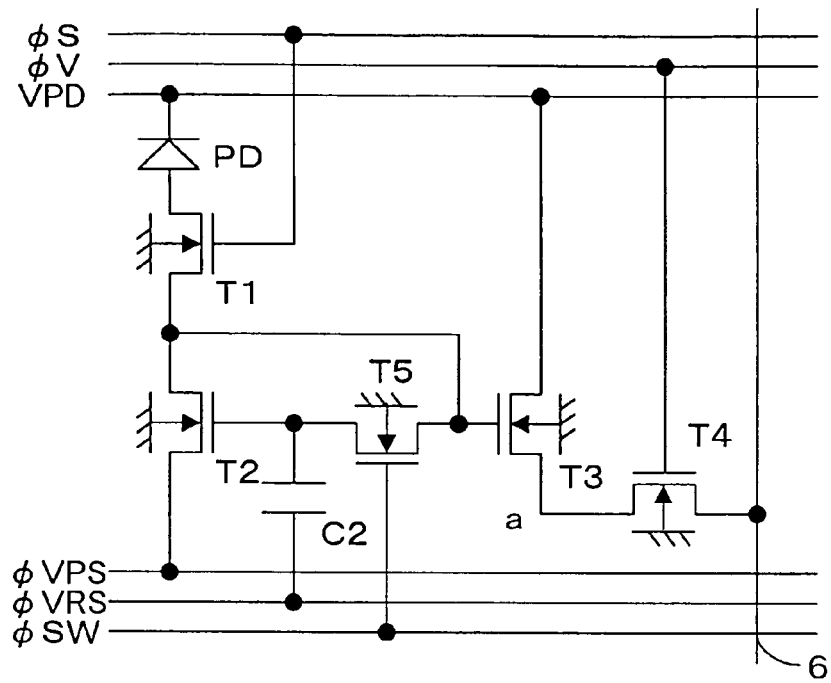
FIG. 20 is a circuit diagram showing the configuration of each pixel in an eighth embodiment of the invention.

Next, an eighth embodiment of the invention will be described with reference to the drawings. FIG. 20 is a circuit diagram showing the configuration of each pixel of the solid-state image-sensing device of this embodiment. It is to be noted that such elements, signal lines, and others as are used for the same purposes here as in the pixels shown in FIGS. 6 and 18 are identified with the same reference symbols, and their detailed descriptions will be omitted.

As shown in FIG. 20, according to the circuit configuration of this embodiment, a capacitor C2 is used instead of the MOS transistor T6 used in the pixel of the seventh embodiment (FIG. 18). Specifically, the capacitor C2 has one end connected to the node between the gate of the MOS transistor T2 and the source of the MOS transistor T5, and receives at the other end the signal φVRS. As in the second embodiment (FIG. 6), the signal φVRS is a binary voltage signal that takes either a low level, i.e. a voltage equal to the ground level, or a high level, i.e. a voltage higher than that voltage, at a time.

Thus, the circuit configuration of this embodiment is to that of the second embodiment what the circuit configuration of the seventh embodiment is to that of the first embodiment (FIG. 3). Accordingly, as in the second embodiment, by turning the signal φVRS fed to the capacitor C2 to a low level and in addition turning on the MOS transistors T1 and T5, the MOS transistor T2 is made to operate in a subthreshold region. This causes a voltage obtained by logarithmically converting the photoelectric current output from the photodiode PD to appear at the gate of the MOS transistor T3. Then, by turning on the MOS transistor T4, an output signal obtained through logarithmic conversion is output. On the other hand, resetting is achieved, as in the seventh embodiment, by varying the levels of the signals with the timing shown in the timing chart of FIG. 19. This permits variations in sensitivity of the individual pixels to be acquired as compensation data.

In a pixel according to the circuit configuration of the fifth to eighth embodiments, after image sensing by the individual pixels, it is possible to acquire, as compensation data for correcting the outputs from the individual pixels, signals proportional to the threshold voltage of the MOS transistor of the individual pixels, of which the variation leads to variations in sensitivity of the individual pixels. For example, not only is the image data obtained from the individual pixels during image sensing output to the succeeding circuit so as to be stored pixel by pixel in a memory provided therein, but also the current proportional to the threshold voltage of the MOS transistor of one pixel after another is output serially by way of the signal line 9 shown in FIG. 13 to the succeeding circuit so as to be stored pixel by pixel as compensation data in another memory provided therein. Then, by correcting pixel by pixel the image data with the corresponding compensation data, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

Ninth Embodiment

Figure 21:
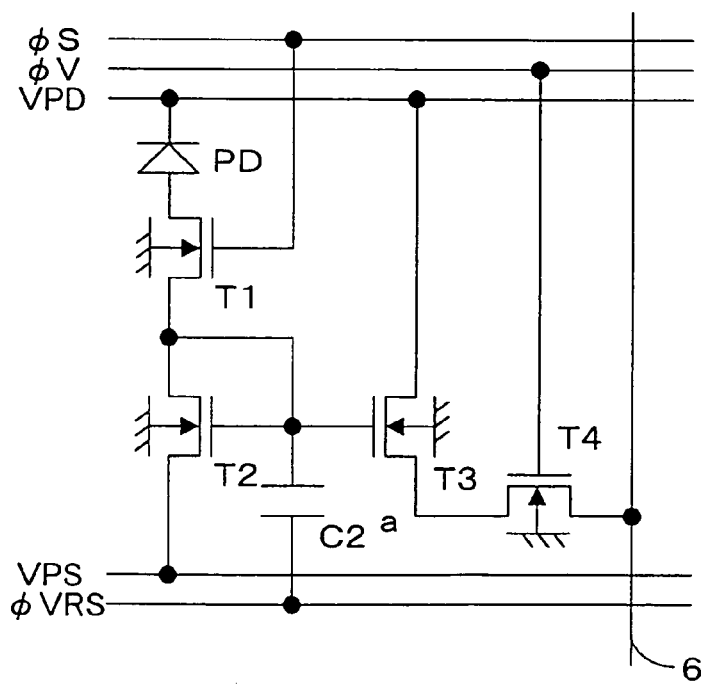
FIG. 21 is a circuit diagram showing the configuration of each pixel in a ninth embodiment of the invention.

Next, a ninth embodiment of the invention will be described with reference to the drawings. FIG. 21 is a circuit diagram showing the configuration of each pixel of the solid-state image-sensing device of this embodiment. It is to be noted that such elements, signal lines, and others as are used for the same purposes here as in the pixels shown in FIGS. 7 and 20 are identified with the same reference symbols, and their detailed descriptions will be omitted.

As shown in FIG. 21, according to the circuit configuration of this embodiment, as compared with the pixel of the eighth embodiment (FIG. 20), the MOS transistor T5 is omitted. Specifically, the gates of the MOS transistors T2 and T3 are connected together, and the direct-current voltage VPS is applied to the source of the MOS transistor T2.

Thus, the circuit configuration of this embodiment is to that of the third embodiment (FIG. 7) what the circuit configuration of the eighth embodiment is to that of the second embodiment (FIG. 6). Accordingly, as in the third embodiment, by turning the signal φVRS fed to the capacitor C2 to a low level and in addition turning on the MOS transistor T1, the MOS transistor T2 is made to operate in a subthreshold region. This causes a voltage obtained by logarithmically converting the photoelectric current output from the photodiode PD to appear at the gate of the MOS transistor T3. Then, by turning on the MOS transistor T4, an output signal obtained through logarithmic conversion is output.

Figure 22:
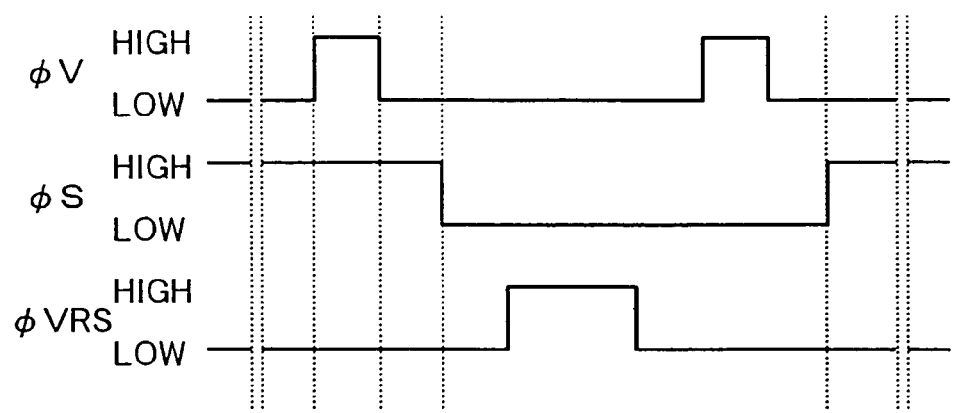
FIG. 22 is a timing chart of the signals fed to each pixel in the ninth embodiment.

On the other hand, resetting of the pixel is achieved by controlling the signals with the timing shown in the timing chart of FIG. 22. After the feeding of the signal φV, first, the signal φS is turned to a low level to turn off the MOS transistor T1, and resetting starts. Then, the signal φVRS is turned to a high level to make the gate voltage of the MOS transistor T2 higher. This increases the amount of electric charge that flows into the MOS transistor T2 via the source thereof.

Thus, recombination of the positive electric charges accumulated at the gate and drain of the MOS transistor T2, at the gate of the MOS transistor T3, and in the capacitor C2 is achieved quickly. Then, the signal φVRS is turned to a low level to reset the potentials in the MOS transistor T2 to their original levels. In this state, when the pulse signal φV is fed to the gate of the MOS transistor T4, the output voltage obtained on resetting is fed, from one pixel after another, to the output signal line 6 and is acquired as compensation data to be used to correct the outputs of the individual pixels. After compensation data has been acquired in this way, the MOS transistor T4 is turned off. Thereafter, the signal φS is turned to a high level to turn on the MOS transistor T1 and thereby make the pixel ready for the next round of image sensing.

Tenth Embodiment

Figure 23:
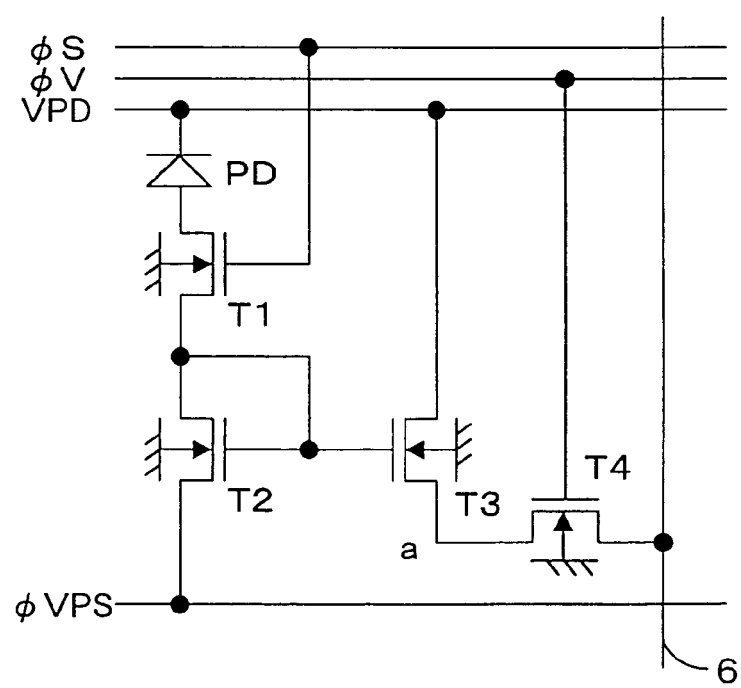
FIG. 23 is a circuit diagram showing the configuration of each pixel in a tenth embodiment of the invention.

Next, a tenth embodiment of the invention will be described with reference to the drawings. FIG. 23 is a circuit diagram showing the configuration of each pixel of the solid-state image-sensing device of this embodiment. It is to be noted that such elements, signal lines, and others as are used for the same purposes here as in the pixels shown in FIGS. 10 and 21 are identified with the same reference symbols, and their detailed descriptions will be omitted.

As shown in FIG. 23, according to the circuit configuration of this embodiment, as compared with the pixel of the ninth embodiment (FIG. 21), the capacitor C2 is omitted. Moreover, the signal φVPS is fed to the source of the MOS transistor T2. As in the fourth embodiment (FIG. 10), the signal φVPS is a binary signal that takes one of two predetermined levels, i.e. either a low level or a high level, at a time. Here, a high level refers to a voltage that is approximately equal to the direct-current voltage VPS and that causes the MOS transistor T2 to operate in a subthreshold region, and a low level refers to a voltage that is lower than that voltage and that causes a higher current to flow through the MOS transistor T2 than when a high level is fed thereto.

Thus, the circuit configuration of this embodiment is to that of the fourth embodiment what the circuit configuration of the ninth embodiment is to that of the third embodiment (FIG. 7). Accordingly, as in the fourth embodiment, by turning the signal φVPS fed to the source of the MOS transistor T2 to a high level and in addition turning on the MOS transistor T1, the MOS transistor T2 is made to operate in a subthreshold region. This causes a voltage obtained by logarithmically converting the photoelectric current output from the photodiode PD to appear at the gate of the MOS transistor T3. Then, by turning on the MOS transistor T4, an output signal obtained through logarithmic conversion is output.

Figure 24:
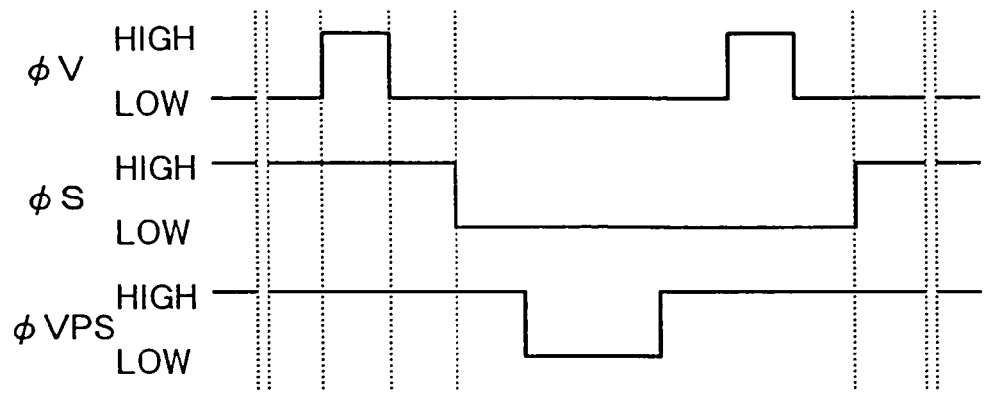
FIG. 24 is a timing chart of the signals fed to each pixel in the tenth embodiment.
Figure 25:
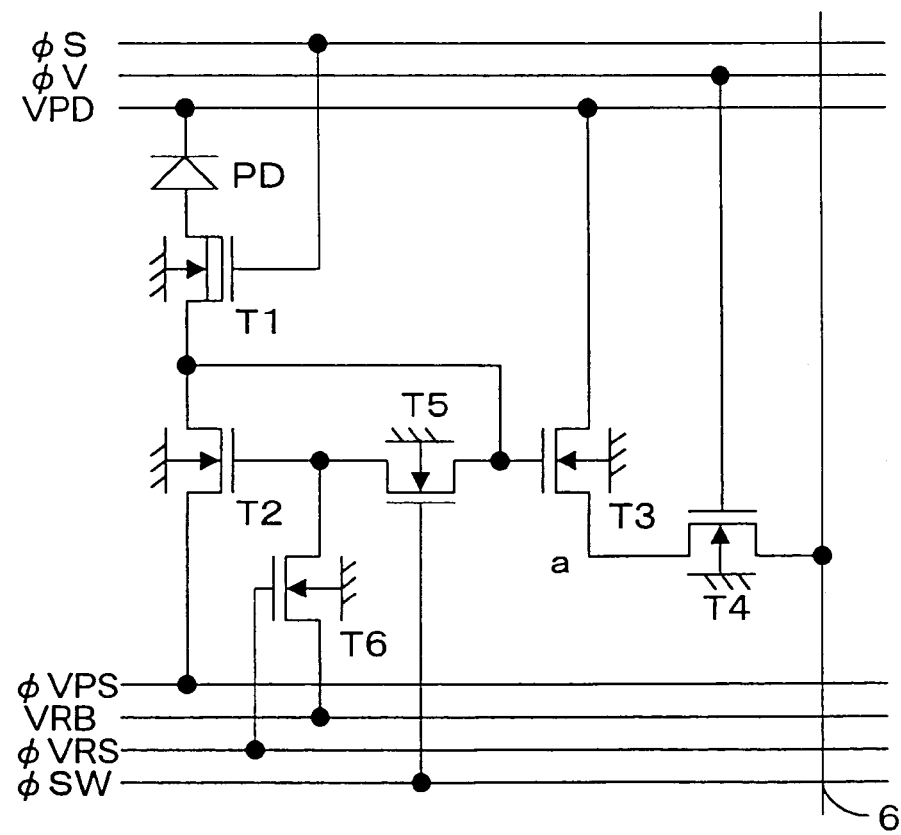
FIG. 25 is a circuit diagram showing an example of the configuration of each pixel in the seventh embodiment.
Figure 26:
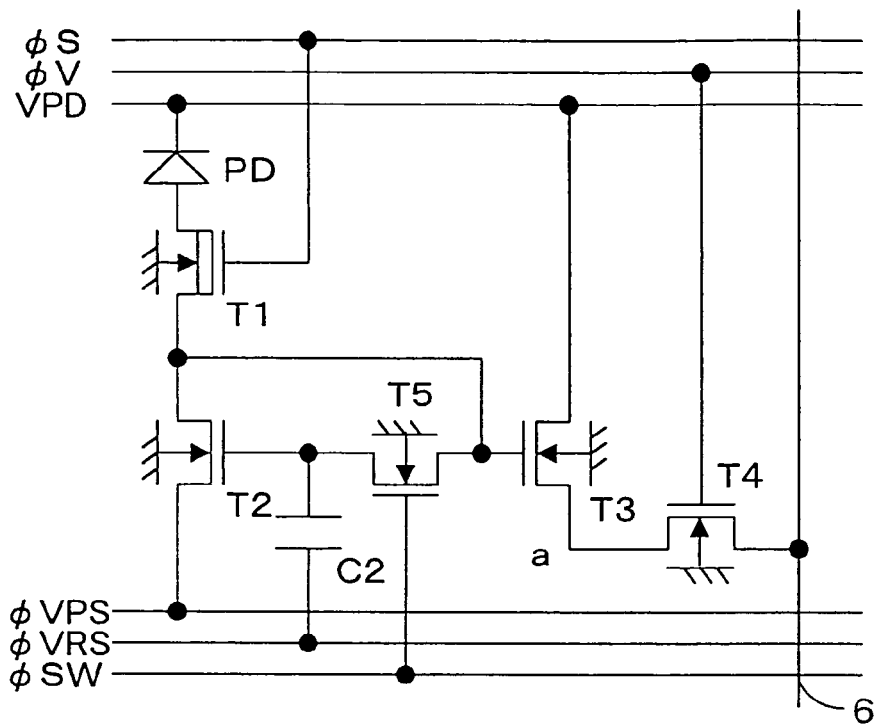
FIG. 26 is a circuit diagram showing an example of the configuration of each pixel in the eighth embodiment.
Figure 27:
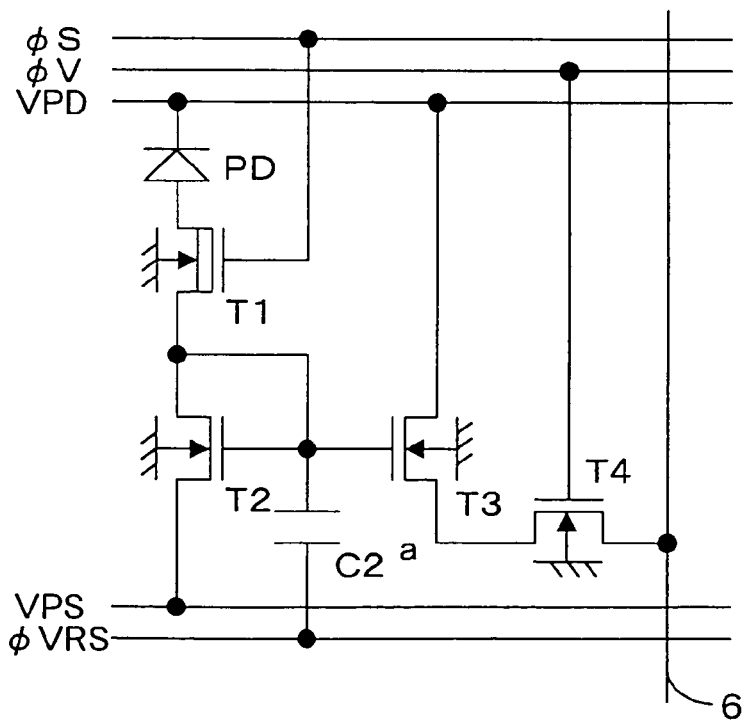
FIG. 27 is a circuit diagram showing an example of the configuration of each pixel in the ninth embodiment.
Figure 28:
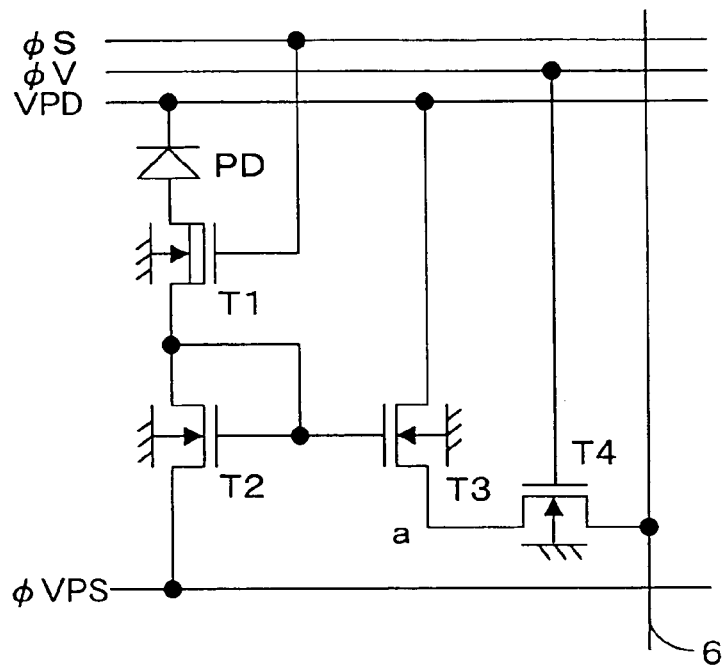
FIG. 28 is a circuit diagram showing an example of the configuration of each pixel in the tenth embodiment.
Figure 29:
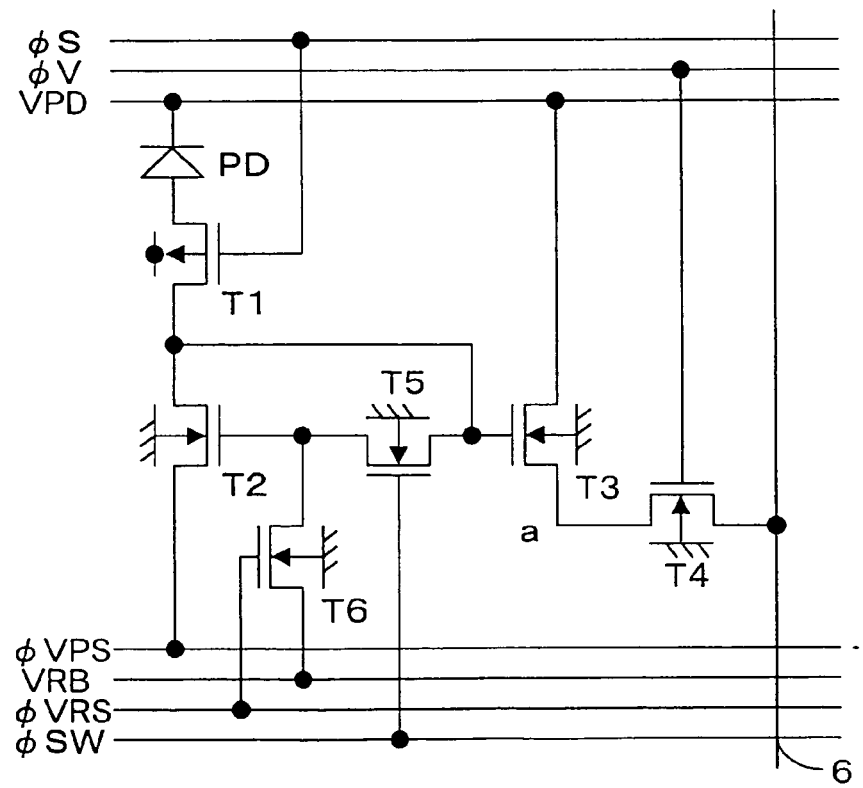
FIG. 29 is a circuit diagram showing another example of the configuration of each pixel in the seventh embodiment.
Figure 30:
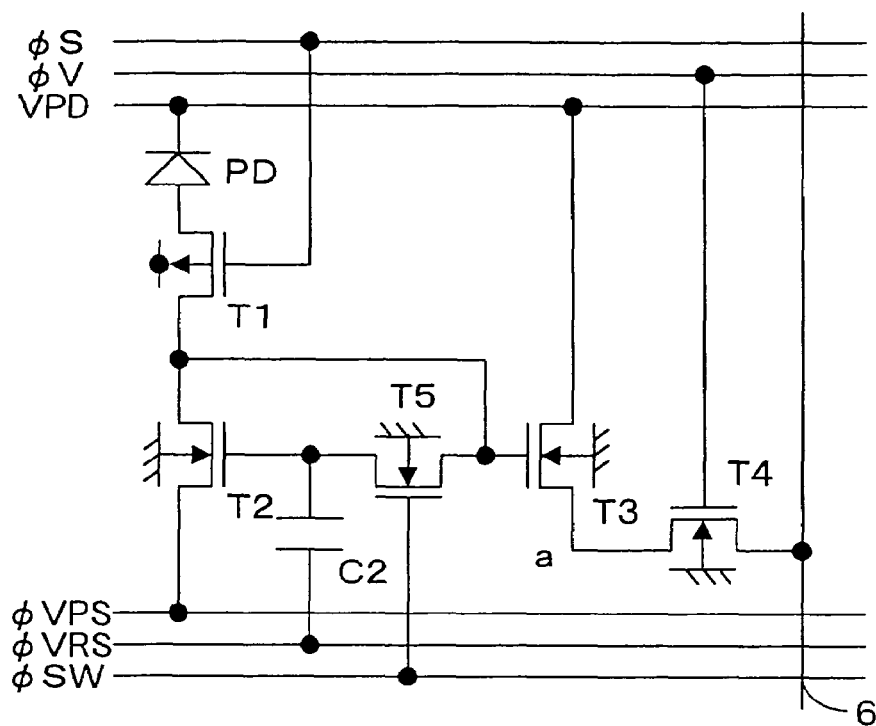
FIG. 30 is a circuit diagram showing another example of the configuration of each pixel in the eighth embodiment.
Figure 31:
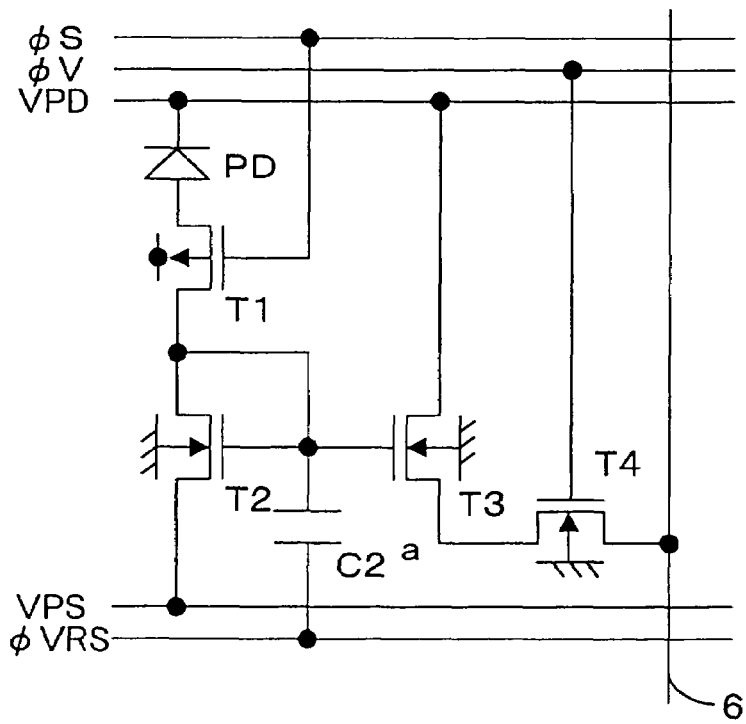
FIG. 31 is a circuit diagram showing another example of the configuration of each pixel in the ninth embodiment.
Figure 32:
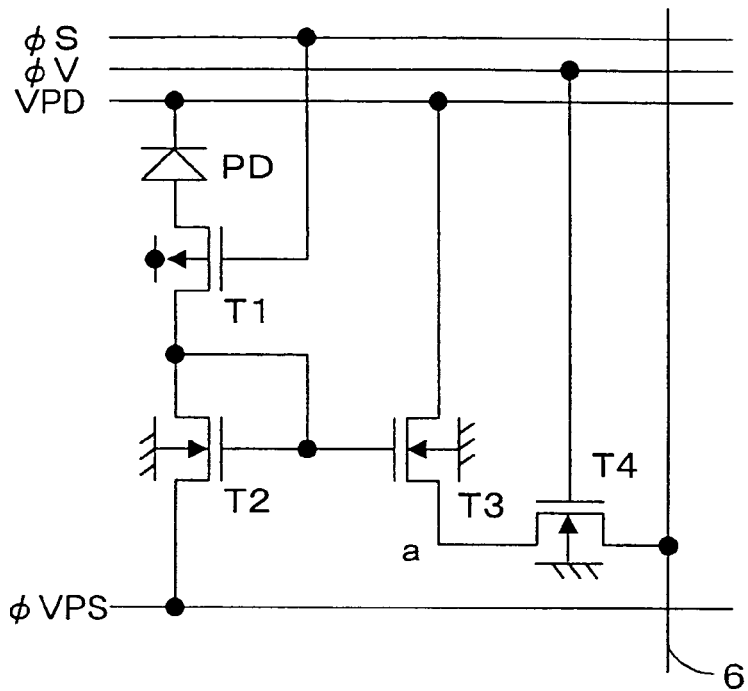
FIG. 32 is a circuit diagram showing another example of the configuration of each pixel in the tenth embodiment.

On the other hand, resetting of the pixel is achieved by controlling the signals with the timing shown in the timing chart of FIG. 24. After the feeding of the signal φV, first, the signal φS is turned to a low level to turn off the MOS transistor T1, and resetting starts. Then, the signal φVPS is turned to a low level to make the source voltage of the MOS transistor T2 lower. This increases the amount of electric charge that flows into the MOS transistor T2 via the source thereof.

Thus, recombination of the positive electric charges accumulated at the gate and drain of the MOS transistor T2, and at the gate of the MOS transistor T3 is achieved quickly. Then, the signal φVPS is turned to a high level to reset the potentials in the MOS transistor T2 to their original levels. In this state, when the pulse signal φV is fed to the gate of the MOS transistor T4, the output voltage obtained on resetting is fed, from one pixel to another, to the output signal line 6 and is acquired as compensation data to be used to correct the outputs of the individual pixels. After compensation data has been acquired in this way, the MOS transistor T4 is turned off. Thereafter, the signal φS is turned to a high level to turn on the MOS transistor T1 and thereby make the pixel ready for the next round of image sensing.

In the ninth and tenth embodiments, as in the fifth to eighth embodiments, this output signal obtained on resetting is output serially, from one pixel after another, by way of the signal line 9 shown in FIG. 13 to the succeeding circuit so as to be stored as pixel-by-pixel compensation data in a memory provided therein. Then, by correcting pixel by pixel the output current obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

In the eighth to tenth embodiments (FIGS. 20, 21, and 23), it is also possible, as in the fifth embodiment (FIG. 15), to connect the source of the MOS transistor T3 to one end of a capacitor C1 that receives the direct-current voltage VPS at the other end, to the gate of a MOS transistor T7, and to the drain of a MOS transistor T8 for resetting the capacitor C1 and connect the source of the MOS transistor T7 to the drain of the MOS transistor T4. Alternatively, it is also possible, as in the sixth embodiment (FIG. 17), to feed the signal φD to the drain of the MOS transistor T3 and thereby omit the MOS transistor T8 as used in the fifth embodiment (FIG. 15) described above.

Pixel Configurations Including a Depletion-Mode MOS Transistor

In the first to tenth embodiments (FIGS. 3, 6, 7, 10, 15, 17, 18, 20, 21, and 23), the first MOS transistor T1 may be a depletion-mode N-channel MOS transistor. In that case, for example, the pixels of the seventh to tenth embodiments (FIGS. 18, 20, 21, and 23) have circuit configurations as shown in FIGS. 25 to 28, respectively. As shown in FIGS. 25 to 28, all the other transistors than the MOS transistor T1 are enhancement-mode N-channel MOS transistors.

Where all the MOS transistors provided within a pixel are enhancement-mode MOS transistors, the MOS transistors T1 and T2 are connected in series, and therefore the high-level voltage of the signal φS fed to the gate of the MOS transistor T1 is normally higher than the voltage supplied to the pixel. Accordingly, it is usually necessary to provide a separate power source for feeding the signal φS to the MOS transistor T1.

By contrast, by using as this MOS transistor T1 a depletion-mode MOS transistor, it is possible to lower the high-level voltage of the signal φS fed to the gate thereof, and thus make this high-level voltage equal to the high-level signals fed to the other MOS transistors. The reason is that a depletion-mode MOS transistor has a negative threshold value and can thus be turned on with a lower gate voltage than with an enhancement-mode MOS transistor.

Pixel Configurations Including a P-Channel MOS Transistor

Alternatively, in the first to tenth embodiments, the first MOS transistor T1 may be a P-channel MOS transistor. In that case, for example, the pixels of the seventh to tenth embodiments have circuit configurations as shown in FIGS. 29 to 32. As shown in FIGS. 29 to 32, all the other transistors than the MOS transistor T1 are N-channel MOS transistors. Moreover, the MOS transistor T1 has its source connected to the anode of the photodiode PD, and has its drain connected to the drain of the MOS transistor T2.

In these circuit configurations, the MOS transistor T1 is turned on when the voltage difference between the gate and drain thereof is greater than the threshold value thereof, and is turned off when the voltage difference between the gate and drain thereof is smaller than the threshold value. Accordingly, the signal φS fed to the gate of the MOS transistor T1 has an inverted level-shift pattern as compared with the signal φS in the first to tenth embodiments. Moreover, the MOS transistor T1 can be turned on and off without being affected by the MOS transistor T2 that is connected in series with the drain of the MOS transistor T1.

Moreover, since the MOS transistor T1 can be turned on and off without being affected by the MOS transistor T2, there is no need to provide a separate power source for feeding the signal φS. Furthermore, these circuit configurations permit the MOS transistor T1 to be formed as an enhancement-mode MOS transistor like all the other MOS transistors, and thus allow the MOS transistor T1 to be produced together with the other MOS transistors in a single step. This helps simplify the manufacturing process as compared with the circuit configurations described above in which only the first MOS transistor is a depletion-mode MOS transistor.

Eleventh Embodiment

Figure 33:
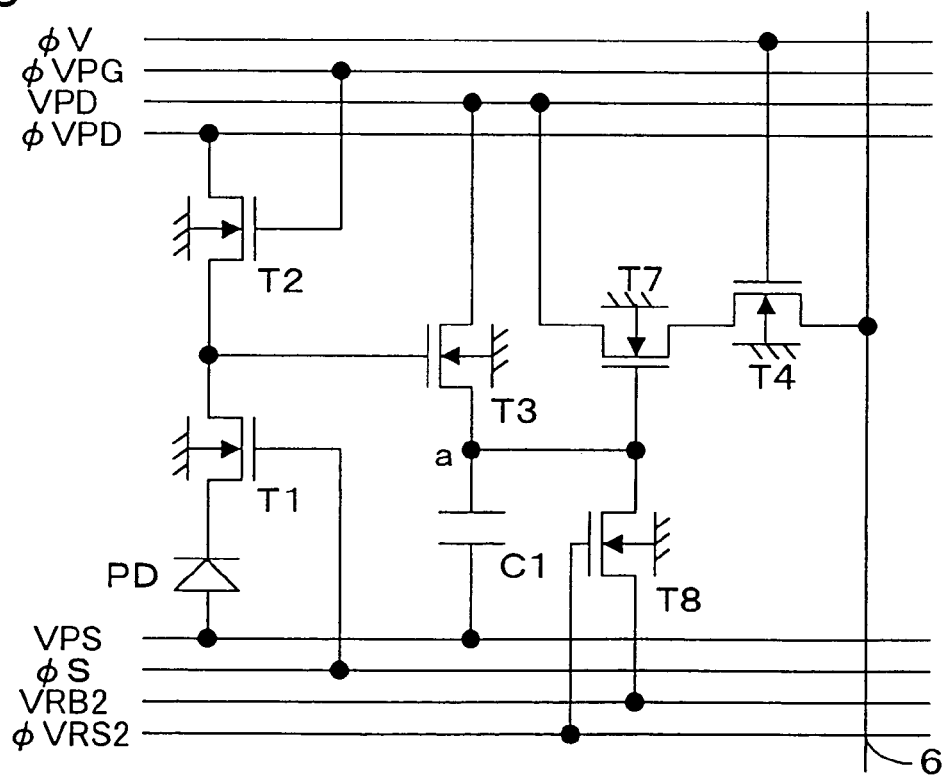
FIG. 33 is a circuit diagram showing the configuration of each pixel in an eleventh embodiment of the invention.

Next, an eleventh embodiment of the invention will be described with reference to the drawings. FIG. 33 is a circuit diagram showing the configuration of each pixel of the solid-state image-sensing device of this embodiment. It is to be noted that such elements, signal lines, and others as are used for the same purposes here as in the pixel shown in FIG. 15 are identified with the same reference symbols, and their detailed descriptions will be omitted.

As shown in FIG. 33, in this embodiment, the MOS transistors T3, T4, T7, and T8 and the capacitor C1 that constitute an output block of the pixel are configured in the same manner as in the pixel shown in FIG. 15. In this pixel configured as shown in FIG. 33, a direct-current voltage VPS is applied to the anode of the photodiode PD, and the signal φVPD is applied to the drain of the MOS transistor T2, whose source is connected to the gate of the MOS transistor T3. In addition, a first MOS transistor T1 is provided that has its drain connected to the source of the MOS transistor T2 and has its source connected to the cathode of the photodiode PD. Moreover, a signal φVPG is fed to the gate of the MOS transistor T2, and a signal φS is fed to the gate of the MOS transistor T1.

(1) Mode in Which the Output Signal is Produced by Converting the Photoelectric Current Natural-Logarithmically Here, a first voltage is used to permit the MOS transistor T2 to operate in a subthreshold region, and a second voltage that is approximately equal to the direct-current voltage VPS is used to permit pixel-to-pixel variations in the threshold level of the MOS transistor T2 to be detected.

(1-a) Image Sensing

The signal φVPD is made equal to the first voltage to permit the MOS transistor T2 to operate in a subthreshold region, and the signal φS fed to the gate of the MOS transistor T1 is turned to a high level to turn on this MOS transistor T1. In this state, when light enters the photodiode PD, a photoelectric current is generated therein, and thus, due to the subthreshold characteristics of a MOS transistor, a voltage having the value obtained by converting the photoelectric current natural-logarithmically appears at the source of the MOS transistor T2 and at the gate of the MOS transistor T3. Here, since a negative photoelectric charge is generated in the photodiode PD and flows into the MOS transistor T2 via the source thereof, the more intense the incident light, the lower the source voltage of the MOS transistor T2 becomes.

When a voltage obtained by converting the photoelectric current natural-logarithmically appears at the gate of the MOS transistor T3 in this way, first, a high level is fed as the signal φVRS2 to the gate of the MOS transistor T8 to turn on this MOS transistor T8 so as to reset the voltage at the capacitor C1, and thus at the node "a". At this time, the voltage at the node "a" is reset to a voltage lower than the surface potential that is determined by the gate voltage of the MOS transistor T3 in order to allow the MOS transistor T3 to operate. Next, the signal φVRS2 is turned to a low level to turn off the MOS transistor T8, and then the signal φV is turned to a high level to turn on the MOS transistor T4.

Here, as a result of the MOS transistor T8 resetting the voltage at the node "a", the MOS transistor T3 operates in such a way that a voltage obtained by sampling the surface potential that is determined by the gate voltage of the MOS transistor T3 is fed to the gate of the MOS transistor T7. Accordingly, the voltage at the gate of the MOS transistor T7 has the value that is proportional to the logarithm of the amount of incident light, and thus, when the MOS transistor T4 is turned on, a current having the value obtained by converting the photoelectric current natural-logarithmically flows through the MOS transistors T7 and T4 to the output signal line 6. In this way, a signal (output current) proportional to the logarithm of the amount of incident light is read, and thereafter the MOS transistor T4 is turned off.

(1-b) Sensitivity Variation Detection

Figure 34:
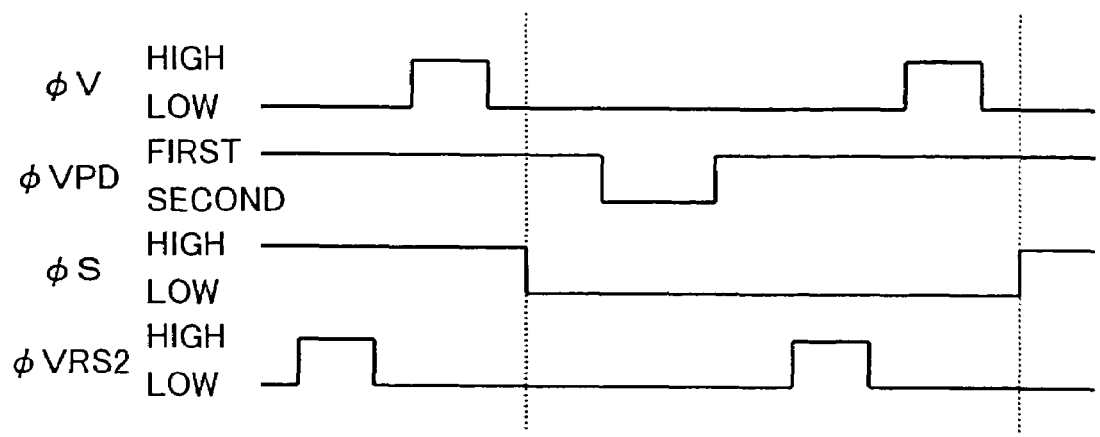
FIG. 34 is a timing chart of the signals fed to each pixel in the eleventh embodiment.

FIG. 34 shows a timing chart of the relevant signals as observed when variations in sensitivity among the individual pixels are detected. As described above, by feeding the pulse signal φVRS2 to the MOS transistor T8, the voltage at the node "a" is reset, and then, by feeding the pulse signal φV to the gate of the MOS transistor T4, an output signal is read. Thereafter, first, the signal φS is turned to a low level to turn off the MOS transistor T1. Then, the signal φVPD is made equal to the second voltage to accumulate a negative electric charge between the drain and the source of the MOS transistor T2.

Next, when the signal φVPD is turned back to the first voltage, part of the accumulated negative electric charge flows into the signal line of the signal φVPD, and the rest of the negative electric charge remains at the source of the MOS transistor T2. Here, the amount of negative electric charge that remains depends on the threshold voltage between the gate and the source. After the negative electric charge has been accumulated at the source of the MOS transistor T2 in this way, the pulse signal φVRS2 is fed to the gate of the MOS transistor T8 to reset the voltage at the node "a", and then the pulse signal φV is fed to the gate of the MOS transistor T4 to read an output signal.

The output signal thus read has a value corresponding to the threshold voltage of the MOS transistor T2, and therefore, on the basis of this signal, it is possible to detect variations in sensitivity among the individual pixels. Lastly, in preparation for image sensing, the signal φS is turned to a high level to turn on the MOS transistor T1. The signal thus obtained as a result of sensitivity variation detection is stored as compensation data in a memory such as a line memory so that, for each pixel, the output signal obtained therefrom in actual image sensing is compensated on the basis of this compensation data. This makes it possible to remove, from the output signal, components resulting from variations among the pixels. This compensation may be realized by providing memories, such as line memories, within the pixels.

Figure 96:
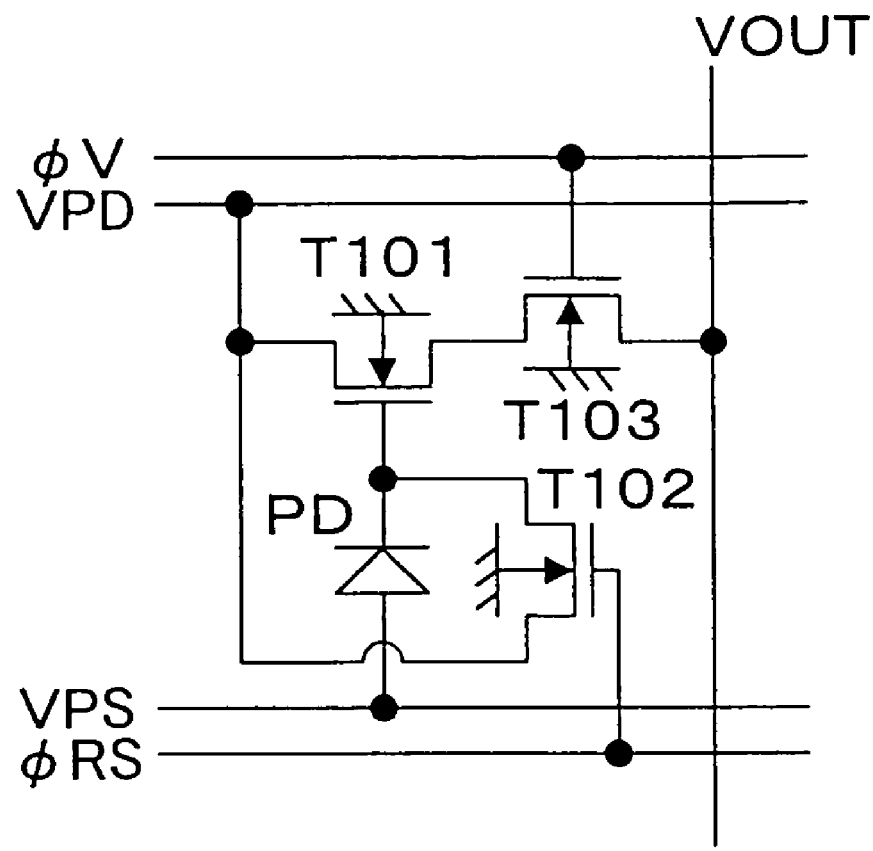
FIG. 96 is a circuit diagram showing the configuration of each pixel of a conventional solid-state image-sensing device.

(2) Mode in Which the Output Signal is Produced by Converting the Photoelectric Current Linearly In this mode, the voltage of the signal φVPD is kept at a third voltage that is equal to the operation point of the MOS transistor T3 (this voltage may be equal to the first voltage mentioned previously provided that the circuit configuration is so optimized as to ensure proper operation of the MOS transistor T3). Moreover, in this mode, the signal φS is kept at a high level all the time, and thus the MOS transistor T1, which receives the signal φS at its gate, is kept on all the time. As a result, in this circuit configuration, the MOS transistor T2 corresponds to the resetting MOS transistor T102 shown in FIG. 96, and the MOS transistor T3 corresponds to the signal-amplification MOS transistor T101 shown in FIG. 96.

(2-a) Image Sensing

First, the signal φVPG is turned to a low level to turn off the resetting MOS transistor T2. In this state, in which the resetting MOS transistor T2 is off, when a photoelectric current is generated in the photodiode PD, the gate voltage of the MOS transistor T3 changes. Specifically, a negative photoelectric charge is fed from the photodiode PD to the gate of the MOS transistor T3, and thus the gate voltage of the MOS transistor T3 has the value obtained by converting the photoelectric current linearly. Here, since the negative photoelectric charge generated in the photodiode PD flows into the MOS transistor T3 via the gate thereof, the more intense the incident light, the lower the gate voltage of the MOS transistor T3 becomes.

When a voltage obtained by converting the photoelectric current linearly appears at the gate of the MOS transistor T3 in this way, first, a high level is fed as the signal φVRS2 to the gate of the MOS transistor T8 to turn on this MOS transistor T8 so as to reset the voltage at the capacitor C1, and thus at the node "a". At this time, the voltage at the node "a" is reset to a voltage lower than the surface potential that is determined by the gate voltage of the MOS transistor T3 in order to allow the MOS transistor T3 to operate. Next, the signal φVRS2 is turned to a low level to turn off the MOS transistor T8, and then the signal φV is turned to a high level to turn on the MOS transistor T4.

Here, as a result of the MOS transistor T8 resetting the voltage at the node "a", the MOS transistor T3 operates in such a way that a voltage obtained by sampling the surface potential that is determined by the gate voltage of the MOS transistor T3 is fed to the gate of the MOS transistor T7. Accordingly, the voltage at the gate of the MOS transistor T7 has the value that is proportional to the integral of the amount of incident light, and thus, when the MOS transistor T4 is turned on, a current having the value obtained by converting the photoelectric current linearly flows through the MOS transistors T7 and T4 to the output signal line 6. In this way, a signal (output current) proportional to the amount of incident light is read, and thereafter the MOS transistor T4 is turned off.

(2-b) Resetting

Figure 35:
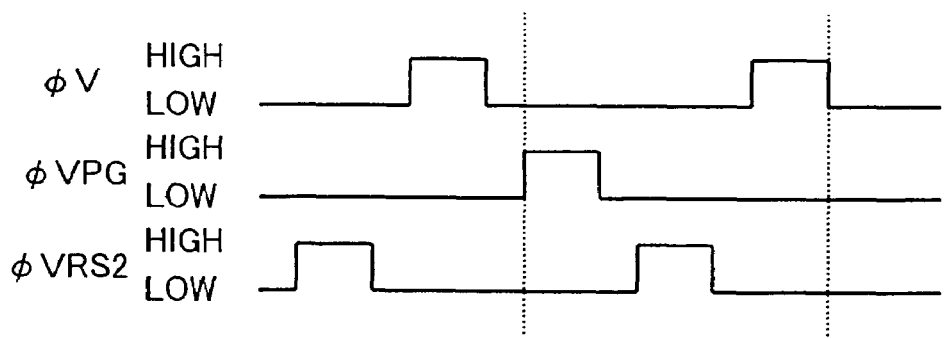
FIG. 35 is a timing chart of the signals fed to each pixel in the eleventh embodiment.

FIG. 35 shows a timing chart of the relevant signals as observed when each pixel is reset. As described above, by feeding the pulse signal φVRS2 to the MOS transistor T8, the voltage at the node "a" is reset, and then, by feeding the pulse signal φV to the gate of the MOS transistor T4, an output signal is read. Thereafter, first, the signal φVPG is turned to a high level to turn on the MOS transistor T2. When the MOS transistor T2 is turned on in this way, the third voltage is fed to the gate of the MOS transistor T3, and thereby the gate voltage of the MOS transistor T3 is reset. Then, the signal φVPG is turned back to a low level to turn off the MOS transistor T2.

Next, the pulse signal φVRS2 is fed to the gate of the MOS transistor T8 to reset the voltage at the node "a", and then the pulse signal φV is fed to the gate of the MOS transistor T4 to read an output signal. The output signal thus read has a value corresponding to the gate voltage of the MOS transistor T3, and is thus read as an output signal obtained during initialization. After this output signal has been read, image sensing as described previously is restarted.

The signal thus obtained during initialization is stored as compensation data in a memory such as a line memory so that, for each pixel, the output signal obtained therefrom in actual image sensing is compensated on the basis of this compensation data. This makes it possible to remove, from the output signal, components resulting from variations among the pixels. This compensation may be realized by providing memories, such as line memories, within the pixels. Here, the circuit may be so configured that, as in the sixth embodiment (FIG. 17), a pulse signal (for example, φVPDA) is fed to the drain of the MOS transistor T3 to permit this MOS transistor T3 to reset the voltage at the node "a" in response to that signal φVPDA. This makes it possible to omit the MOS transistor T8 from the pixel configured as shown in FIG. 33.

Twelfth Embodiment

Figure 36:
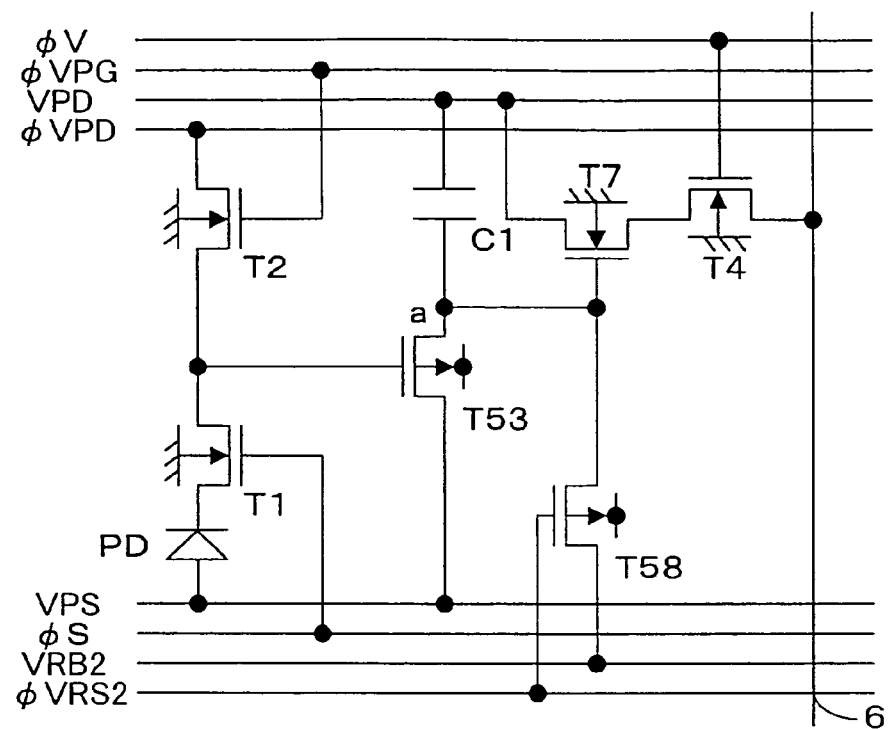
FIG. 36 is a circuit diagram showing the configuration of each pixel in a twelfth embodiment of the invention.

Next, a twelfth embodiment of the invention will be described with reference to the drawings. FIG. 36 is a circuit diagram showing the configuration of each pixel of the solid-state image-sensing device of this embodiment. It is to be noted that such elements, signal lines, and others as are used for the same purposes here as in the pixel shown in FIG. 33 are identified with the same reference symbols, and their detailed descriptions will be omitted.

As shown in FIG. 36, in this embodiment, P-type MOS transistors T53 and T58 are used in place of the MOS transistors T3 and T8 used in the pixel shown in FIG. 33. The direct-current voltage VPS is applied to the drain of the MOS transistor T53, and the direct-current voltage VPD is applied to one end of the capacitor C1, of which the other end is connected to the source of the MOS transistor T53. Moreover, the direct-current voltage VRB2 is applied to the drain of the MOS transistor T58, of which the source is connected to the gate of the MOS transistor T7. In other respects, each pixel of this embodiment is configured in the same manner as the pixel shown in FIG. 33. Here, the direct-current voltage VRB2 applied to the source of the MOS transistor T58 is higher than the direct-current voltage VPS.

(1) Mode in Which the Output Signal is Produced by Converting the Photoelectric Current Natural-Logarithmically Here, as in the eleventh embodiment, a first voltage is used to permit the MOS transistor T2 to operate in a subthreshold region, and a second voltage that is approximately equal to the direct-current voltage VPS is used to permit pixel-to-pixel variations in the threshold level of the MOS transistor T2 to be detected.

(1-a) Image Sensing

The signal φVPD is made equal to the first voltage to permit the MOS transistor T2 to operate in a subthreshold region, and the signal φS fed to the gate of the MOS transistor T1 is turned to a high level to turn on this MOS transistor T1. Here, it is assumed that the voltage at the capacitor C1, and thus at the node "a", has already been reset by the MOS transistor T58. In this state, when light enters the photodiode PD, a photoelectric current is generated therein, and thus, due to the subthreshold characteristics of a MOS transistor, a voltage having the value obtained by converting the photoelectric current natural-logarithmically appears at the source of the MOS transistor T2 and at the gate of the MOS transistor T53. Here, since a negative photoelectric charge is generated in the photodiode PD and flows into the MOS transistor T2 via the source thereof, the more intense the incident light, the lower the source voltage of the MOS transistor T2 becomes.

When a voltage obtained by converting the photoelectric current natural-logarithmically appears at the gate of the MOS transistor T53 in this way, now that the voltage at the node "a" has already been reset to a voltage higher than the surface potential that is determined by the gate voltage of the MOS transistor T53, a positive electric charge flows from the capacitor C1 through the MOS transistor 52. Here, the amount of positive electric charge flowing from the capacitor C1 depends on the gate voltage of the MOS transistor T53. Accordingly, the more intense the incident light, and thus the lower the source voltage of the MOS transistor T2, the larger the amount of positive electric charge flowing from the capacitor C1.

The positive electric charge flowing from the capacitor C1 in this way causes the voltage at the node "a" to have the value obtained by converting the integral of the amount of incident light natural-logarithmically. Then, when the pulse signal φV is fed to the MOS transistor T4 to turn it on, a current having the value obtained by converting the integral of the photoelectric current natural-logarithmically flows through the MOS transistors T7 and T4 to the output signal line 6. In this way, a signal (output current) proportional to the logarithm of the amount of incident light is read, and thereafter the MOS transistor T4 is turned off.

(1-b) Sensitivity Variation Detection

Figure 37:
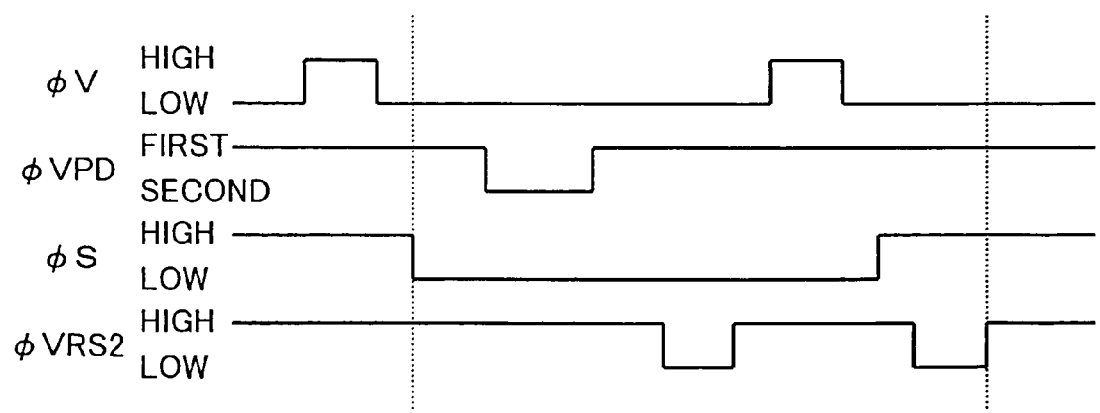
FIG. 37 is a timing chart of the signals fed to each pixel in the twelfth embodiment.

FIG. 37 shows a timing chart of the relevant signals as observed when variations in sensitivity among the individual pixels are detected. As described above, by feeding the pulse signal φV to the gate of the MOS transistor T4, an output signal is read. Thereafter, as in the eleventh embodiment (FIG. 34), first, the signal φS is turned to a low level to turn off the MOS transistor T1. Then, the signal φVPD is made equal to the second voltage to accumulate a negative electric charge between the drain and the source of the MOS transistor T2.

Next, when the signal φVPD is turned back to the first voltage, part of the accumulated negative electric charge flows into the signal line of the signal φVPD, and the rest of the negative electric charge remains at the source of the MOS transistor T2. Here, the amount of negative electric charge that remains depends on the threshold voltage between the gate and the source. After the negative electric charge has been accumulated at the source of the MOS transistor T2 in this way, the pulse signal φVRS2 is fed to the gate of the MOS transistor T58 to reset the voltage at the node "a", and then the pulse signal φV is fed to the gate of the MOS transistor T4 to read an output signal. Here, the pulse signal φVRS2 fed to the gate of the MOS transistor T58 is a low-level pulse signal.

The output signal thus read has a value corresponding to the threshold voltage of the MOS transistor T2, and therefore, on the basis of this signal, it is possible to detect variations in sensitivity among the individual pixels. Lastly, in preparation for image sensing, the signal φS is turned to a high level to turn on the MOS transistor T1, and then the pulse signal φVRS2 is fed to the gate of the MOS transistor T58 to reset the voltage at the node "a". The signal thus obtained as a result of sensitivity variation detection is stored as compensation data in a memory such as a line memory so that, for each pixel, the output signal obtained therefrom in actual image sensing is compensated on the basis of this compensation data. This makes it possible to remove, from the output signal, components resulting from variations among the pixels. This compensation may be realized by providing memories, such as line memories, within the pixels.

(2) Mode in Which the Output Signal is Produced by Converting the Photoelectric Current Linearly In this mode, as in the eleventh embodiment, the voltage of the signal φVPD is kept at a third voltage that is equal to the operation point of the MOS transistor T53. Moreover, in this mode, the signal φS is kept at a high level all the time, and thus the MOS transistor T1, which receives the signal φS at its gate, is kept on all the time. As a result, in this circuit configuration, the MOS transistor T2 corresponds to the resetting MOS transistor T102 shown in FIG. 96, and the MOS transistor T53 corresponds to the signal-amplification MOS transistor T101 shown in FIG. 96.

(2-a) Image Sensing

First, as in the eleventh embodiment, the signal φVPG is turned to a low level to turn off the resetting MOS transistor T2. Here, it is assumed that the voltage at the capacitor C1, and thus at the node "a", has already been reset by the MOS transistor T58. In this state, in which the resetting MOS transistor T2 is off, when a photoelectric current is generated in the photodiode PD, the gate voltage of the MOS transistor T53 changes. Specifically, a negative photoelectric charge is fed from the photodiode PD to the gate of the MOS transistor T53, and thus the gate voltage of the MOS transistor T53 has the value obtained by converting the photoelectric current linearly. Here, since the negative photoelectric charge generated in the photodiode PD flows into the MOS transistor T53 via the gate thereof, the more intense the incident light, the lower the gate voltage of the MOS transistor T53 becomes.

When a voltage obtained by converting the photoelectric current linearly appears at the gate of the MOS transistor T53 in this way, now that the voltage at the node "a" has already been reset to a voltage higher than the surface potential that is determined by the gate voltage of the MOS transistor T53, a positive electric charge flows from the capacitor C1 through the MOS transistor T53. Here, the amount of positive electric charge flowing from the capacitor C1 depends on the gate voltage of the MOS transistor T53. Accordingly, the more intense the incident light, and thus the lower the gate voltage of the MOS transistor T53, the larger the amount of positive electric charge flowing from the capacitor C1.

The positive electric charge flowing from the capacitor C1 in this way causes the voltage at the node "a" to have the value that is proportional to the integral of the amount of incident light. Then, when the pulse signal φV is fed to the MOS transistor T4 to turn it on, a current having the value obtained by converting the integral of the photoelectric current linearly flows through the MOS transistors T7 and T4 to the output signal line 6. In this way, a signal (output current) proportional to the integral of the amount of incident light is read, and thereafter the MOS transistor T4 is turned off.

(2-b) Resetting

Figure 38:
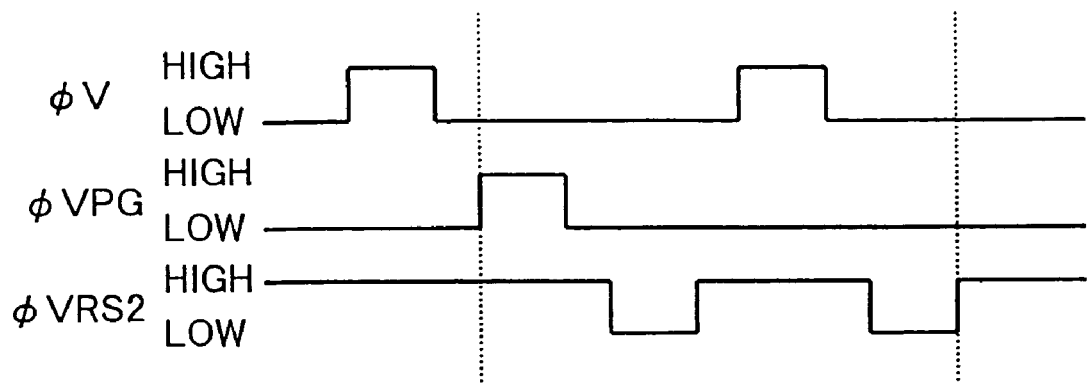
FIG. 38 is a timing chart of the signals fed to each pixel in the twelfth embodiment.

FIG. 38 shows a timing chart of the relevant signals as observed when each pixel is reset. As described above, by feeding the pulse signal φV to the gate of the MOS transistor T4, an output signal is read. Thereafter, first, the signal φVPG is turned to a high level to turn on the MOS transistor T2. When the MOS transistor T2 is turned on in this way, the third voltage is fed to the gate of the MOS transistor T53, and thereby the gate voltage of the MOS transistor T53 is reset. Then, the signal φVPG is turned back to a low level to turn off the MOS transistor T2.

Next, the pulse signal φVRS2 is fed to the gate of the MOS transistor T58 to reset the voltage at the node "a", and then the pulse signal φV is fed to the gate of the MOS transistor T4 to read an output signal. The output signal thus read has a value corresponding to the gate voltage of the MOS transistor T53, and is thus read as an output signal obtained during initialization. After this output signal has been read, the pulse signal φVRS2 is fed again to the gate of the MOS transistor T58 to reset the voltage at the node "a", and then image sensing as described previously is restarted. Here, the pulse signal φVRS2 is a low-level pulse signal.

The signal thus obtained during initialization is stored as compensation data in a memory such as a line memory so that, for each pixel, the output signal obtained therefrom in actual image sensing is compensated on the basis of this compensation data. This makes it possible to remove, from the output signal, components resulting from variations among the pixels. This compensation may be realized by providing memories, such as line memories, within the pixels. Here, the circuit may be so configured that, as in the sixth embodiment (FIG. 17), a pulse signal (for example, φVPS) is fed to the drain of the MOS transistor T53 to permit this MOS transistor T53 to reset the voltage at the node "a" in response to that signal φVPS. This makes it possible to omit the MOS transistor T58 from the pixel configured as shown in FIG. 36. In that case, the pulse signal φVPS fed to the drain of the MOS transistor T53 needs to be fed by way of a power line separate from that by way of which the direct-current voltage VPS is applied to the anode of the photodiode PD.

Thirteenth Embodiment

Figure 39:
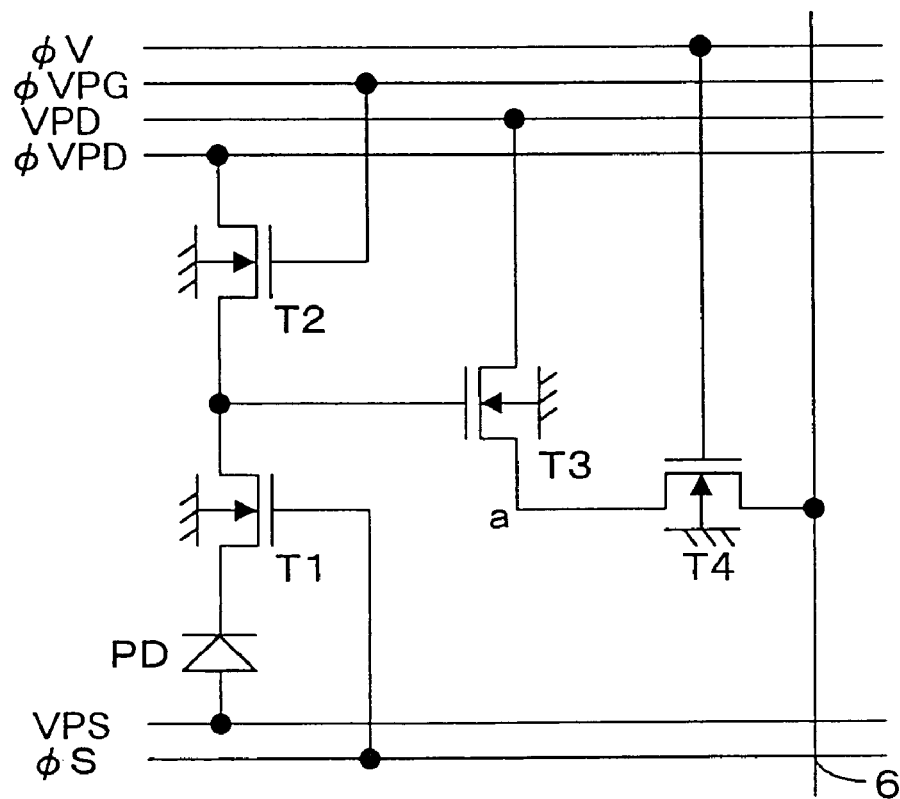
FIG. 39 is a circuit diagram showing the configuration of each pixel in a thirteenth embodiment of the invention.

Next, a thirteenth embodiment of the invention will be described with reference to the drawings. FIG. 39 is a circuit diagram showing the configuration of each pixel of the solid-state image-sensing device of this embodiment. It is to be noted that such elements, signal lines, and others as are used for the same purposes here as in the pixel shown in FIG. 33 are identified with the same reference symbols, and their detailed descriptions will be omitted.

As shown in FIG. 39, in this embodiment, the direct-current voltage VPD is applied to the drain of the MOS transistor T3, and the capacitor C1 and the MOS transistors T7 and T8 are omitted. In other respects, the pixel of this embodiment is configured in the same manner as in the eleventh embodiment (FIG. 33).

(1) Mode in Which the Output Signal is Produced by Converting the Photoelectric Current Natural-Logarithmically Here, as in the eleventh embodiment, a first voltage is used to permit the MOS transistor T2 to operate in a subthreshold region, and a second voltage that is approximately equal to the direct-current voltage VPS is used to permit pixel-to-pixel variations in the threshold level of the MOS transistor T2 to be detected.

(1-a) Image Sensing

A signal φVPD is made equal to the first voltage to permit the MOS transistor T2 to operate in a subthreshold region, and a signal φS fed to the gate of the MOS transistor T1 is turned to a high level to turn on this MOS transistor T1. In this state, when light enters the photodiode PD, a photoelectric current is generated therein, and thus, due to the subthreshold characteristics of a MOS transistor, a voltage having the value obtained by converting the photoelectric current natural-logarithmically appears at the source of the MOS transistor T2 and at the gate of the MOS transistor T3. Here, since a negative photoelectric charge is generated in the photodiode PD and flows into the MOS transistor T2 via the source thereof, the more intense the incident light, the lower the source voltage of the MOS transistor T2 becomes.

When a voltage obtained by converting the photoelectric current natural-logarithmically appears at the gate of the MOS transistor T3 in this way, the pulse signal φV is fed to the MOS transistor T4 to turn it on, so that a current having the value obtained by converting the photoelectric current natural-logarithmically flows through the MOS transistors T3 and T4 to the output signal line 6. In this way, a signal (output current) proportional to the logarithm of the amount of incident light is read, and thereafter the MOS transistor T4 is turned off.

(1-b) Sensitivity Variation Detection

Figure 40:
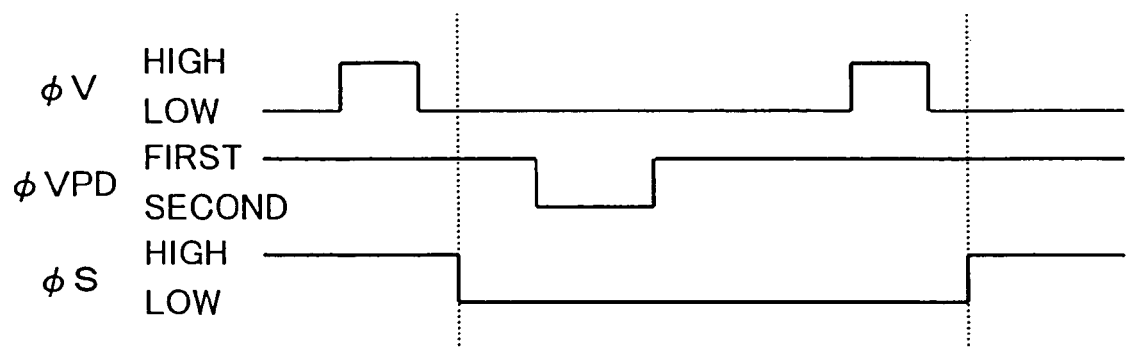
FIG. 40 is a timing chart of the signals fed to each pixel in the thirteenth embodiment.

FIG. 40 shows a timing chart of the relevant signals as observed when variations in sensitivity among the individual pixels are detected. As described above, by feeding the pulse signal φV to the gate of the MOS transistor T4, an output signal is read. Thereafter, as in the eleventh embodiment (FIG. 34), first, the signal φS is turned to a low level to turn off the MOS transistor T1. Then, the signal φVPD is made equal to the second voltage to accumulate a negative electric charge between the drain and the source of the MOS transistor T2.

Next, when the signal φVPD is turned back to the first voltage, part of the accumulated negative electric charge flows into the signal line of the signal φVPD, and the rest of the negative electric charge remains at the source of the MOS transistor T2. Here, the amount of negative electric charge that remains depends on the threshold voltage between the gate and the source. After the negative electric charge has been accumulated at the source of the MOS transistor T2 in this way, the pulse signal φV is fed to the gate of the MOS transistor T4 to read an output signal.

The output signal thus read has a value corresponding to the threshold voltage of the MOS transistor T2, and therefore, on the basis of this signal, it is possible to detect variations in sensitivity among the individual pixels. Lastly, in preparation for image sensing, the signal φS is turned to a high level to turn on the MOS transistor T1. The signal thus obtained as a result of sensitivity variation detection is stored as compensation data in a memory such as a line memory so that, for each pixel, the output signal obtained therefrom in actual image sensing is compensated on the basis of this compensation data. This makes it possible to remove, from the output signal, components resulting from variations among the pixels. This compensation may be realized by providing memories, such as line memories, within the pixels.

(2) Mode in Which the Output Signal is Produced by Converting the Photoelectric Current Linearly In this mode, as in the eleventh embodiment, the voltage of the signal φVPD is kept at a third voltage that is equal to the operation point of the MOS transistor T3. Moreover, in this mode, the signal φS is kept at a high level all the time, and thus the MOS transistor T1, which receives the signal φS at its gate, is kept on all the time. As a result, in this circuit configuration, the MOS transistor T2 corresponds to the resetting MOS transistor T102 shown in FIG. 96, and the MOS transistor T3 corresponds to the signal-amplification MOS transistor T101 shown in FIG. 96.

(2-a) Image Sensing

First, as in the eleventh embodiment, a signal φVPG is turned to a low level to turn off the resetting MOS transistor T2. In this state, in which the resetting MOS transistor T2 is off, when a photoelectric current is generated in the photodiode PD, the gate voltage of the MOS transistor T3 changes. Specifically, a negative photoelectric charge is fed from the photodiode PD to the gate of the MOS transistor T3, and thus the gate voltage of the MOS transistor T3 has the value obtained by converting the photoelectric current linearly. Here, since the negative photoelectric charge generated in the photodiode PD flows into the MOS transistor T3 via the gate thereof, the more intense the incident light, the lower the gate voltage of the MOS transistor T3 becomes.

When a voltage obtained by converting the photoelectric current linearly appears at the gate of the MOS transistor T3 in this way, the pulse signal φV is fed to the MOS transistor T4 to turn it on. As a result, a current having the value obtained by converting the integral of the photoelectric current linearly flows through the MOS transistors T3 and T4 to the output signal line 6. In this way, a signal (output current) proportional to the integral of the amount of incident light is read, and thereafter the MOS transistor T4 is turned off.

(2-b) Resetting

Figure 41:
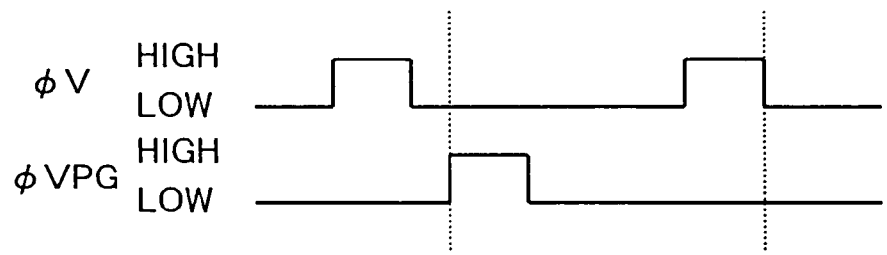
FIG. 41 is a timing chart of the signals fed to each pixel in the thirteenth embodiment.

FIG. 41 shows a timing chart of the relevant signals as observed when each pixel is reset. As described above, by feeding the pulse signal φV to the gate of the MOS transistor T4, an output signal is read. Thereafter, first, the signal φVPG is turned to a high level to turn on the MOS transistor T2. When the MOS transistor T2 is turned on in this way, the third voltage is fed to the gate of the MOS transistor T3, and thereby the gate voltage of the MOS transistor T3 is reset. Then, the signal φVPG is turned back to a low level to turn off the MOS transistor T2.

Next, the pulse signal φV is fed to the gate of the MOS transistor T4 to read an output signal. The output signal thus read has a value corresponding to the gate voltage of the MOS transistor T3, and is thus read as an output signal obtained during initialization. After this output signal has been read, image sensing as described previously is restarted. The signal thus obtained during initialization is stored as compensation data in a memory such as a line memory so that, for each pixel, the output signal obtained therefrom in actual image sensing is compensated on the basis of this compensation data. This makes it possible to remove, from the output signal, components resulting from variations among the pixels. A practical example of how this compensation is achieved is shown in FIG. 95 and will be described later. This compensation may be realized by providing memories, such as line memories, within the pixels.

Third Example of the Pixel Configuration

Figure 42:
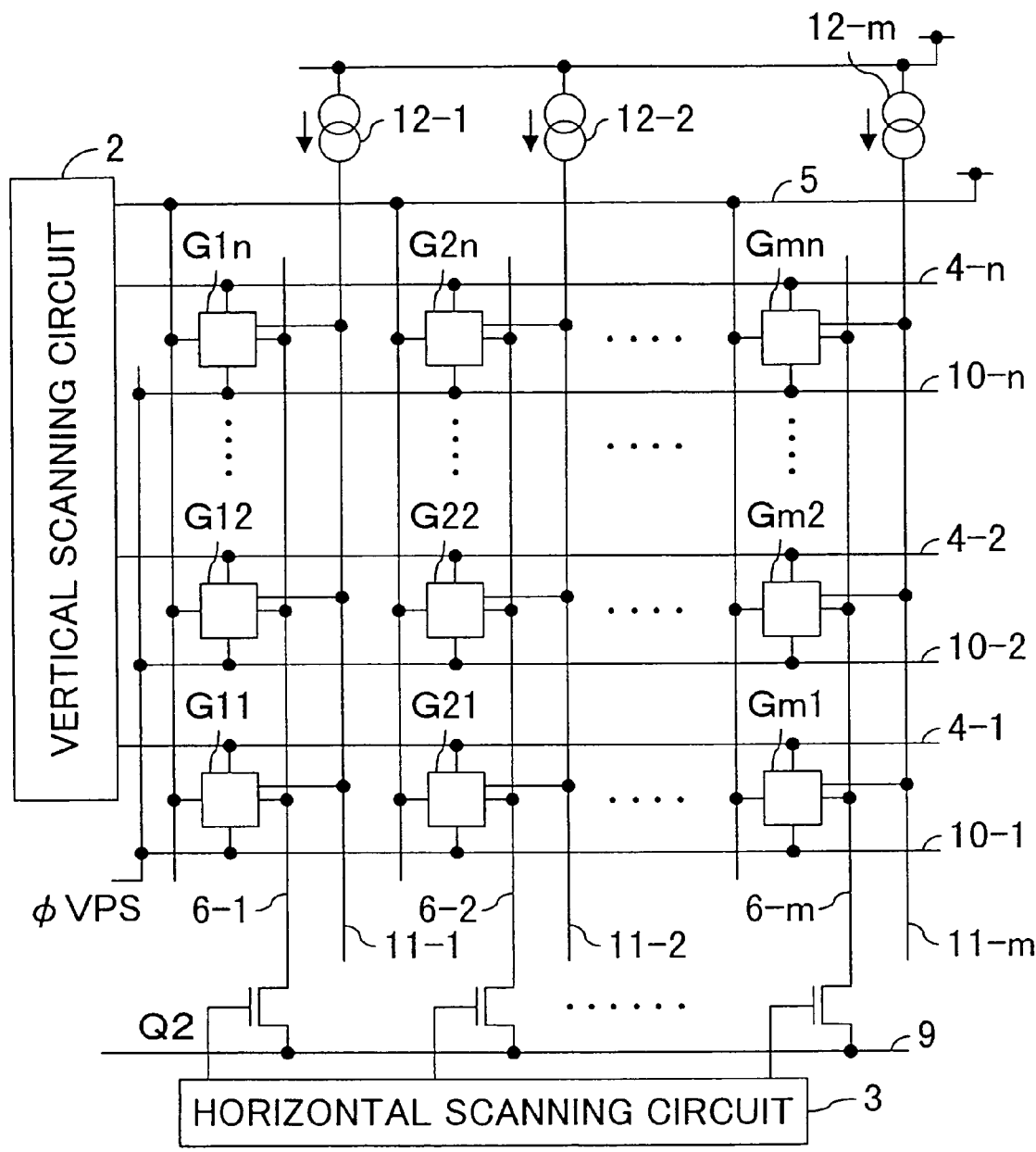
FIG. 42 is a block circuit diagram illustrating the overall configuration of another two-dimensional solid-state image-sensing device embodying the invention.

FIG. 42 schematically shows the configuration of part of a two-dimensional MOS-type solid-state image-sensing device embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. Reference numerals 12-1, 12-2, . . . , 12-m represent constant-current sources that are provided one for each column so as to feed currents by way of current-feed lines 11-1, 11-2, . . . , 11-m to the pixels G11 to Gm1, G21 to G2n, . . . , Gm1 to Gmn, respectively. Reference numerals 10-1, 10-2, . . . , 10-n represent lines that are provided one for each row and connected to the pixels G11 to Gm1, G12 to Gm2, . . . , G1n to Gmn, respectively, so as to feed a signal φVPS thereto. The individual pixels are connected not only to the lines 4-1, 4-2, . . . , 4-n, to the lines 10-1, 10-2, . . . , 10-n, to the output signal lines 6-1, 6-2, . . . , 6-m, to the current-feed lines 11-1, 11-2, . . . , 11-m, and to the power line 5 mentioned above, but also to other lines (for example clock lines and bias supply lines). These other lines, however, are omitted in FIG. 42.

As shown in FIG. 42, for each of the output signal lines 6-1, 6-2, . . . , 6-m, one N-channel MOS transistor Q2 is provided. Here, a description will be given only with respect to the output signal line 6-1 as their representative. The MOS transistor Q2 has its drain connected to the output signal line 6-1, has its source connected to a signal line 9 serving as a final destination line, and has its gate connected to the horizontal scanning circuit 3. As will be described later, within each pixel, another N-channel MOS transistor (a fourth MOS transistor) T4 functioning as a switch is provided. Whereas this MOS transistor T4 serves to select a row, the MOS transistor Q2 serves to select a column.

Fourteenth Embodiment

Figure 43:
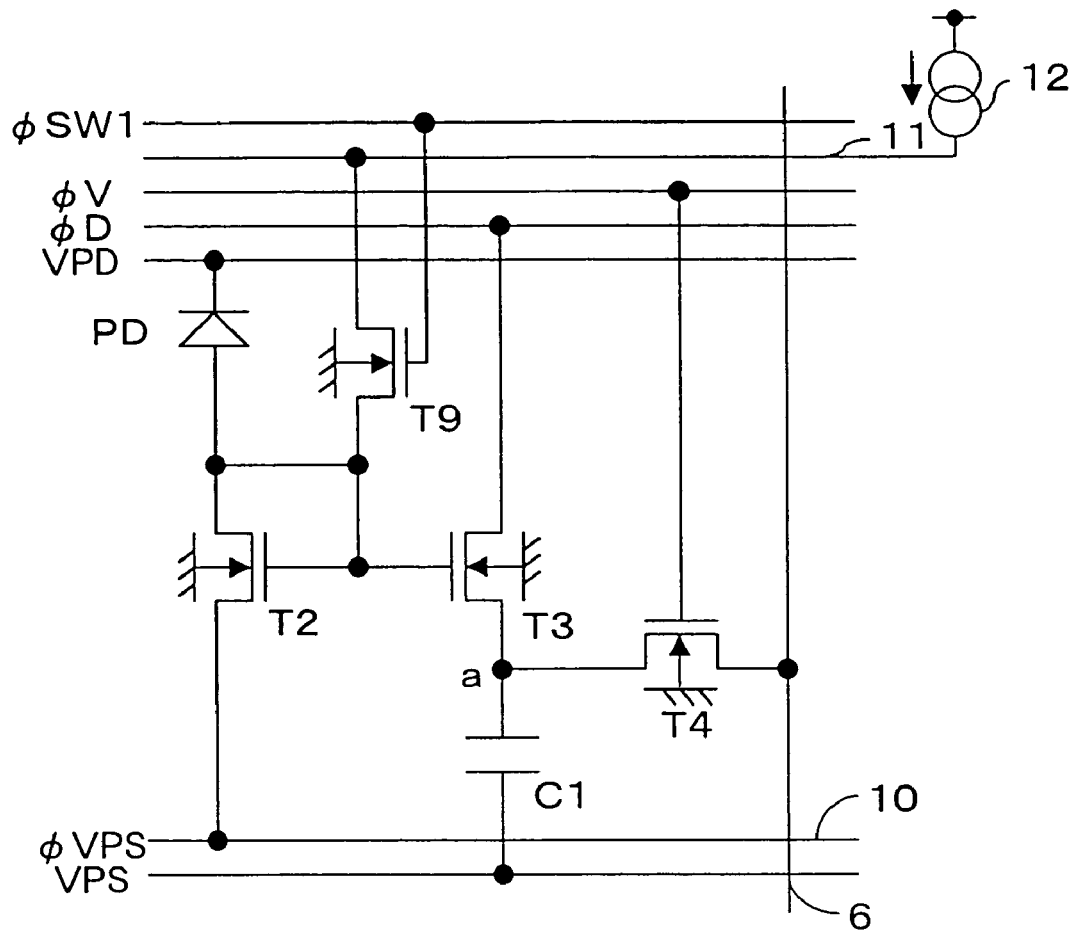
FIG. 43 is a circuit diagram showing the configuration of each pixel in a fourteenth embodiment of the invention.

Now, a fourteenth embodiment of the invention, which is applicable to each pixel of the third example of the pixel configuration shown in FIG. 42, will be described with reference to the drawings. FIG. 43 is a circuit diagram showing the configuration of each pixel of the solid-state image-sensing device of this embodiment. It is to be noted that such elements, signal lines, and others as are used for the same purposes here as in the pixel shown in FIG. 10 are identified with the same reference symbols, and their detailed descriptions will be omitted.

As shown in FIG. 43, according to the circuit configuration of this embodiment, as compared with the pixel of the fourth embodiment (FIG. 10), the MOS transistor T1 is omitted, and a MOS transistor T9 is added that has its source connected to the gate and drain of the MOS transistor T2. Moreover, the signal φVPS is fed to the source of the MOS transistor T2 by way of a line 10 (this line 10 corresponds to the lines 10-1, 10-2, . . . , 10-n shown in FIG. 42). Furthermore, the MOS transistor T9 has its drain connected by way of a current-feed line 11 (this current-feed line 11 corresponds to the current-feed lines 11-1, 11-2, . . . , 11-m shown in FIG. 42) to a constant-current source 12 (this constant-current source 12 corresponds to the constant-current sources 12-1, 12-2, . . . , 12-m shown in FIG. 42), and receives a signal φSW1 at its gate.

In this embodiment, the signal φVPS is a binary signal that takes one of two predetermined levels at a time. Here, one of those predetermined levels is a voltage (referred to as the "first voltage") that is close to the direct-current voltage VPS and that permits the MOS transistor T2 to operate in a subthreshold region, and the other (referred to as the "second voltage") is a voltage that permits a current to be fed from the constant-current source 12 to the MOS transistor T2.

(1) How to Convert the Light Incident on the Individual Pixels into an Electric Signal First, the signal φSW1 is turned to a low level to turn off the transistor T9 so that no current is fed from the constant-current source 12 to the MOS transistor T2. In addition, the signal φVPS is turned to the first voltage so that the MOS transistor T2 operates in a subthreshold region. In this state, when light enters the photodiode PD, a photoelectric current is generated therein, and, due to the subthreshold characteristics of MOS transistors, a voltage having the value obtained by converting the photoelectric current natural-logarithmically appears at the gates of the MOS transistors T2 and T3. This voltage causes a current to flow through the MOS transistor T3, and, as a result, an electric charge that is equivalent to the value obtained by converting the integral of the photoelectric current natural-logarithmically is accumulated in the capacitor C1. That is, a voltage proportional to the value obtained by converting the integral of the photoelectric current natural-logarithmically appears at the node "a" between the capacitor C1 and the source of the MOS transistor T3. Here, the MOS transistor T4 remains off.

Next, the pulse signal φV is fed to the gate of the MOS transistor T4 to turn on this MOS transistor T4. This causes the electric charge accumulated in the capacitor C1 to be fed as the output current to the output signal line 6. This current thus fed to the output signal line 6 has the value obtained by converting the integral of the photoelectric current natural-logarithmically. In this way, it is possible to read a signal (output current) that is proportional to the logarithm of the amount of incident light. After this signal has been read, the MOS transistor T4 is turned off.

(2) How to Reset the Individual Pixels

Figure 44:
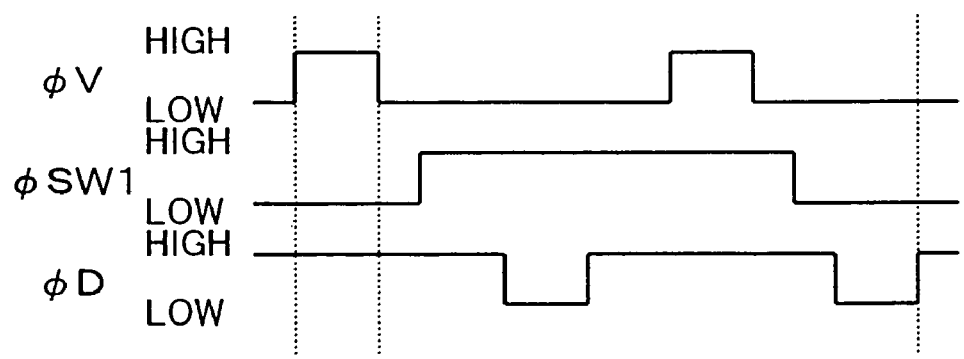
FIG. 44 is a timing chart of the signals fed to each pixel in the fourteenth embodiment.

Now, how resetting is achieved in the pixel having the circuit configuration shown in FIG. 43 will be described with reference to the drawings. FIG. 44 is a timing chart of the signals fed to the signal lines connected to the individual circuit elements constituting each pixel during resetting.

After the output signal has been output as a result of the pulse signal φV being fed to the gate of the MOS transistor T4 as described under (1) above, first, the signal φSW1 is turned to a high level to turn on the MOS transistor T9, and in addition the signal φVPS is turned to the second voltage. This causes a current to flow from the constant-current source 12 to the MOS transistor T2. Here, the current flowing out of the constant-current source 12 is sufficiently high relative to the photoelectric current output from the photodiode PD, and therefore the drain current of the MOS transistor T2 is approximately equal to the current fed from the constant-current source 12. At this time, the voltage of the signal φD is at a high level (a potential equal to or close to the direct-current voltage VPD). Thereafter, the signal φD is turned to a low level so that the electric charge accumulated in the capacitor C1 is discharged therefrom through the MOS transistor T3 to the signal line of the signal φD and thereby the potential at the capacitor C1, and thus at the node "a", is initialized. Then, the signal φD is turned back to a high level.

While the signal φSW1 is kept at a high level and the signal φVPS is kept at the second voltage in this way, a constant current flows from the constant-current source 12 through the MOS transistor T9 to the MOS transistor T2. Thus, the source-gate voltage of the MOS transistor T2 is determined by the drain current of the MOS transistor T2, and is thereby initialized. After the gate voltage of the MOS transistor T2 has been reset to its initial level in this way, the pulse signal φV is fed to the gate of the MOS transistor T4 so that the signal (output current) obtained on resetting is fed to the output signal line 6.

After the signal obtained on resetting has been read in this way, the signal φSW1 is turned to a low level to turn off the MOS transistor T9, and in addition the signal φVPS is turned to the first voltage. Thereafter, the signal φD is turned to a low level so that the electric charge accumulated in the capacitor C1 is discharged therefrom through the MOS transistor T3 to the signal line of the signal φD and thereby the potential at the capacitor C1, and thus at the node "a", is initialized. Then, the signal φD is turned back to a high level to make the pixel ready for the next round of image sensing.

The individual MOS transistors of each pixel are made to operate as described above so that the signal obtained on resetting the gate voltage of the MOS transistor T2 is fed to the output signal line 6. In this way, the signal obtained on resetting is output serially, from one pixel after another, to the succeeding circuit so as to be stored as pixel-by-pixel compensation data in a memory provided therein. Then, by correcting pixel by pixel the output signal obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

Figure 45:
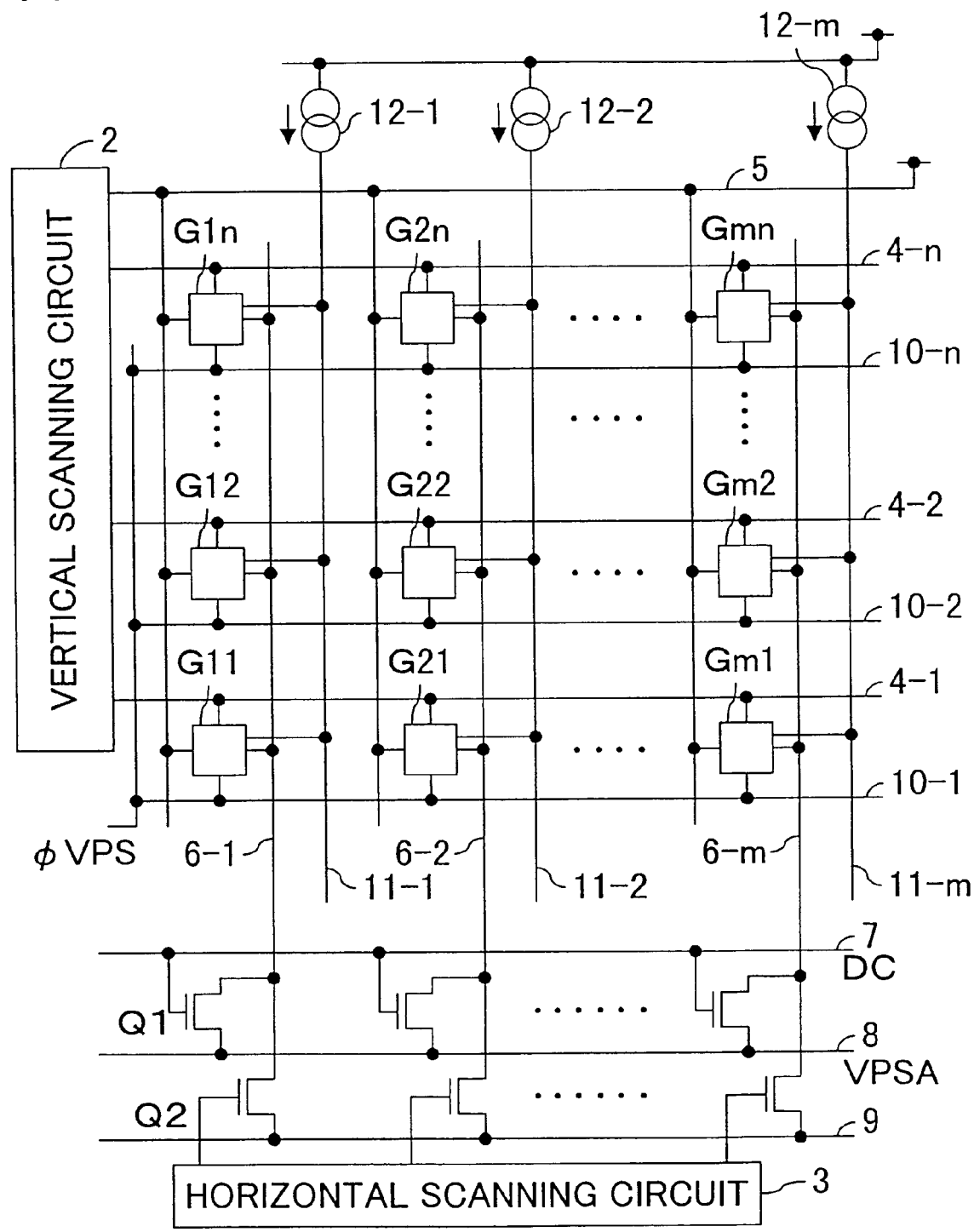
FIG. 45 is a block circuit diagram illustrating the overall configuration of another two-dimensional solid-state image-sensing device embodying the invention.

In this embodiment, to ensure correct reading of the output signal by the succeeding stage, the potential of the signal (φVPS) fed to the source of the MOS transistor T2 is changed between during reset periods and during logarithmic conversion periods. However, the signal φVPS may be given a fixed level as long as the design of the succeeding stage is optimized so that the potential at the node "a" remains within a predetermined voltage range throughout reset and logarithmic conversion periods. This applies also to the fifteenth to eighteenth embodiments described hereafter Fourth Example of the Pixel Configuration FIG. 45 schematically shows the configuration of part of another two-dimensional MOS-type solid-state image-sensing device embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. Reference numerals 12-1, 12-2, . . . , 12-m represent constant-current sources that are provided one for each column so as to feed currents by way of current-feed lines 11-1, 11-2, . . . , 11-m to the pixels G11 to G1n, G21 to G2n, . . . , Gm1 to Gmn, respectively. Reference numerals 10-1, 10-2, . . . , 10-n represent lines that are provided one for each row and connected to the pixels G11 to Gm1, G12 to Gm2, . . . , G1n to Gmn, respectively, so as to feed a signal φVPS thereto. The individual pixels are connected not only to the lines 4-1, 4-2, . . . , 4-n, to the lines 10-1, 10-2, . . . , 10-n, to the output signal lines 6-1, 6-2; . . . , 6-m, to the current-feed lines 11-1, 11-2, . . . , 11-m, and to the power line 5 mentioned above, but also to other lines (for example clock lines and bias supply lines). These other lines, however, are omitted in FIG. 45.

As shown in FIG. 45, for each of the output signal lines 6-1, 6-2, . . . , 6-m, a pair of N-channel MOS transistors Q1 and Q2 is provided. Here, a description will be given only with respect to the output signal line 6-1 as their representative. The MOS transistor Q1 has its gate connected to a direct-current voltage line 7, has its drain connected to the output signal line 6-1, and has its source connected to a direct-current voltage VPSA line 8. On the other hand, the MOS transistor Q2 has its drain connected to the output signal line 6-1, has its source connected to a signal line 9 serving as a final destination line, and has its gate connected to the horizontal scanning circuit 3. These MOS transistors Q1 and Q2 are used for the same purposes as the MOS transistors Q1 and Q2 in the second example of the pixel configuration.

Fifteenth Embodiment

Figure 46:
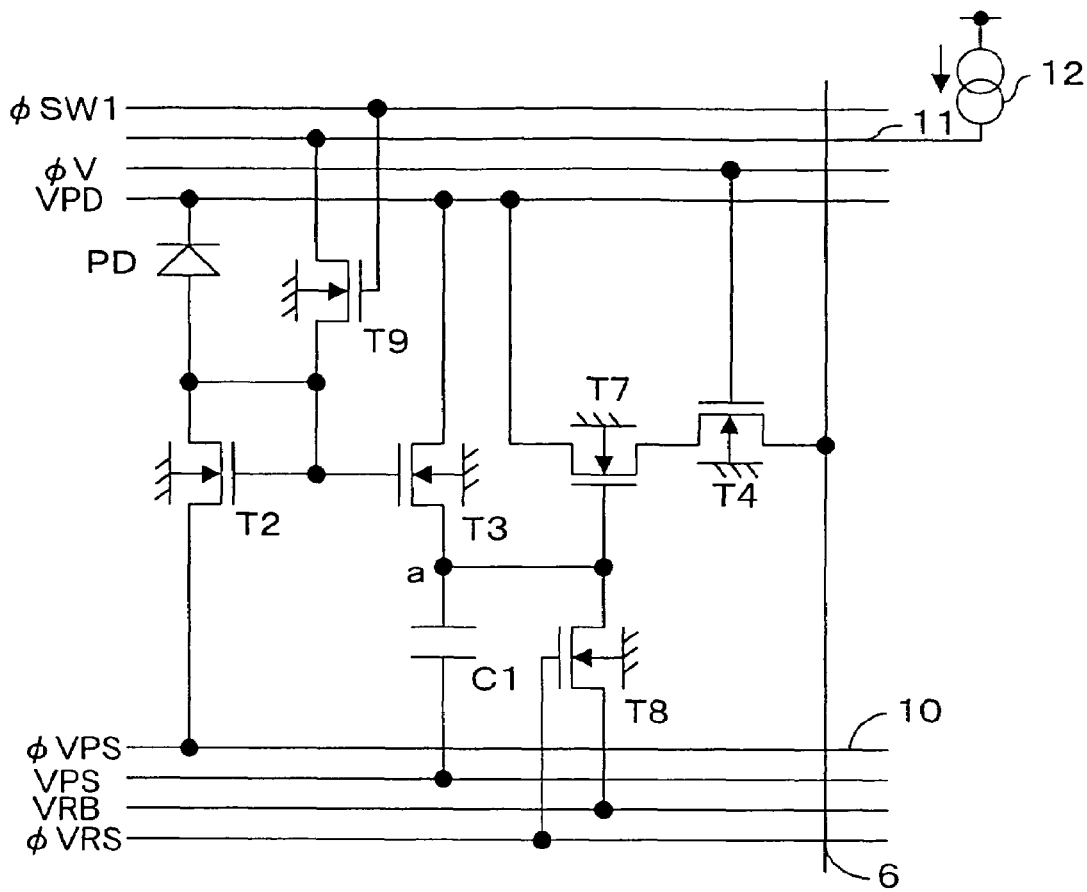
FIG. 46 is a circuit diagram showing the configuration of each pixel in a fifteenth embodiment of the invention.

Next, a fifteenth embodiment of the invention, which is applicable to each pixel of the fourth example of the pixel configuration shown in FIG. 45, will be described with reference to the drawings. FIG. 46 is a circuit diagram showing the configuration of each pixel of the solid-state image-sensing device of this embodiment. It is to be noted that such elements, signal lines, and others as are used for the same purposes here as in the pixels shown in FIGS. 15 and 43 are identified with the same reference symbols, and their detailed descriptions will be omitted.

As shown in FIG. 46, in this embodiment, as compared with the pixel shown in FIG. 43, there are provided additionally a MOS transistor T7 having its gate connected to the node "a" for performing current amplification in accordance with the voltage at the node "a", a MOS transistor T4 having its drain connected to the source of the MOS transistor T7 for row selection, a capacitor C1 having one end connected to the node "a", and an eighth MOS transistor T8 having its drain connected to the node "a" for initializing the potential at the capacitor C1, and thus at the node "a". That is, the circuit configuration of this embodiment is to that of the fourteenth embodiment what the circuit configuration of the fifth embodiment (FIG. 15) is to that of the first embodiment (FIG. 3). Now, the operation of this pixel configured as described above will be described.

(1) How to Convert the Light Incident on the Individual Pixels into an Electric Signal First, a description will be given of the operation performed when the signal φSW1 is turned to a low level to turn off the MOS transistor T9 and the signal φVPS is turned to the first voltage so that the MOS transistors T2 and T3 are so biased as to operate in a subthreshold region. At this time, the MOS transistor T9 is off, and therefore, as in the fourteenth embodiment, no current flows from the constant-current source 12 to the MOS transistor T2.

In this state, when light enters the photodiode PD, a photoelectric current is generated therein, and, due to the subthreshold characteristics of MOS transistors, a voltage having the value obtained by converting the photoelectric current natural-logarithmically appears at the gates of the MOS transistors T2 and T3. This voltage causes a current to flow through the MOS transistor T3, and, as a result, an electric charge that is equivalent to the value obtained by converting the integral of the photoelectric current natural-logarithmically is accumulated in the capacitor C1. That is, a voltage proportional to the value obtained by converting the integral of the photoelectric current natural-logarithmically appears at the node "a" between the capacitor C1 and the source of the MOS transistor T3. Here, the MOS transistors T4 and T8 remain off.

Next, the pulse signal φV is fed to the gate of the MOS transistor T4 to turn on this MOS transistor T4. This causes a current proportional to the voltage applied to the gate of the MOS transistor T7 to be fed through the MOS transistors T4 and T7 to the output signal line 6. Here, since the voltage applied to the gate of the MOS transistor T4 is equal to the voltage at the node "a", the current fed to the output signal line 6 has the value obtained by converting the integral of the photoelectric current natural-logarithmically. In this way, it is possible to read a signal (output current) that is proportional to the logarithm of the amount of incident light.

(2) How to Reset the Individual Pixels

Figure 47:
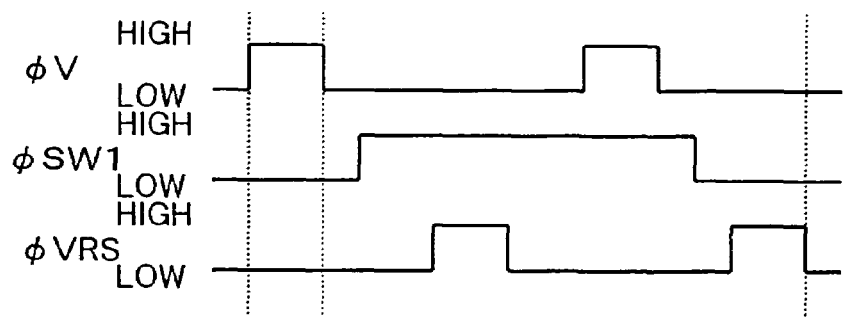
FIG. 47 is a timing chart of the signals fed to each pixel in the fifteenth embodiment.

Now, how resetting is achieved in the pixel having the circuit configuration shown in FIG. 46 will be described with reference to the drawings. FIG. 47 is a timing chart of the signals fed to the signal lines connected to the individual circuit elements constituting each pixel during resetting.

After the output signal has been output as a result of the pulse signal φV being fed to the gate of the MOS transistor T4 as described under (1) above, first, the signal φSW1 is turned to a high level to turn on the MOS transistor T9, and in addition the signal φVPS is turned to the second voltage. This causes a current to flow from the constant-current source 12 to the MOS transistor T2. At this time, a constant current flows from the constant-current source 12 through the MOS transistor T9 to the MOS transistor T2. Thus, the source-gate voltage of the MOS transistor T2 is determined by the drain current of the MOS transistor T2, and is thereby reset to its initial level.

While the gate voltage of the MOS transistor T2 is being reset to its initial level in this way, the pulse signal φVRS is fed to the gate of the MOS transistor T8 to turn on the MOS transistor T8. This causes the electric charge accumulated in the capacitor C1 to be discharged therefrom through the MOS transistor T8, and thereby causes the capacitor C1, and thus the node "a", to be reset. Subsequently, the pulse signal φV is fed to the gate of the MOS transistor T4 so that the signal obtained on resetting the MOS transistor T2 is output to the output signal line 6. Then, the signal φSW1 is turned to a low level to turn off the MOS transistor T9, and in addition the signal φVPS is turned to the first voltage. Thereafter, the pulse signal φVRS is fed so that the potential at the capacitor C1, and thus at the node "a", is initialized. Then, the signal φVRS is turned back to a low level to make the pixel ready for the next round of image sensing.

As in the fourteenth embodiment, the signal output to the output signal line 6 on resetting the MOS transistor T2 as described above is stored as pixel-by-pixel compensation data. Then, by correcting pixel by pixel the output signal obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

Sixteenth Embodiment

Figure 48:
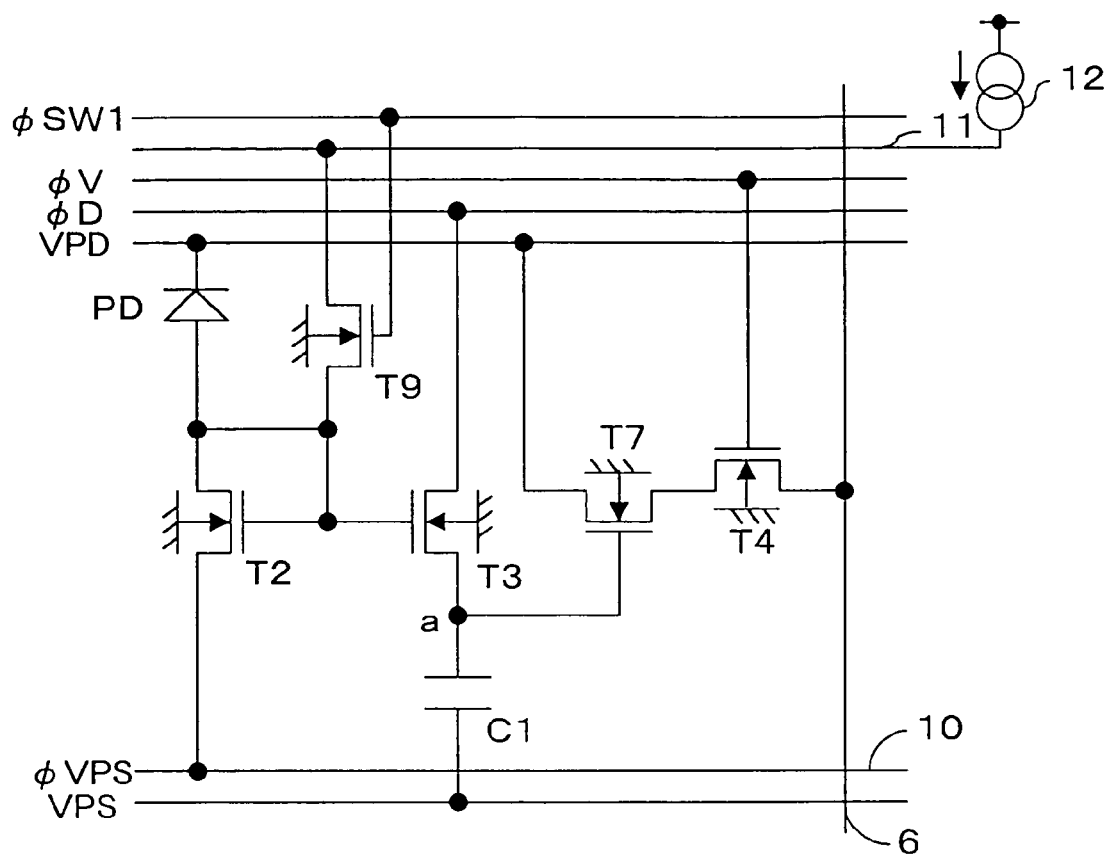
FIG. 48 is a circuit diagram showing the configuration of each pixel in a sixteenth embodiment of the invention.

Next, a sixteenth embodiment of the invention will be described with reference to the drawings. FIG. 48 is a circuit diagram showing the configuration of each pixel of the solid-state image-sensing device of this embodiment. It is to be noted that such elements, signal lines, and others as are used for the same purposes here as in the pixels shown in FIGS. 17 and 46 are identified with the same reference symbols, and their detailed descriptions will be omitted.

As shown in FIG. 48, in this embodiment, the initialization of the potential at the capacitor C1, and thus at the node "a", is achieved by feeding the signal φD to the drain of the MOS transistor T3, and thus the MOS transistor T8 is omitted. In other respects, each pixel of this embodiment is configured in the same manner as in the fifteenth embodiment (FIG. 46). That is, the circuit configuration of this embodiment is to that of the fifteenth embodiment what the circuit configuration of the sixth embodiment (FIG. 17) is to that of the fifth embodiment (FIG. 15). Now, the operation of this pixel configured as described above will be described.

In this embodiment, image sensing is achieved in the following manner. As in the fifteenth embodiment, first, the MOS transistor T9 is turned off so that no current flows from the constant-current source 12 to the MOS transistor T2, and the signal φVPS is turned to the first voltage so that the MOS transistor T2 operates in a subthreshold region. In addition, the signal φD is turned to a high level so that an electric charge equivalent to the value obtained by natural-logarithmically converting the integral of the photoelectric current is accumulated in the capacitor C1. Then, with predetermined timing, the MOS transistor T4 is turned on so that a current proportional to the voltage applied to the gate of the MOS transistor T7 is fed through the MOS transistors T4 and T7 to the output signal line 6.

On the other hand, resetting of the pixel is achieved by controlling the signals with the timing shown in FIG. 44 as in the fourteenth embodiment. Specifically, after the feeding of the pulse signal φV, first, the signal φSW1 is turned to a high level and the signal φVPS is turned to the second voltage, and then resetting starts. Turning on the MOS transistor T9 in this way causes a constant current to flow from the constant-current source 12 to the MOS transistor T2, and thereby causes the gate voltage of the MOS transistor T2 to be reset to a predetermined initial level.

Meanwhile, the signal φD is turned to a low level to discharge the electric charge accumulated in the capacitor C1 therefrom through the MOS transistor T3 to the signal line of the signal φD and thereby initialize the potential at the capacitor C1, and thus at the node "a", and then the signal φD is turned back to a high level. Subsequently, the pulse signal φV is fed to the gate of the MOS transistor T4 so that the signal obtained on resetting the MOS transistor T2 is output to the output signal line 6. Then, the signal φSW1 is turned to a low level and the signal φVPS is turned to the first voltage. Thereafter, the signal φD is turned to a low level to discharge the electric charge accumulated in the capacitor C1 therefrom through the MOS transistor T3 to the signal line of the signal φD and thereby initialize the potential at the capacitor C1, and thus at the node "a". Then, the signal φD is turned back to a high level to make the pixel ready for the next round of image sensing.

As in the fourteenth embodiment, the signal output to the output signal line 6 on resetting the MOS transistor T2 as described above is stored as pixel-by-pixel compensation data. Then, by correcting pixel by pixel the output signal obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

Seventeenth Embodiment

Figure 49:
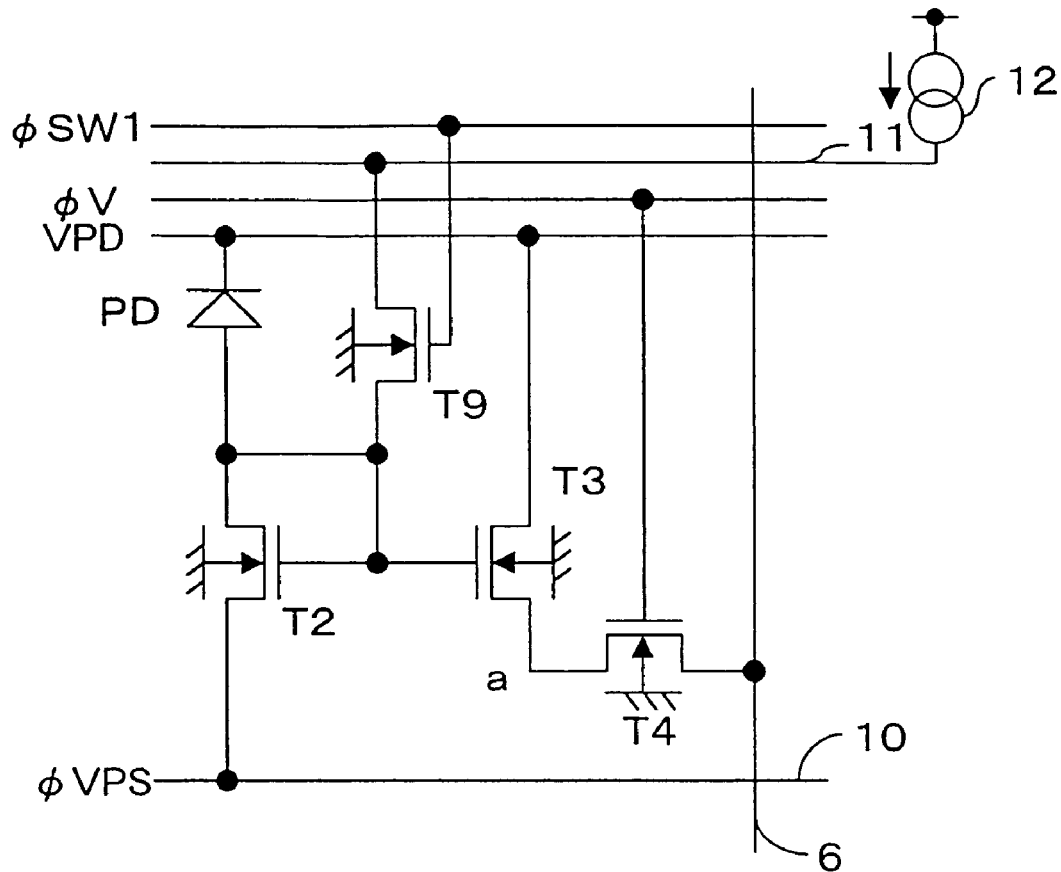
FIG. 49 is a circuit diagram showing the configuration of each pixel in a seventeenth embodiment of the invention.

Next, a seventeenth embodiment of the invention will be described with reference to the drawings. FIG. 49 is a circuit diagram showing the configuration of each pixel of the solid-state image-sensing device of this embodiment. It is to be noted that such elements, signal lines, and others as are used for the same purposes here as in the pixels shown in FIGS. 18 and 48 are identified with the same reference symbols, and their detailed descriptions will be omitted.

As shown in FIG. 49, in this embodiment, the direct-current voltage VPD is applied to the drain of the MOS transistor T3, and the capacitor C1 and the MOS transistor T7 are omitted. That is, the MOS transistor T3 has its source connected to the drain of the MOS transistor T4. In other respects, each pixel of this embodiment is configured in the same manner as in the sixteenth embodiment (FIG. 48). That is, the circuit configuration of this embodiment is to that of the sixteenth embodiment what the circuit configuration of the seventh embodiment (FIG. 18) is to that of the sixth embodiment (FIG. 17). Now, the operation of this pixel configured as described above will be described.

In this embodiment, image sensing is achieved in the following manner. As in the sixteenth embodiment, first, the MOS transistor T9 is turned off so that no current flows from the constant-current source 12 to the MOS transistor T2, and the signal φVPS is turned to the first voltage so that the MOS transistor T2 operates in a subthreshold region. Making the MOS transistor T2 operate in this way causes a current having the value natural-logarithmically proportional to the photoelectric current to flow through the MOS transistor T3 as its drain current.

Then, the pulse signal φV is fed to the gate of the MOS transistor T4 to turn on this MOS transistor T4. This causes a current having the value natural-logarithmically proportional to the photoelectric current to flow through the MOS transistor T4 as its drain current and then to the output signal line 6. At this time, the drain voltage of the MOS transistor Q1 (FIG. 45), which is determined by the on-state resistances of the MOS transistors T3 and Q1 and the current flowing therethrough, appears as the output signal on the output signal line 6. After this output signal has been read, the MOS transistor T4 is turned off.

Figure 50:
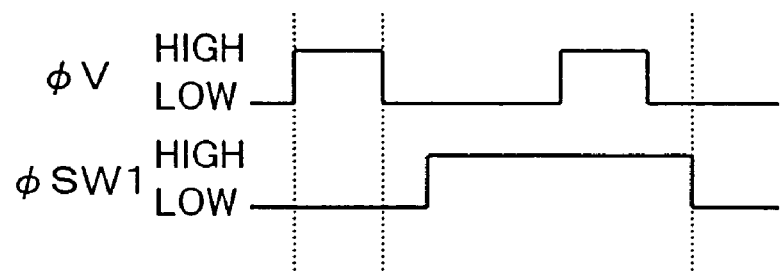
FIG. 50 is a timing chart of the signals fed to each pixel in the seventeenth embodiment.

On the other hand, resetting of the pixel is achieved by controlling the signals with the timing shown in FIG. 50. After the feeding of the pulse signal φV, first, the signal φSW1 is turned to a high level and the signal φVPS is turned to the second voltage, and then resetting starts. Turning on the MOS transistor T9 in this way causes a constant current to flow from the constant-current source 12 to the MOS transistor T2, and thereby causes the gate voltage of the MOS transistor T2 to be reset to a predetermined initial level. Subsequently, the pulse signal φV is fed to the gate of the MOS transistor T4 so that the signal obtained on resetting the MOS transistor T2 is output to the output signal line 6. Then, the signal φSW1 is turned to a low level to turn off the MOS transistor T9 and the signal φVPS is turned to the first voltage to make the pixel ready for the next round of image sensing.

As in the fourteenth embodiment, the signal output to the output signal line 6 on resetting the MOS transistor T2 as described above is stored as pixel-by-pixel compensation data. Then, by correcting pixel by pixel the output signal obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

Eighteenth Embodiment

Figure 51:
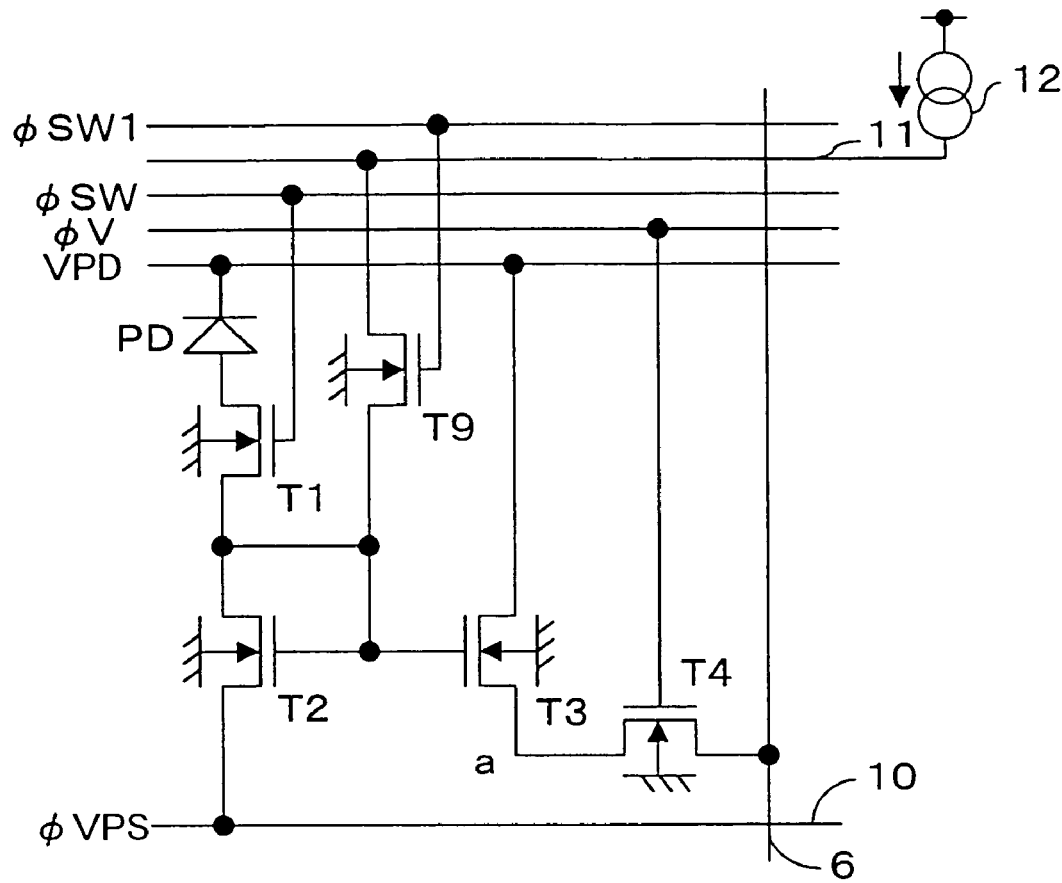
FIG. 51 is a circuit diagram showing the configuration of each pixel in an eighteenth embodiment of the invention.

Next, an eighteenth embodiment of the invention will be described with reference to the drawings. FIG. 51 is a circuit diagram showing the configuration of each pixel of the solid-state image-sensing device of this embodiment. It is to be noted that such elements, signal lines, and others as are used for the same purposes here as in the pixel shown in FIG. 49 are identified with the same reference symbols, and their detailed descriptions will be omitted.

As shown in FIG. 51, according to the circuit configuration of this embodiment, as compared with the pixel of the seventeenth embodiment (FIG. 49), there is additionally provided a MOS transistor T1 that is connected between the anode of the photodiode PD and the drain of the MOS transistor T2. Now, the operation of this pixel configured as described above will be described.

(1) How to Convert the Light Incident on the Individual Pixels into an Electric Signal As in the seventeenth embodiment, first, the signal φSW1 is turned to a low level and the signal φVPS is turned to the first voltage. In this state, the signal φSW is turned to a high level to turn on the MOS transistor T1 so that the photoelectric current is fed from the photodiode PD to the MOS transistor T2. At this time, the MOS transistor T9 is off, and therefore, as in the seventeenth embodiment, no current flows from the constant-current source 12 to the MOS transistor T2. In this way, the MOS transistor T2 is made to operate in a subthreshold region so that a current having the value natural-logarithmically proportional to the photoelectric current flows through the MOS transistor T3 as its drain current.

In this state, when the pulse signal φV is fed to the gate of the MOS transistor T4 to turn on this MOS transistor T4, a current having the value natural-logarithmically proportional to the photoelectric current flows through the MOS transistor T4 as its drain current to the output signal line 6. At this time, the drain voltage of the MOS transistor Q1 (FIG. 45), which is determined by the on-state resistances of the MOS transistors T3 and Q1 and the current flowing therethrough, appears as the output signal on the output signal line 6. After this output signal has been read, the MOS transistor T4 is turned off.

(2) How to Reset the Individual Pixels

Figure 52:
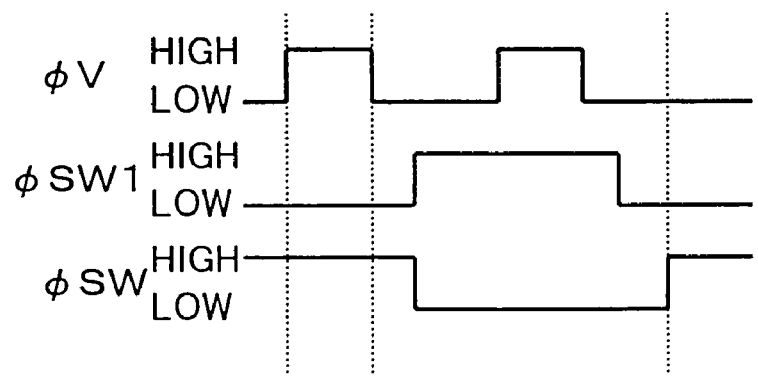
FIG. 52 is a timing chart of the signals fed to each pixel in the eighteenth embodiment.

Now, how resetting is achieved in the pixel having the circuit configuration shown in FIG. 51 will be described with reference to the drawings. FIG. 52 is a timing chart of the signals fed to the signal lines connected to the individual circuit elements constituting each pixel during resetting.

After the output signal has been output as a result of the pulse signal φV being fed to the gate of the MOS transistor T4 as described under (1) above, first, the signal φSW1 is turned to a high level to turn on the MOS transistor T9, and in addition the signal φSW is turned to a low level to turn off the MOS transistor T1. In this state, as in the seventeenth embodiment, the signal φVPS is turned to the second voltage. This causes a current to flow from the constant-current source 12 to the MOS transistor T2, and simultaneously prevents the photoelectric current from flowing from the photodiode PD to the MOS transistor T2. At this time, a constant current flows from the constant-current source 12 through the MOS transistor T9 to the MOS transistor T2. Thus, the source-gate voltage of the MOS transistor T2 is determined by the drain current of the MOS transistor T2, and is thereby reset to its initial level.

After the gate voltage of the MOS transistor T2 has been reset to its initial level in this way, the pulse signal φV is fed to the gate of the MOS transistor T4 so that the signal obtained on resetting the MOS transistor T2 is fed to the output signal line 6. Then, the signal φSW1 is turned to a low level to turn off the MOS transistor T9, and in addition the signal φVPS is turned to the first voltage. Then, the signal φSW is turned back to a high level to turn on the MOS transistor T1 and thereby make the pixel ready for the next round of image sensing.

As described above, during resetting, the photoelectric current does not flow from the photodiode PD to the MOS transistor T2. Thus, the drain current of the MOS transistor T2 is equal to the constant current fed from the constant-current source 12. Moreover, providing the MOS transistor T1 and keeping it off prevents the drain current of the MOS transistor T2 during resetting from being affected by the photoelectric current from the photodiode PD. This helps make the constant current fed from the constant-current source 12 lower than in the sixteenth embodiment.

As in the fourteenth embodiment, the signal output to the output signal line 6 on resetting the MOS transistor T2 as described above is stored as pixel-by-pixel compensation data. Then, by correcting pixel by pixel the output signal obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

In this embodiment, it is also possible, as in the fifteenth embodiment (FIG. 46), to connect the source of the MOS transistor T3 to a capacitor C1 that receives the direct-current voltage VPS at the other end, to the gate of a MOS transistor T7, and to the drain of a MOS transistor T8 for resetting the capacitor C1 and connect the source of the MOS transistor T7 to the drain of the MOS transistor T4. Alternatively, it is also possible, as in the sixteenth embodiment (FIG. 48), to feed the signal φD to the drain of the MOS transistor T3 and thereby omit the MOS transistor T8 as used in the fifteenth embodiment (FIG. 46) described above.

Figure 53:
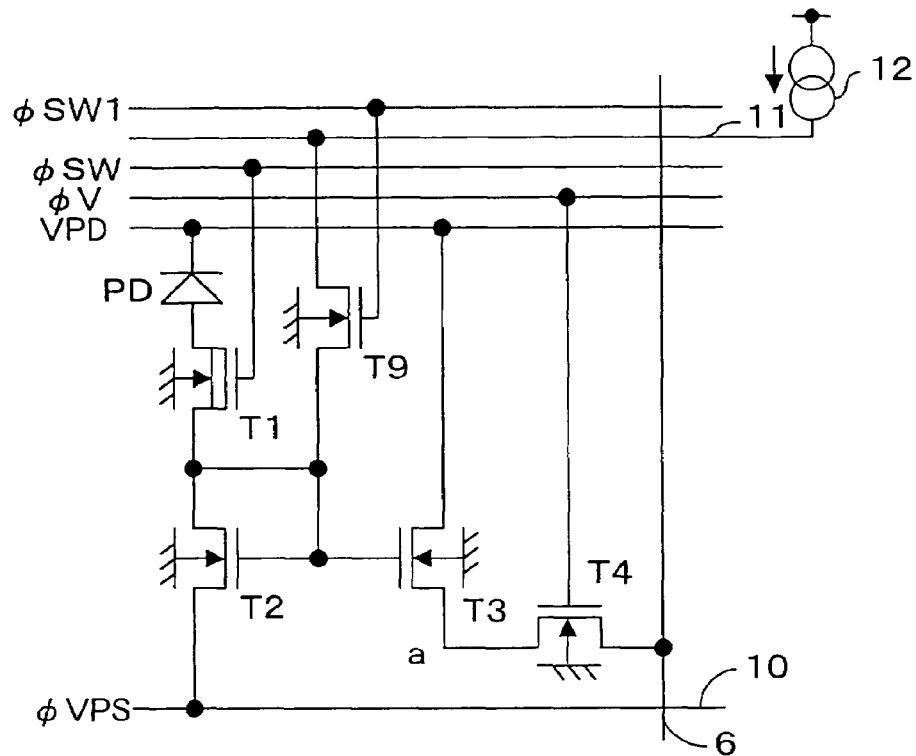
FIG. 53 is a circuit diagram showing an example of the configuration of each pixel in the eighteenth embodiment.

In this embodiment, the first MOS transistor T1 may be a depletion-mode N-channel MOS transistor. In that case, the pixel has a circuit configuration as shown in FIG. 53. As shown in FIG. 53, all the other transistors T2 to T4 and T9 than the MOS transistor T1 are enhancement-mode N-channel MOS transistors.

Where, as in the pixel configured as shown in FIG. 51, all the MOS transistors provided within a pixel are enhancement-mode MOS transistors, the MOS transistors T1 and T2 are connected in series, and therefore the high-level voltage of the signal φSW fed to the gate of the MOS transistor T1 is normally higher than the voltage supplied to the pixel. Accordingly, it is usually necessary to provide a separate power source for feeding the signal φSW to the MOS transistor T1.

By contrast, by using as this MOS transistor T1 a depletion-mode MOS transistor as described above, it is possible to lower the high-level voltage of the signal φSW fed to the gate thereof, and thus make this high-level voltage equal to or close to the high-level signals fed to the other MOS transistors. The reason is that a depletion-mode MOS transistor has a negative threshold value and can thus be turned on with a lower gate voltage than with an enhancement-mode MOS transistor.

Figure 54:
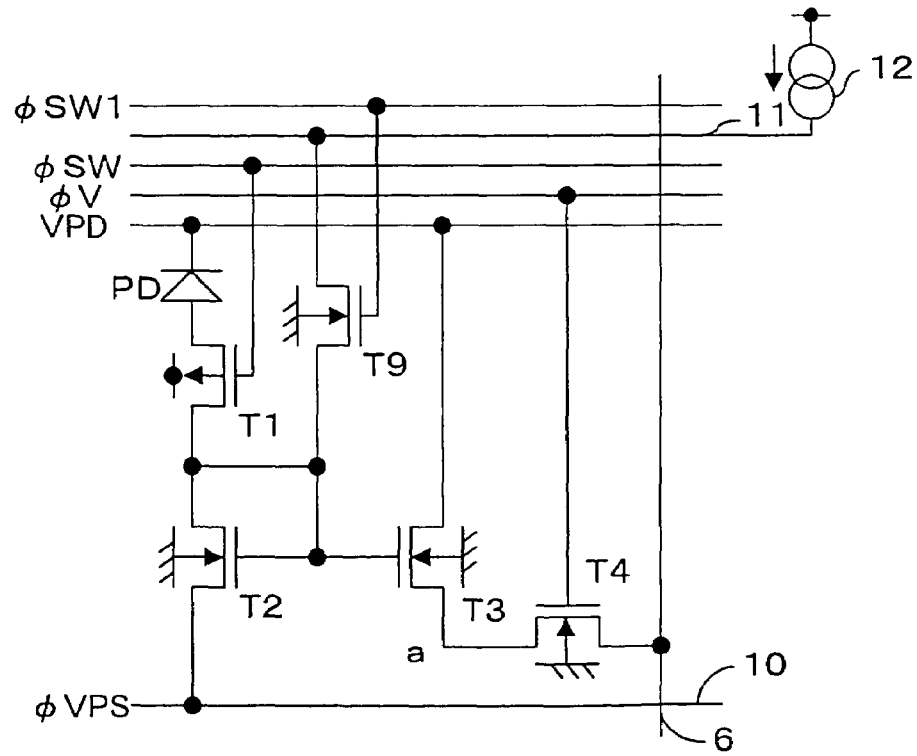
FIG. 54 is a circuit diagram showing another example of the configuration of each pixel in the eighteenth embodiment.

Alternatively, in this embodiment, the first MOS transistor T1 may be a P-channel MOS transistor. In that case, the pixel has a circuit configuration as shown in FIG. 54. As shown in FIG. 54, all the other transistors T2 to T4 and T9 than the MOS transistor T1 are N-channel MOS transistors. Moreover, the MOS transistor T1 has its source connected to the anode of the photodiode PD, and has its drain connected to the drain of the MOS transistor T2.

In this circuit configuration, the MOS transistor T1 is turned on when the voltage difference between the gate and drain thereof is greater than the threshold value thereof, and is turned off when the voltage difference between the gate and drain thereof is smaller than the threshold value. Accordingly, the signal φSW fed to the gate of the MOS transistor T1 has an inverted level-shift pattern as compared with the signal φSW shown in FIG. 52. Moreover, the MOS transistor T1 can be turned on and off without being affected by the MOS transistor T2 that is connected in series with the drain of the MOS transistor T1.

Moreover, since the MOS transistor T1 can be turned on and off without being affected by the MOS transistor T2, there is no need to provide a separate power source for feeding the signal φSW. Furthermore, this circuit configuration permits the MOS transistor T1 to be formed as an enhancement-mode MOS transistor like all the other MOS transistors, and thus allows the MOS transistor T1 to be produced together with the other MOS transistors in a single step. This helps simplify the manufacturing process as compared with the circuit configuration described above in which only the first MOS transistor is a depletion-mode MOS transistor.

Figure 55:
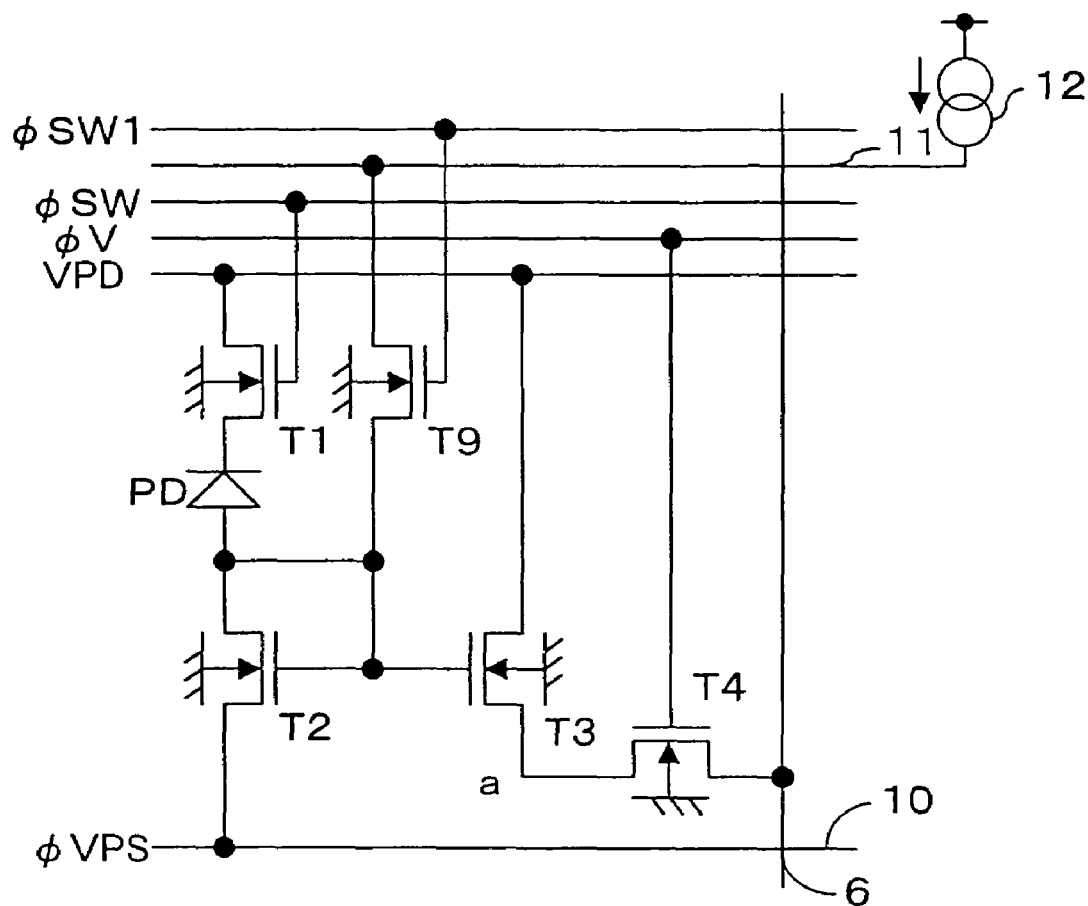
FIG. 55 is a circuit diagram showing another example of the configuration of each pixel in the eighteenth embodiment.

In this embodiment, as shown in FIG. 55, the MOS transistor T1 may be connected between the direct-current voltage line VPD and the cathode of the photodiode PD. In this case, the MOS transistor T1 receives the direct-current voltage VPD at its drain and has its source connected to the cathode of the photodiode PD. Moreover, in the pixel having this circuit configuration, it is also possible to use as the MOS transistor T1 a depletion-mode MOS transistor or P-channel MOS transistor as described above.

Fifth Example of the Pixel Configuration

Figure 56:
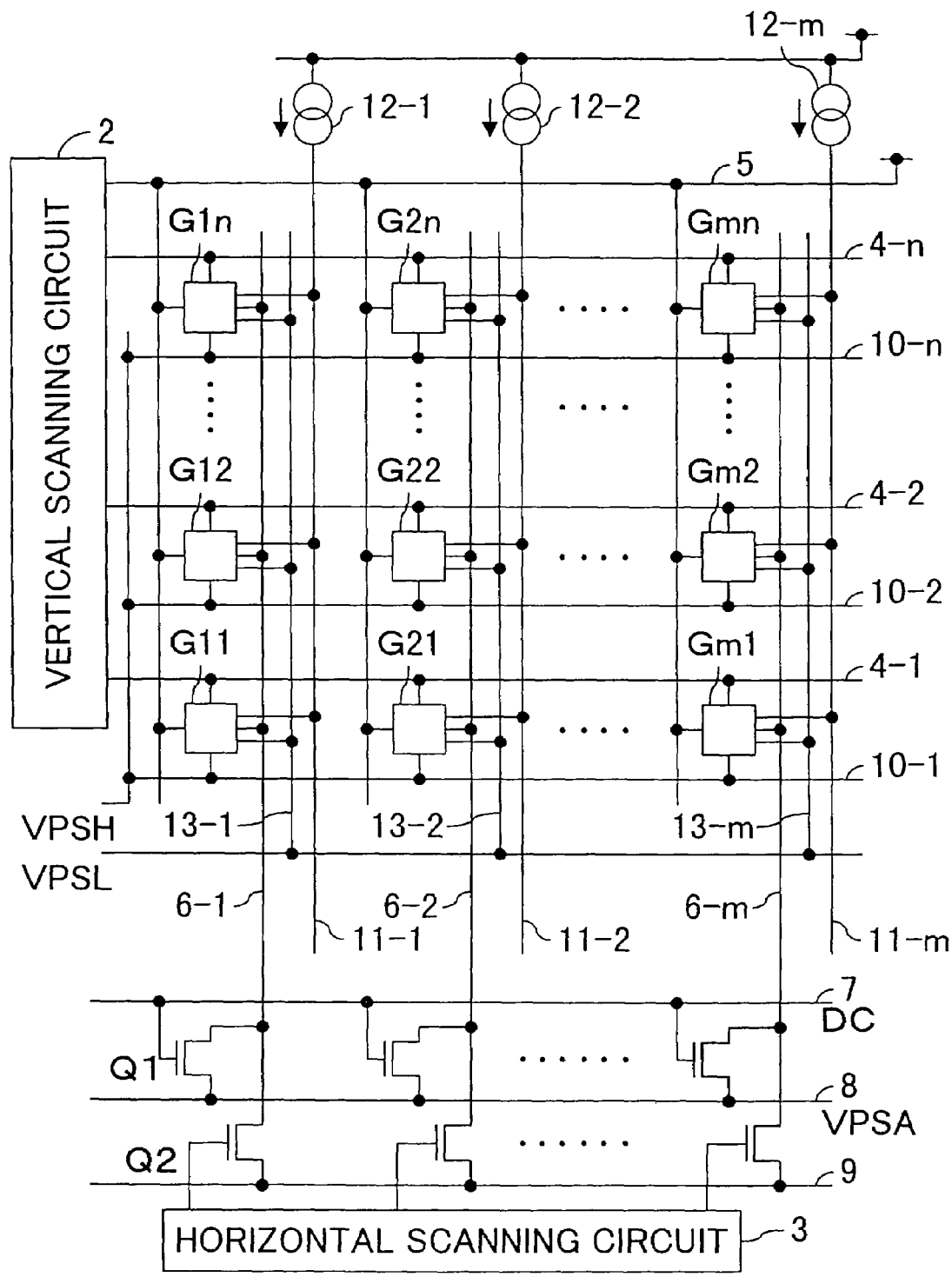
FIG. 56 is a block circuit diagram illustrating the overall configuration of another two-dimensional solid-state image-sensing device embodying the invention.

FIG. 56 schematically shows the configuration of part of another two-dimensional MOS-type solid-state image-sensing device embodying the invention. In this figure, reference symbols G11 to Gmn represent pixels that are arranged in a two-dimensional array (in a matrix). Reference numeral 2 represents a vertical scanning circuit, which scans lines (rows) 4-1, 4-2, . . . , 4-n sequentially. Reference numeral 3 represents a horizontal scanning circuit, which reads out, sequentially pixel by pixel in a horizontal direction, the signals fed from the individual pixels to output signal lines 6-1, 6-2, . . . , 6-m as a result of photoelectric conversion performed in those pixels. Reference numeral 5 represents a power line. Reference numerals 12-1, 12-2, . . . , 12-m represent constant-current sources that are provided one for each column so as to feed currents by way of current-feed lines 11-1, 11-2, . . . , 11-m to the pixels G11 to G1n, G21 to G2n, . . . , Gm1 to Gmn, respectively. Reference numerals 10-1, 10-2, . . . , 10-n represent lines that are provided one for each row and connected to the pixels G11 to Gm1, G12 to Gm2, . . . , G1n to Gmn, respectively, so as to feed a direct-current voltage VPSH thereto. Reference numerals 13-1, 13-2, . . . , 13-m represent lines that are provided one for each column and connected to the pixels G11 to G1n, G21 to G2n, . . . , Gm1 to Gmn, respectively, so as to feed a direct-current voltage VPSL thereto. The individual pixels are connected not only to the lines 4-1, 4-2, . . . , 4-n, to the lines 10-1, 10-2, . . . , 10-n, to the lines 13-1, 13-2, . . . , 13-m, to the output signal lines 6-1, 6-2, . . . , 6-m, to the current-feed lines 11-1, 11-2, . . . , 11-m, and to the power line 5 mentioned above, but also to other lines (for example clock lines and bias supply lines). These other lines, however, are omitted in FIG. 56.

As shown in FIG. 56, for each of the output signal lines 6-1, 6-2, . . . , 6-m, a pair of N-channel MOS transistors Q1 and Q2 is provided. Here, a description will be given only with respect to the output signal line 6-1 as their representative. The MOS transistor Q1 has its gate connected to a direct-current voltage line 7, has its drain connected to the output signal line 6-1, and has its source connected to a direct-current voltage VPSA line 8. On the other hand, the MOS transistor Q2 has its drain connected to the output signal line 6-1, has its source connected to a signal line 9 serving as a final destination line, and has its gate connected to the horizontal scanning circuit 3. These MOS transistors Q1 and Q2 are used for the same purposes as the MOS transistors Q1 and Q2 in the second example of the pixel configuration.

Nineteenth Embodiment

Figure 57:
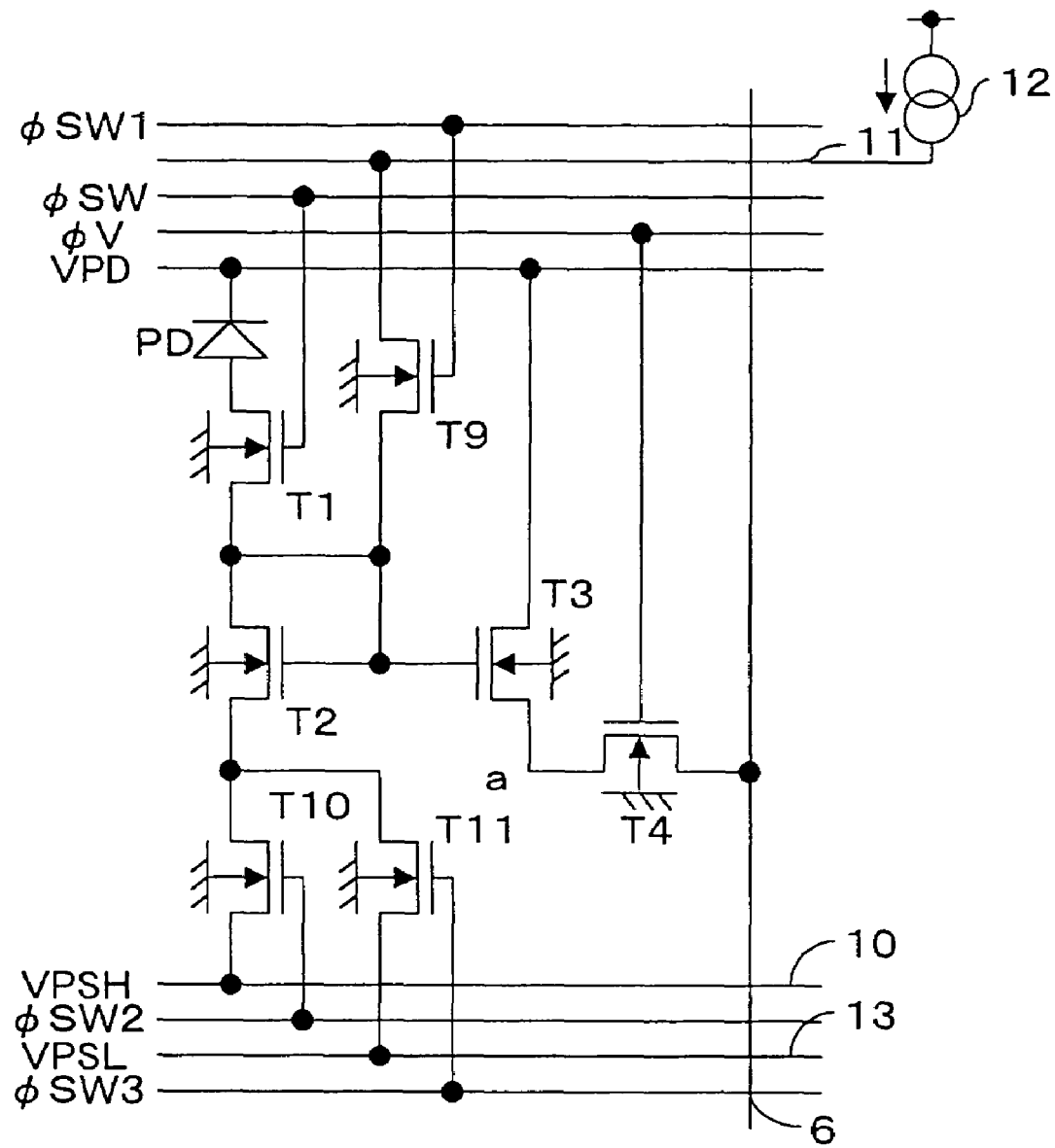
FIG. 57 is a circuit diagram showing the configuration of each pixel in a nineteenth embodiment of the invention.

Next, a nineteenth embodiment of the invention, which is applicable to each pixel of the fifth example of the pixel configuration shown in FIG. 56, will be described with reference to the drawings. FIG. 57 is a circuit diagram showing the configuration of each pixel of the solid-state image-sensing device of this embodiment. It is to be noted that such elements, signal lines, and others as are used for the same purposes here as in the pixel shown in FIG. 51 are identified with the same reference symbols, and their detailed descriptions will be omitted.

As shown in FIG. 57, according to the circuit configuration of this embodiment, as compared with the pixel of the eighteenth embodiment (FIG. 51), there are additionally provided MOS transistors T10 and T11 having their drains connected to the source of the MOS transistor T2. The MOS transistor T10 receives a direct-current voltage VPSH at its source and receives a signal $\phi$SW2 at its gate. On the other hand, the MOS transistor T11 receives a direct-current voltage VPSL at its source and receives a signal $\phi$SW3 at its gate. Now, the operation of this pixel configured as described above will be described. Here, the direct-current voltage VPSH is a voltage that permits the MOS transistor T2 to operate in a subthreshold region, and the direct-current voltage VPSL is a voltage that makes the MOS transistor T2 operate so that a current is fed from the constant-current source 12 to the MOS transistor T2.

(1) How to Convert the Light Incident on the Individual Pixels into an Electric Signal As in the eighteenth embodiment, first, the signal $\phi$SW1 is turned to a low level and the signal $\phi$SW is turned to a high level. In this state, the signal $\phi$SW2 is turned to a high level to turn on the MOS transistor T10 so that the direct-current voltage VPSH is applied to the source of the MOS transistor T2. This causes the MOS transistor T2 to operate in a subthreshold region, and thus causes a current having the value natural-logarithmically proportional to the photoelectric current to flow through the MOS transistor T3 as its drain current. At this time, the signal $\phi$SW3 is at a low level and thus the MOS transistor T11 remains off.

In this state, when the pulse signal $\phi$V is fed to the gate of the MOS transistor T4 to turn on this MOS transistor T4, a current having the value natural-logarithmically proportional to the photoelectric current flows through the MOS transistor T4 as its drain current to the output signal line 6.

At this time, the drain voltage of the MOS transistor Q1 (FIG. 56), which is determined by the on-state resistances of the MOS transistors T3 and Q1 and the current flowing therethrough, appears as the output signal on the output signal line 6. After this output signal has been read, the MOS transistor T4 is turned off.

(2) How to Reset the Individual Pixels

Figure 58:
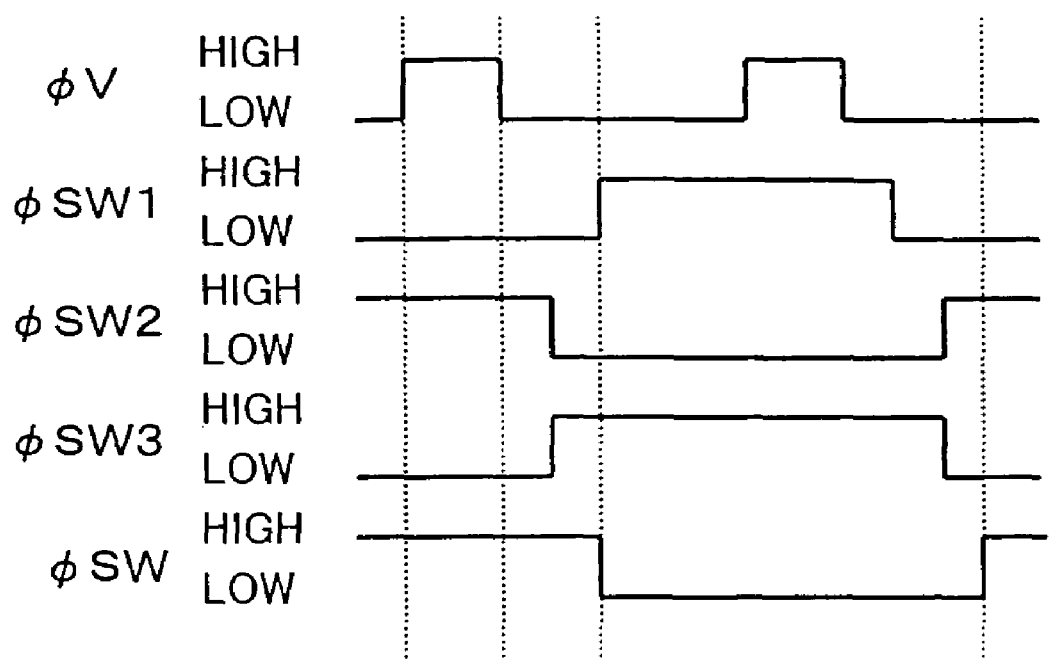
FIG. 58 is a timing chart of the signals fed to each pixel in the nineteenth embodiment.

Now, how resetting is achieved in the pixel having the circuit configuration shown in FIG. 57 will be described with reference to the drawings. FIG. 58 is a timing chart of the signals fed to the signal lines connected to the individual circuit elements constituting each pixel during resetting.

After the output signal has been output as a result of the pulse signal $\phi$V being fed to the gate of the MOS transistor T4 as described under (1) above, first, the signal $\phi$SW2 is turned to a low level to turn off the MOS transistor T10, and in addition the signal $\phi$SW3 is turned to a high level to turn on the MOS transistor T11 so that the direct-current voltage VPSL is fed to the source of the MOS transistor T2. Then, the signal SW1 is turned to a high level to turn on the MOS transistor T9, and in addition the signal $\phi$SW is turned to a low level to turn off the MOS transistor T1.

This causes a current to flow from the constant-current source 12 to the MOS transistor T2, and simultaneously prevents the photoelectric current from flowing from the photodiode PD to the MOS transistor T2. At this time, a constant current flows from the constant-current source 12 through the MOS transistor T9 to the MOS transistor T2. Thus, the source-gate voltage of the MOS transistor T2 is determined by the drain current of the MOS transistor T2, and is thereby reset to its initial level.

After the gate voltage of the MOS transistor T2 has been reset to its initial level in this way, the pulse signal $\phi$V is fed to the gate of the MOS transistor T4 so that the signal obtained on resetting the MOS transistor T2 is fed to the output signal line 6. Then, the signal $\phi$SW1 is turned to a low level to turn off the MOS transistor T9. Next, the signal $\phi$SW2 is turned to a high level to turn on the MOS transistor T10, and in addition the signal $\phi$SW3 is turned to a low level to turn off the MOS transistor T11 so that the direct-current voltage VPSH is fed to the source of the MOS transistor T2. Then, the signal $\phi$SW is turned to a high level to turn on the MOS transistor T1 and thereby make the pixel ready for the next round of image sensing.

As in the fourteenth embodiment, the signal output to the output signal line 6 on resetting the MOS transistor T2 as described above is stored as pixel-by-pixel compensation data. Then, by correcting pixel by pixel the output signal obtained during actual image sensing with the compensation data thus stored, it is possible to eliminate components resulting from variations in sensitivity of the individual pixels from the output signal. A practical example of how this compensation is achieved is shown in FIG. 95 and will be described later. This compensation may be realized by providing memories, such as line memories, within the pixels.

In this embodiment, it is also possible, as in the fifteenth embodiment (FIG. 46), to connect the source of the MOS transistor T3 to a capacitor C1 that receives the direct-current voltage VPS at the other end, to the gate of a MOS transistor T7, and to the drain of a MOS transistor T8 for resetting the capacitor C1 and connect the source of the MOS transistor T7 to the drain of the MOS transistor T4. Alternatively, it is also possible, as in the sixteenth embodiment (FIG. 48), to feed the signal $\phi$D to the drain of the MOS transistor T3 and thereby omit the MOS transistor T8 as used in the fifteenth embodiment (FIG. 46) described above.

It is also possible to adopt a circuit configuration in which the MOS transistor T1 is omitted, or provide the MOS transistor T1 between the direct-current voltage line VPD and the photodiode PD as in the eighteenth embodiment. It is also possible to form only the MOS transistor T1 as a depletion-mode MOS transistor or P-channel MOS transistor.

For example, in a solid-state image-sensing device configured as shown in FIG. 42 or 45, when the pixels G11 to Gm1 connected to the line 4-1 are reset, all the currents fed from the constant-current sources 12-1 to 12-m flow by way of the line 10-1. Thus, due to a voltage drop across the line 10-1, the second voltage of the signal φVPS fed to the source of the MOS transistor T2 provided in each of the pixels G11 to Gm1 is not kept constant. By contrast, in the solid-state image-sensing device shown in FIG. 56 with pixels G11 to Gmn configured as shown FIG. 57, when the pixels G11 to Gm1 are reset, the currents fed from the constant-current sources 12-1, 12-2, . . . , 12-m flow by way of lines 13-1, 13-2, . . . , 13-m, respectively. Thus, the voltage fed to the source of the MOS transistor T2 provided in each of the pixels G11 to Gm1 is not affected by the currents flowing through the constant-current sources 12-1, 12-2, . . . , 12-m, and is thus kept constant at the level of the direct-current voltage VPSL. Accordingly, pixels configured according to this embodiment exhibit smaller variations in the gate voltage of the MOS transistor T2, as observed on resetting the MOS transistor T2, among the individual pixels than pixels configured according to the fourteenth to eighteenth embodiments.

In any of the embodiments described thus far, the reading of the signal from each pixel may be achieved by the use of a charge-coupled device (CCD). In that case, the transfer of an electric charge to the CCD is achieved by providing a potential barrier with a variable potential level that corresponds to the MOS transistor T4.

In the first to eleventh and thirteenth to nineteenth embodiments described above, the MOS transistors T1 to T11 provided within each pixel as active elements are all composed of N-channel MOS transistors; however, these MOS transistors T1 to T8 may be composed of P-channel MOS transistors instead. On the other hand, in the twelfth embodiment, it is possible, within each pixel, to replace all the N-channel MOS transistors with P-channel MOS transistors and replace all the P-channel MOS transistors with N-channel MOS transistors.

FIGS. 60 to 63, 66 to 71, 80 to 82, 84, and 86 to 89, and 94 show twentieth to thirty-eighth embodiments, which are examples of modified versions of the first to nineteenth embodiments described above in which MOS transistors of the opposite polarities are used. FIGS. 72 to 75 and 90 show modified versions of the twenty-ninth to thirty-second and thirty-seventh embodiments in which a depletion-mode P-channel MOS transistor is used as the first MOS transistor T1.

FIGS. 76 to 79 and 91 show modified versions of the twenty-ninth to thirty-second and thirty-seventh embodiments in which an N-channel MOS transistor is used as the first MOS transistor T1. Accordingly, in FIGS. 60 to 63, 66 to 82, 84, 86 to 92, and 94, all the elements used and the voltages applied have the opposite polarities. For example, in FIG. 60 (the twentieth embodiment), the photodiode PD has its anode connected to the direct-current voltage VPD, and has its cathode connected to the drain of the MOS transistor T1. Moreover, the MOS transistor T1 has its source connected to the drain of the MOS transistor T2 and to the gate of the MOS transistor T3. The MOS transistor T2 receives the signal φVPS at its source.

Figure 60:
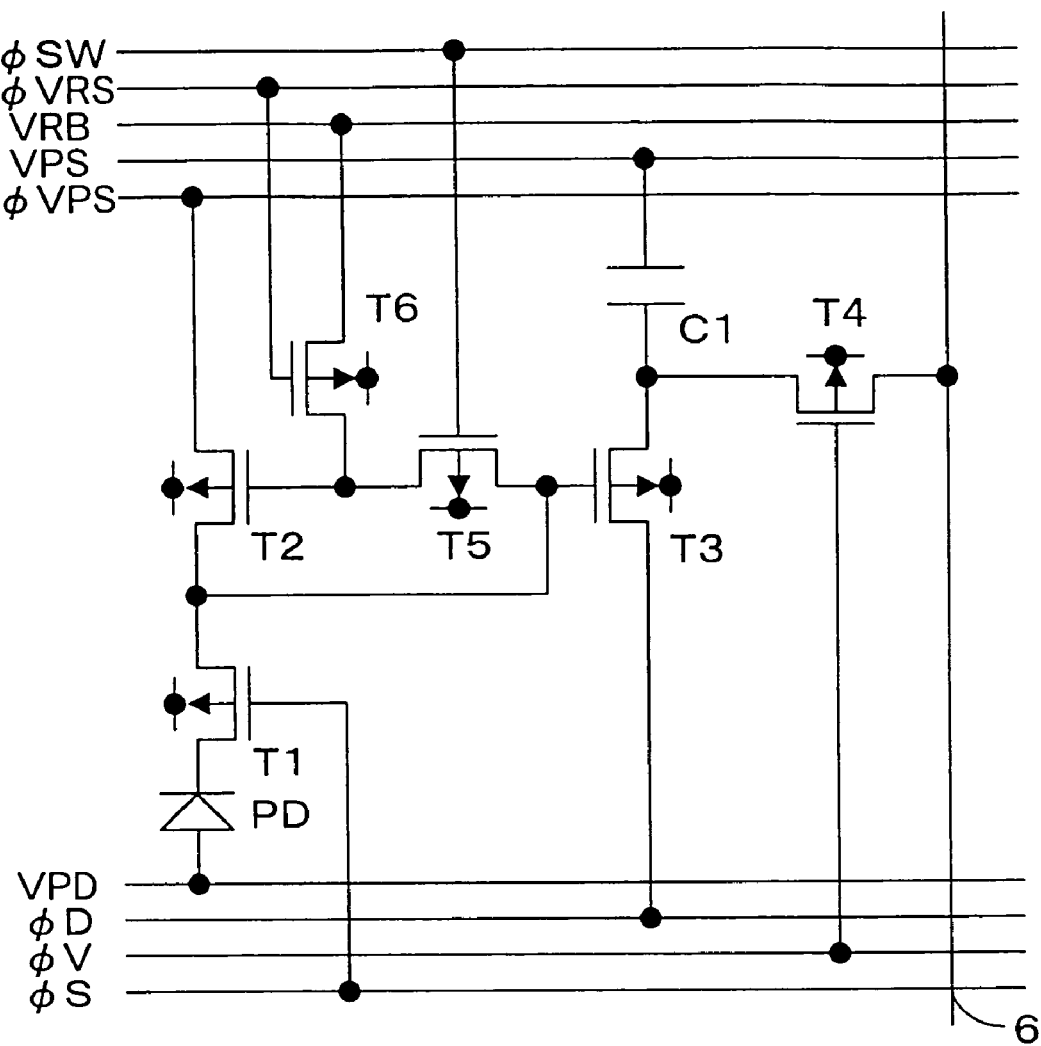
FIG. 60 is a circuit diagram showing the configuration of each pixel in a twentieth embodiment of the invention.
Figure 61:
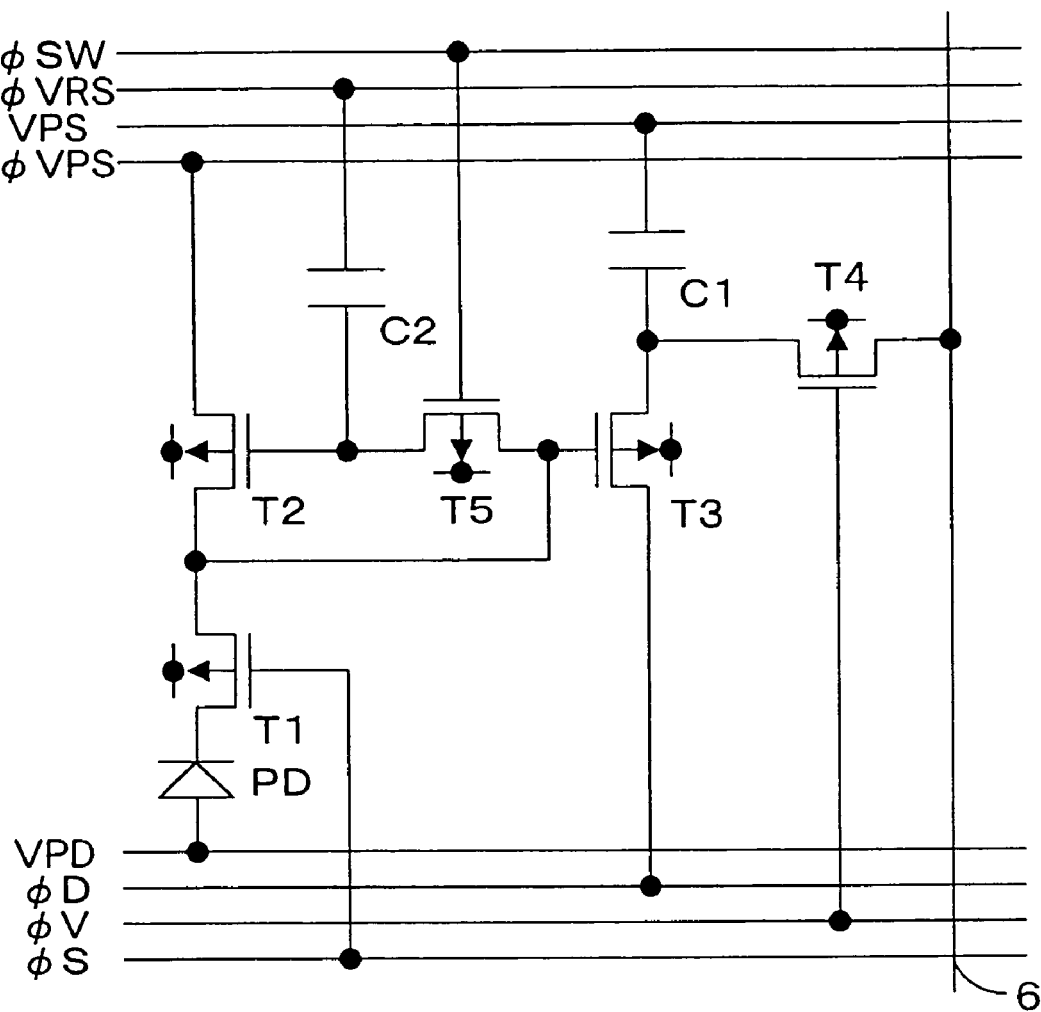
FIG. 61 is a circuit diagram showing the configuration of each pixel in a twenty-first embodiment of the invention.
Figure 62:
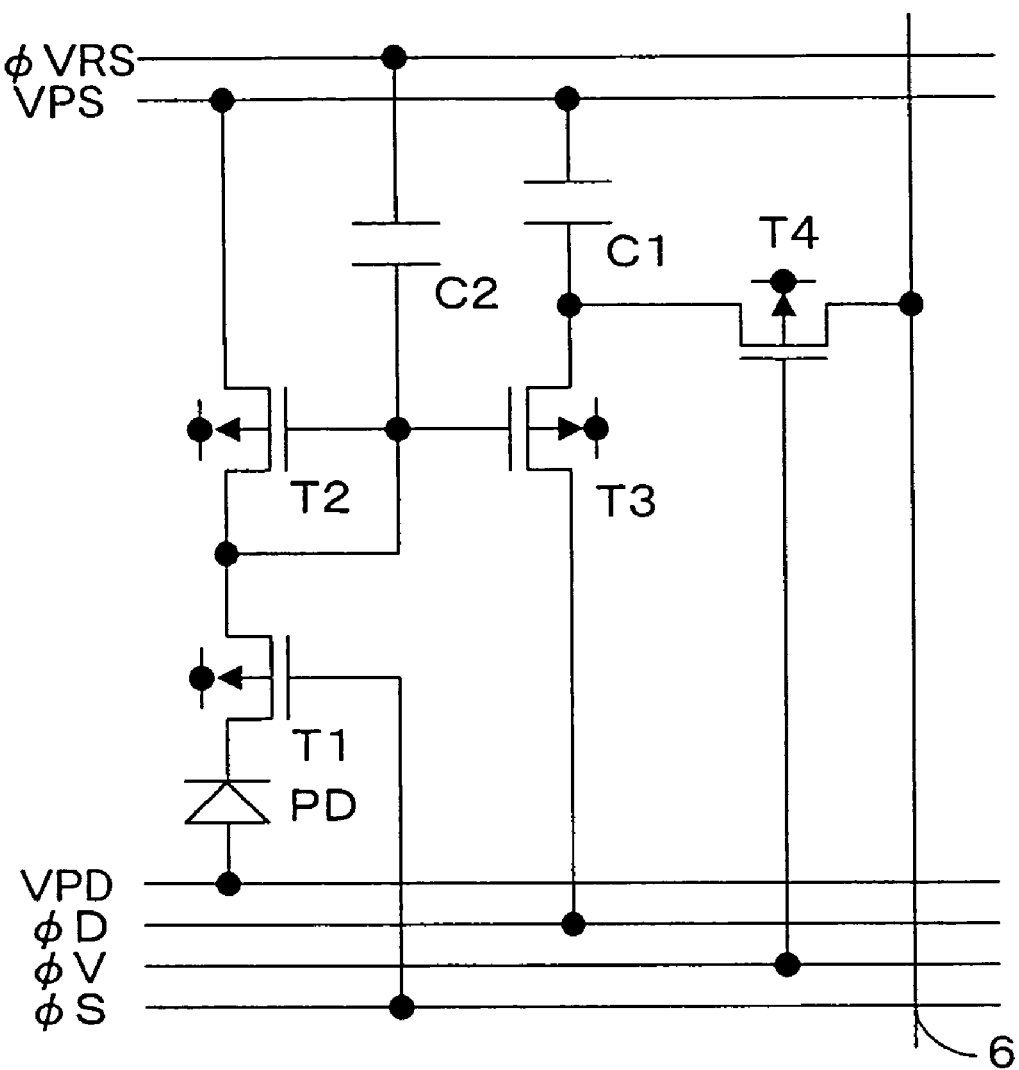
FIG. 62 is a circuit diagram showing the configuration of each pixel in a twenty-second embodiment of the invention.
Figure 63:
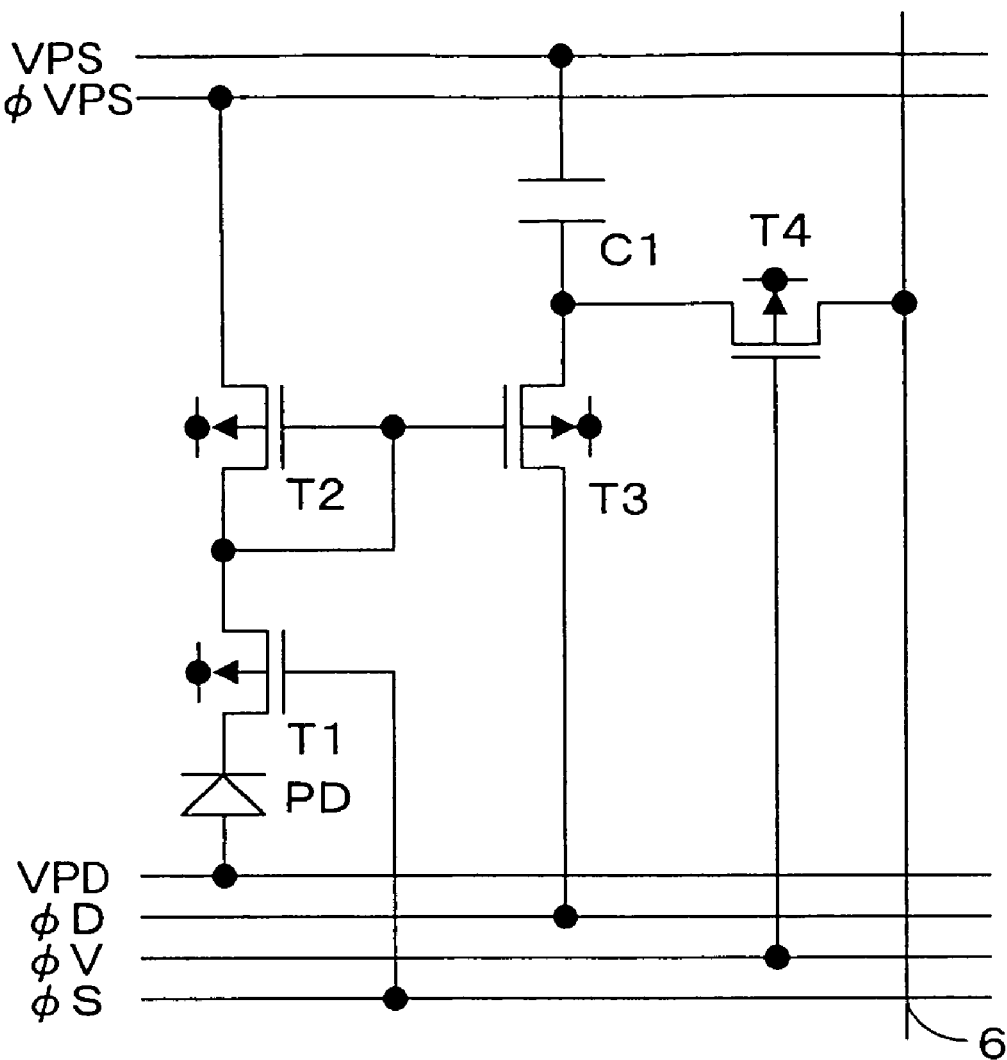
FIG. 63 is a circuit diagram showing the configuration of each pixel in a twenty-third embodiment of the invention.

When logarithmic conversion is performed in the pixel configured as shown in FIG. 60, the direct-current voltage VPS and the direct-current voltage VPD fulfill the relation VPS>VPD, thus an inverted relation as compared with the case shown in FIG. 3 (the first embodiment). Moreover, the output voltage of the capacitor C1 is initially high, and drops as a result of integration. Moreover, when the MOS transistor T1, T4, T5, or T6 is turned on, a low voltage is applied to the gate thereof. Furthermore, when the eighth MOS transistor T8 to T11 is turned on, a low voltage is applied to the gate thereof. In the pixels configured as shown in FIG. 72 to 75 and 90, when the MOS transistor T1, which is an N-channel MOS transistor, is turned on, a high voltage is applied to the gate thereof. In the embodiment shown in FIG. 81 (the twenty-ninth embodiment), when the fourth MOS transistor T4 is turned on, a low voltage is applied to the gate thereof, and, when the eighth MOS transistor T8 is turned on, a high voltage is applied to the gate thereof. As described above, in cases where MOS transistors of the opposite polarities are used, although how the voltages are applied and the elements are connected differs partially, the circuits are configured substantially in the same manner and operate basically in the same manner. Therefore, with respect to the twentieth to thirty-eighth embodiments, only illustrations are given in FIGS. 60 to 63, 66 to 82, 84, 86 to 92, and 94, and no descriptions will be given of their configuration and operation.

Figure 59:
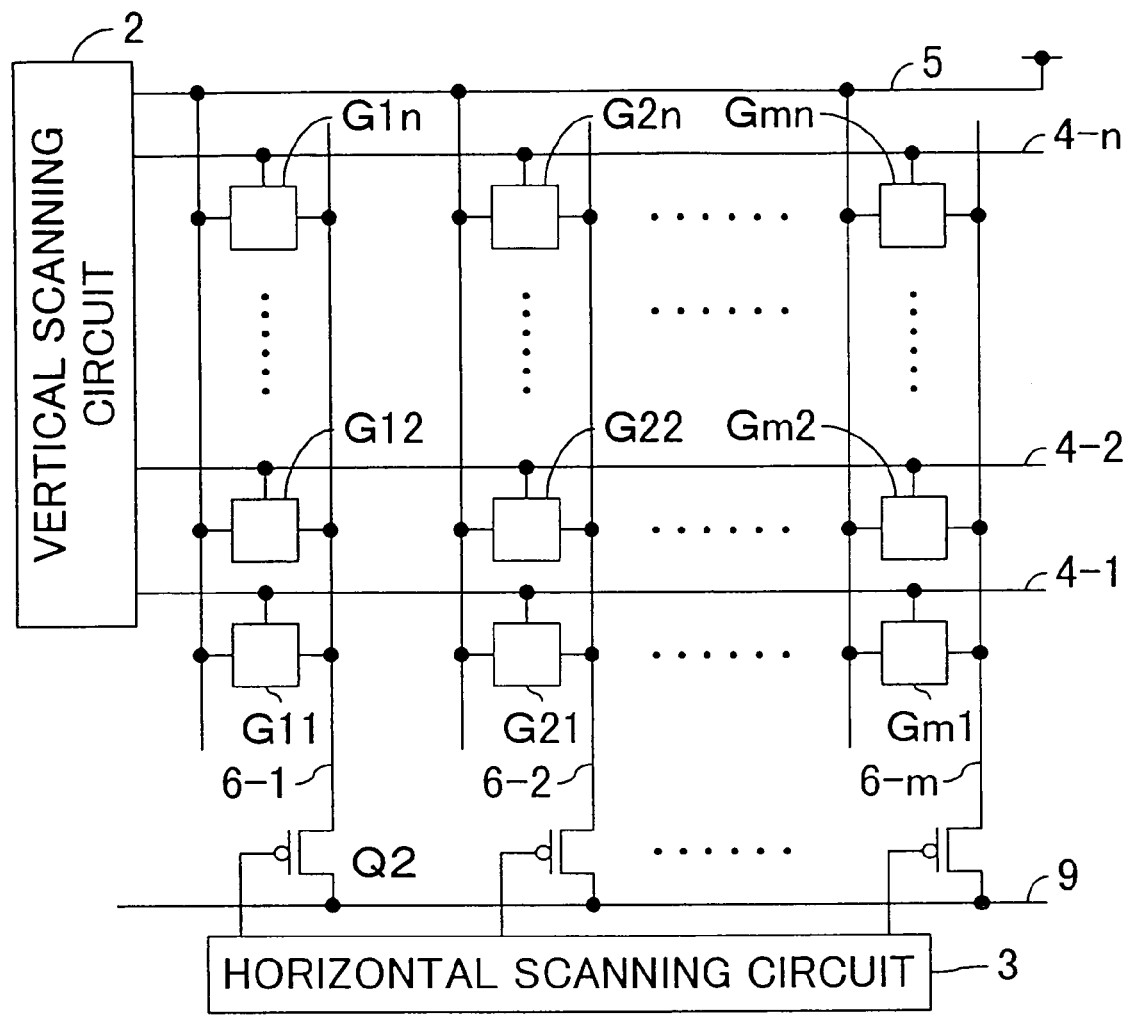
FIG. 59 is a block circuit diagram illustrating the overall configuration of a two-dimensional solid-state image-sensing device embodying the invention, in a case where the active elements within a pixel are composed of P-channel MOS transistors.
Figure 64:
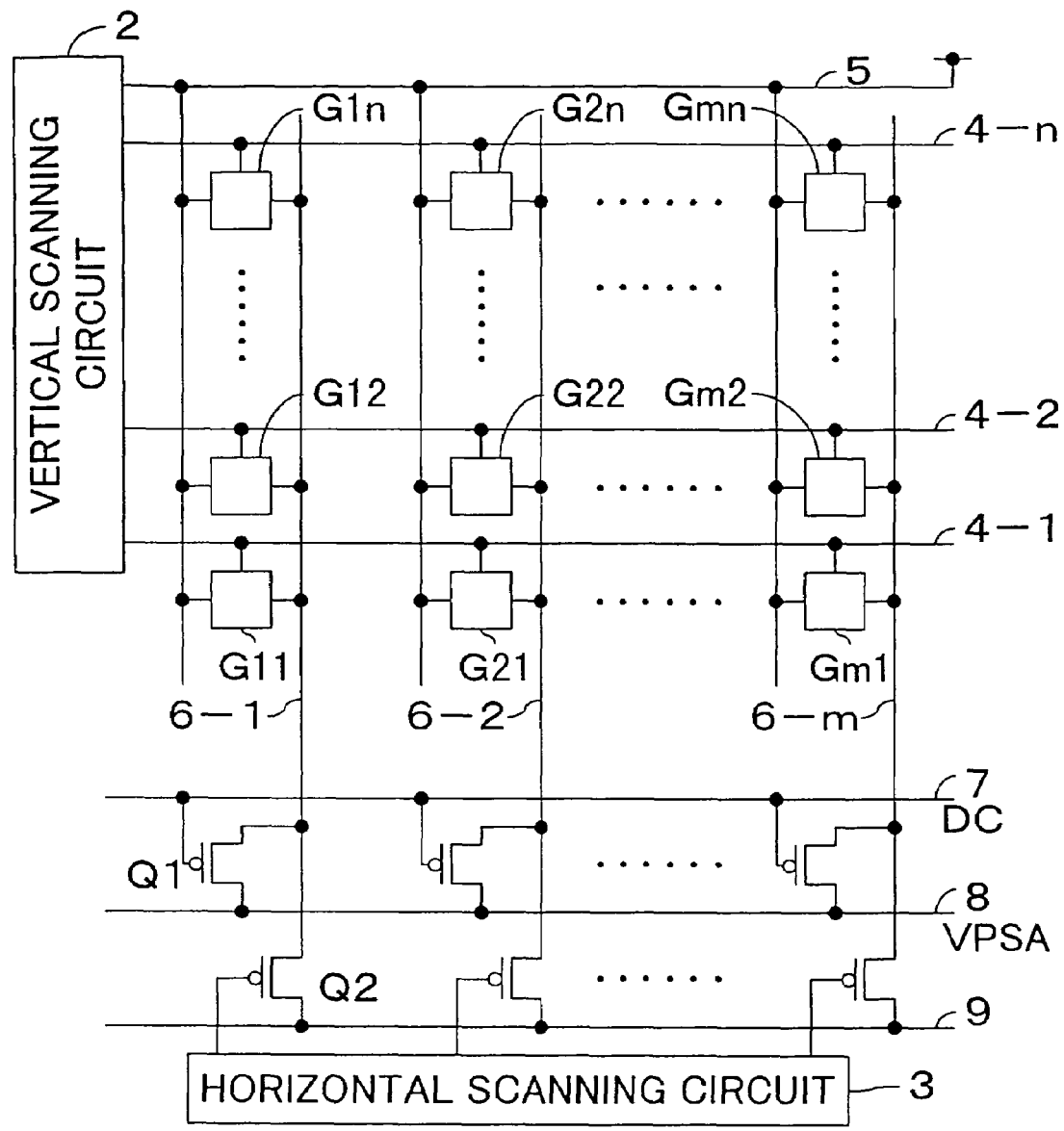
FIG. 64 is a block circuit diagram illustrating the overall configuration of another two-dimensional solid-state image-sensing device embodying the invention, in a case where the active elements within a pixel are composed of P-channel MOS transistors.
Figure 83:
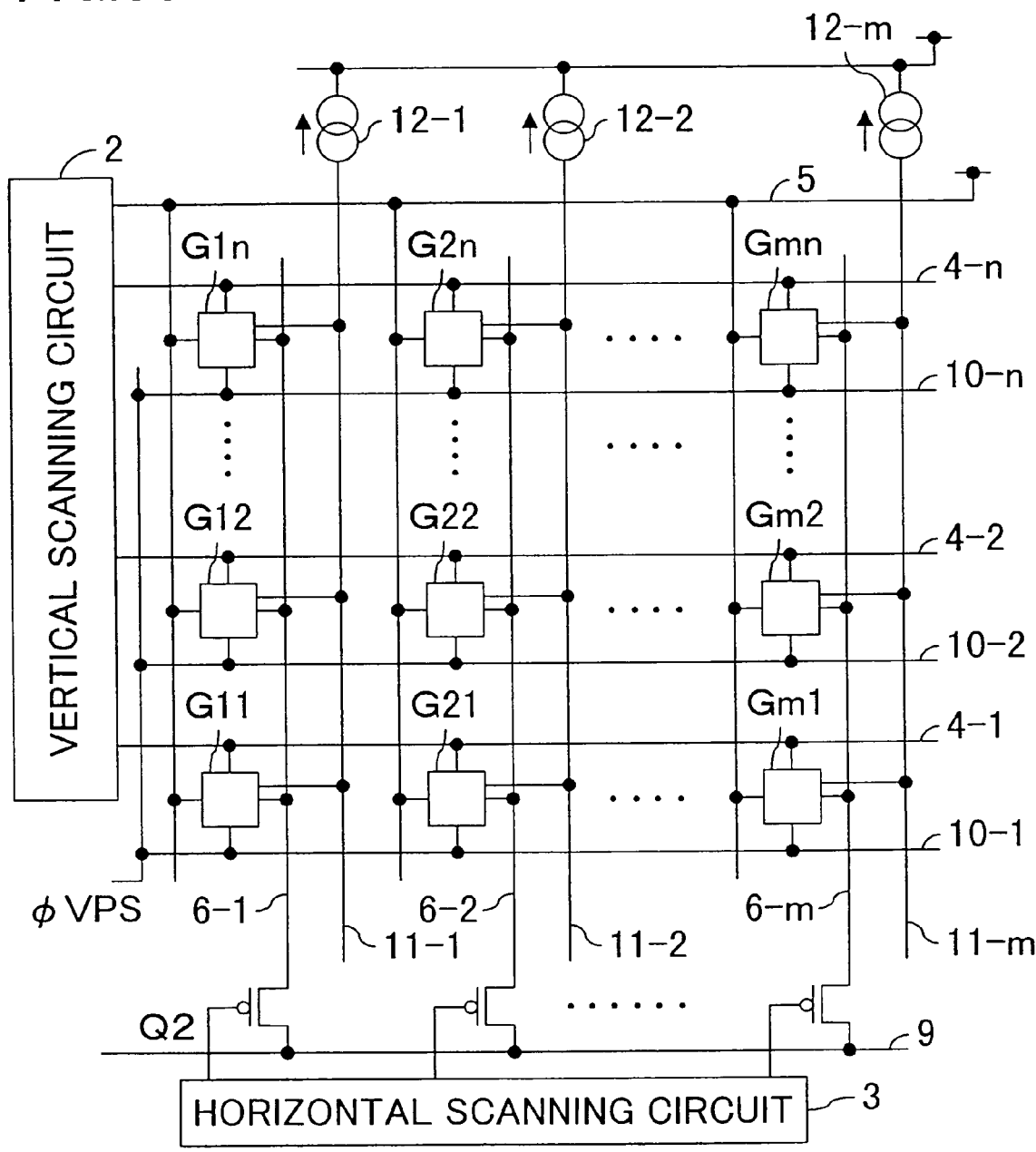
FIG. 83 is a block circuit diagram illustrating the overall configuration of another two-dimensional solid-state image-sensing device embodying the invention, in a case where the active elements within a pixel are composed of P-channel MOS transistors.
Figure 84:
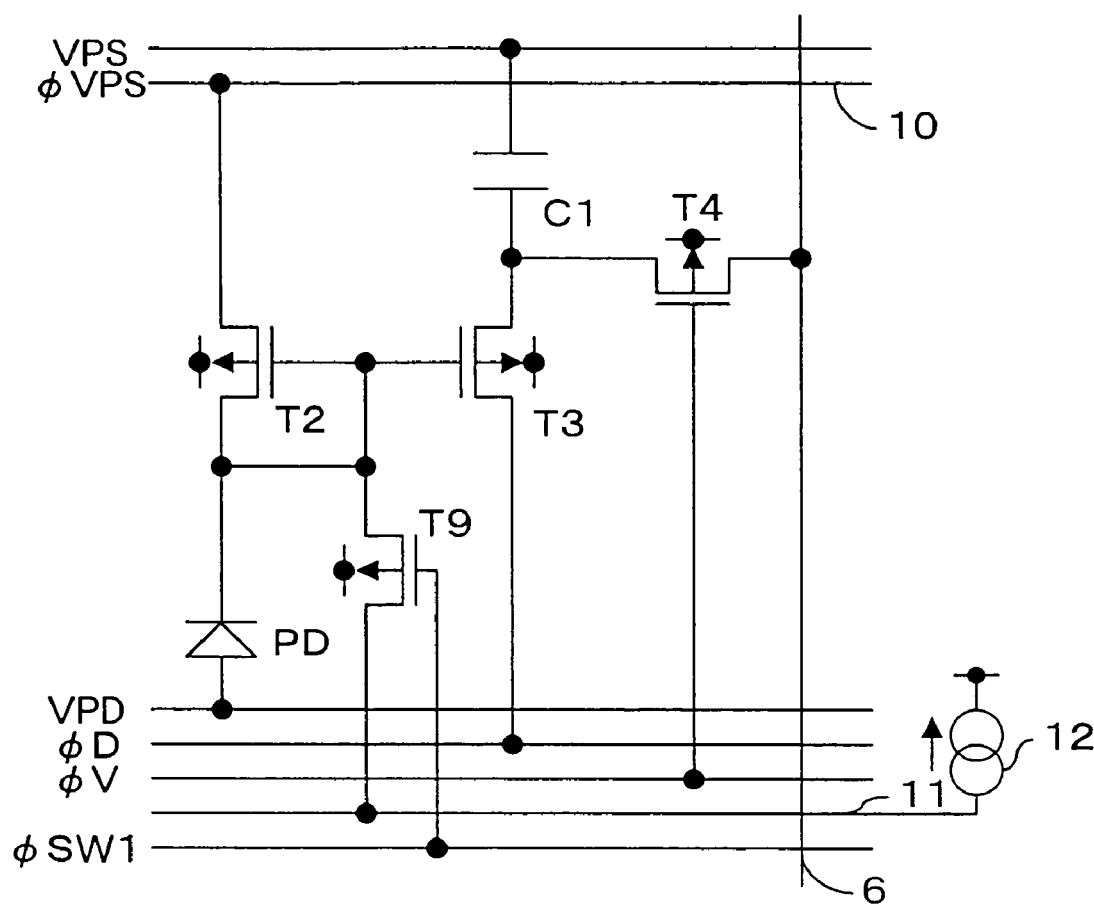
FIG. 84 is a circuit diagram showing the configuration of each pixel in a thirty-third embodiment of the invention.
Figure 85:
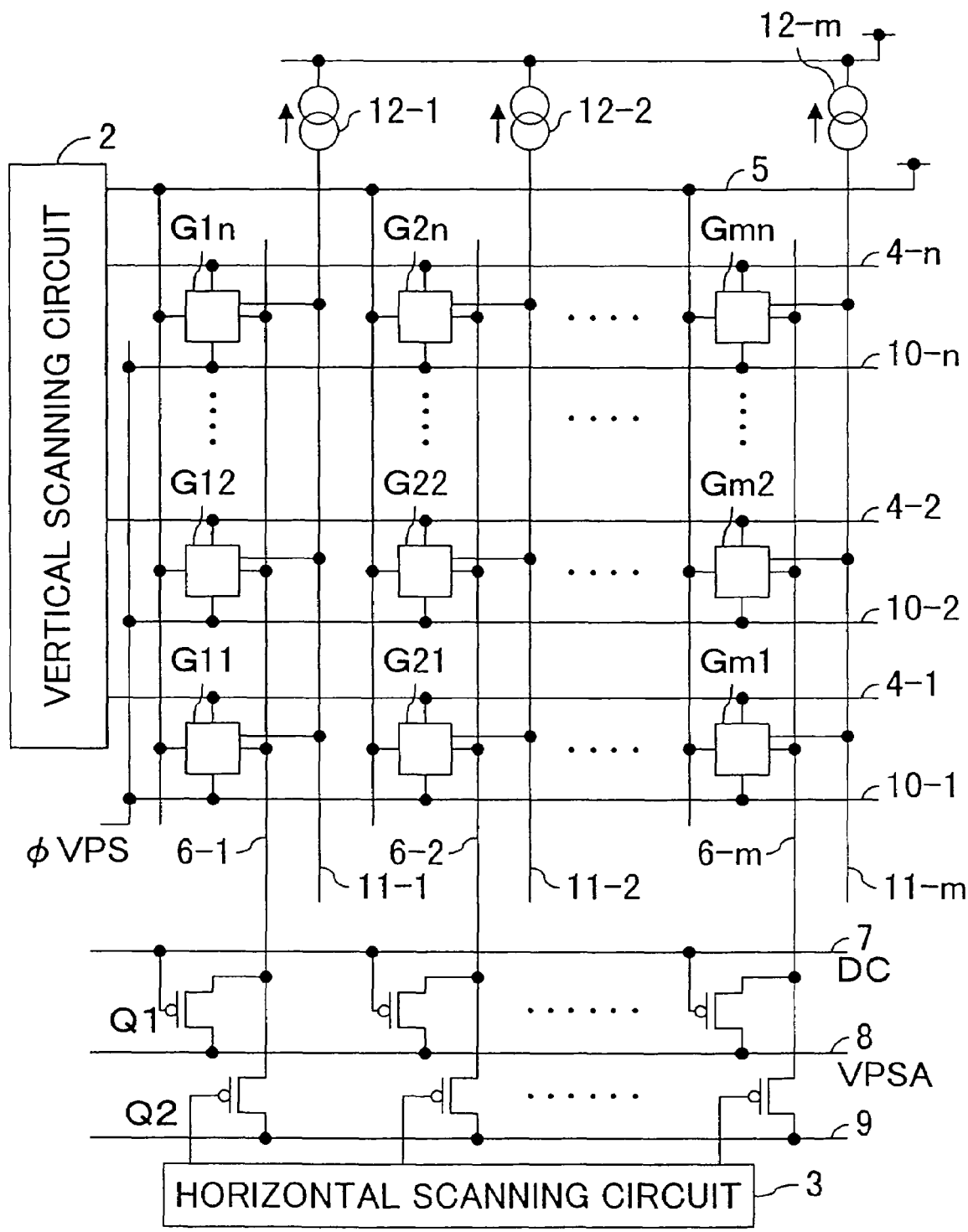
FIG. 85 is a block circuit diagram illustrating the overall configuration of another two-dimensional solid-state image-sensing device embodying the invention, in a case where the active elements within a pixel are composed of P-channel MOS transistors.
Figure 86:
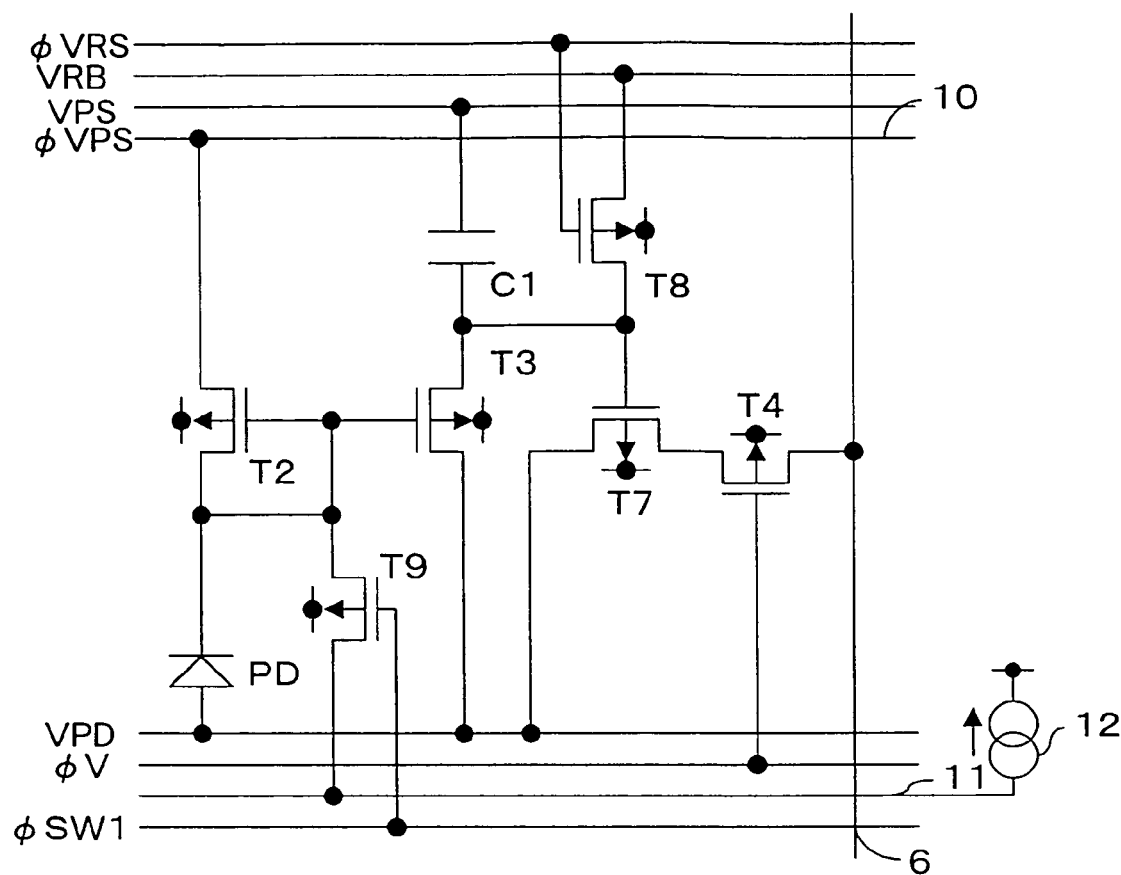
FIG. 86 is a circuit diagram showing the configuration of each pixel in a thirty-fourth embodiment of the invention.
Figure 87:
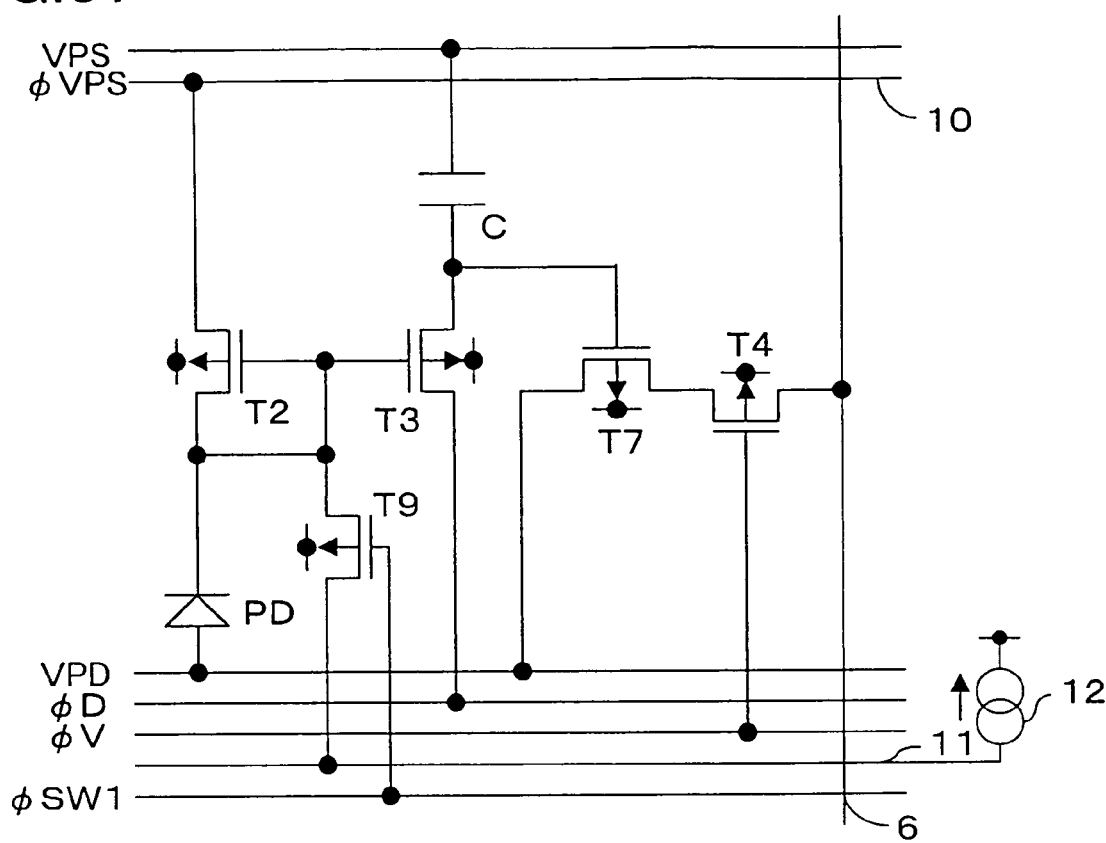
FIG. 87 is a circuit diagram showing the configuration of each pixel in a thirty-fifth embodiment of the invention.
Figure 88:
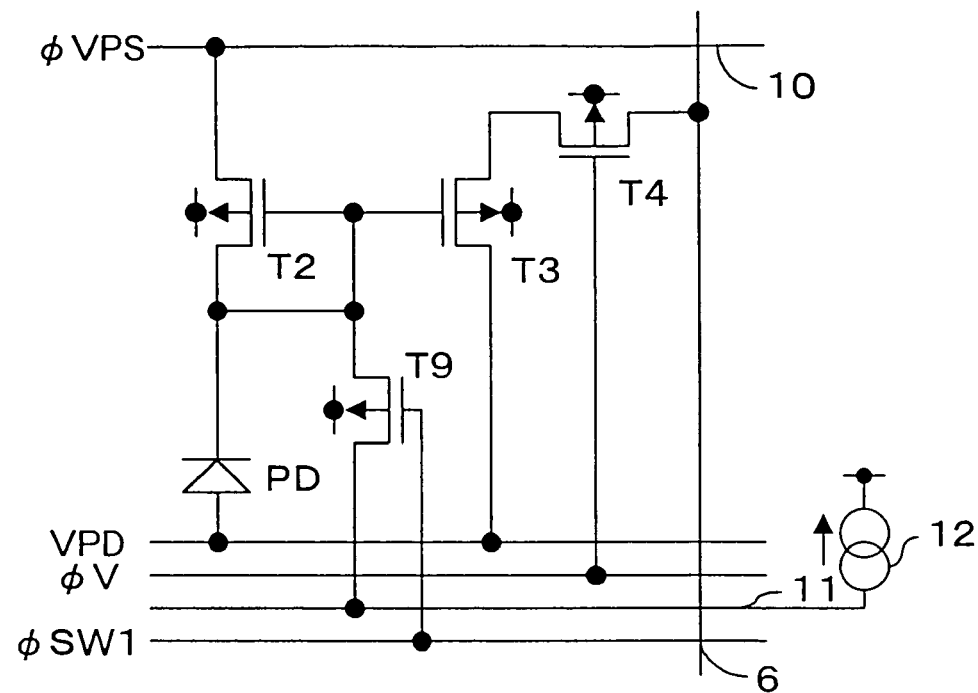
FIG. 88 is a circuit diagram showing the configuration of each pixel in a thirty-sixth embodiment of the invention.
Figure 89:
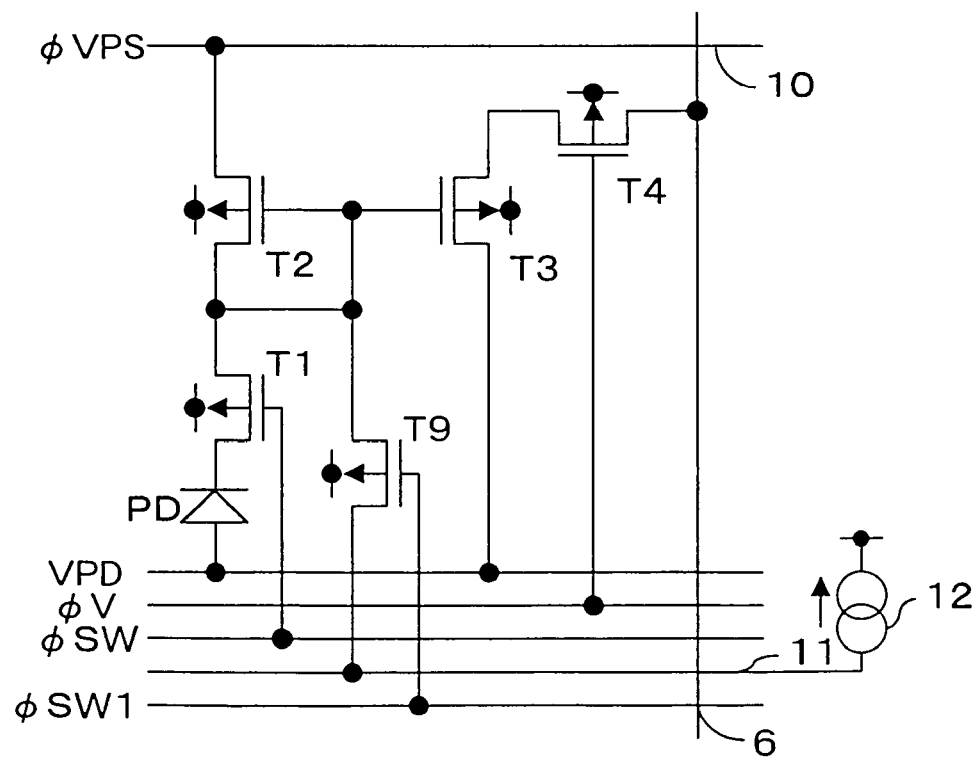
FIG. 89 is a circuit diagram showing the configuration of each pixel in a thirty-seventh embodiment of the invention.
Figure 90:
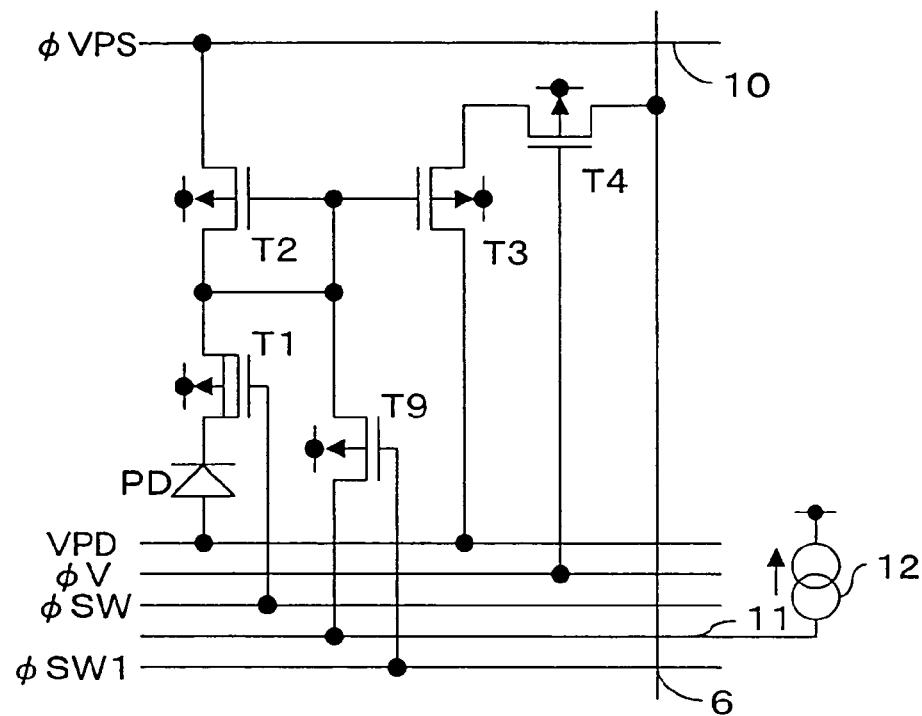
FIG. 90 is a circuit diagram showing an example of the configuration of each pixel in the thirty-seventh embodiment.
Figure 91:
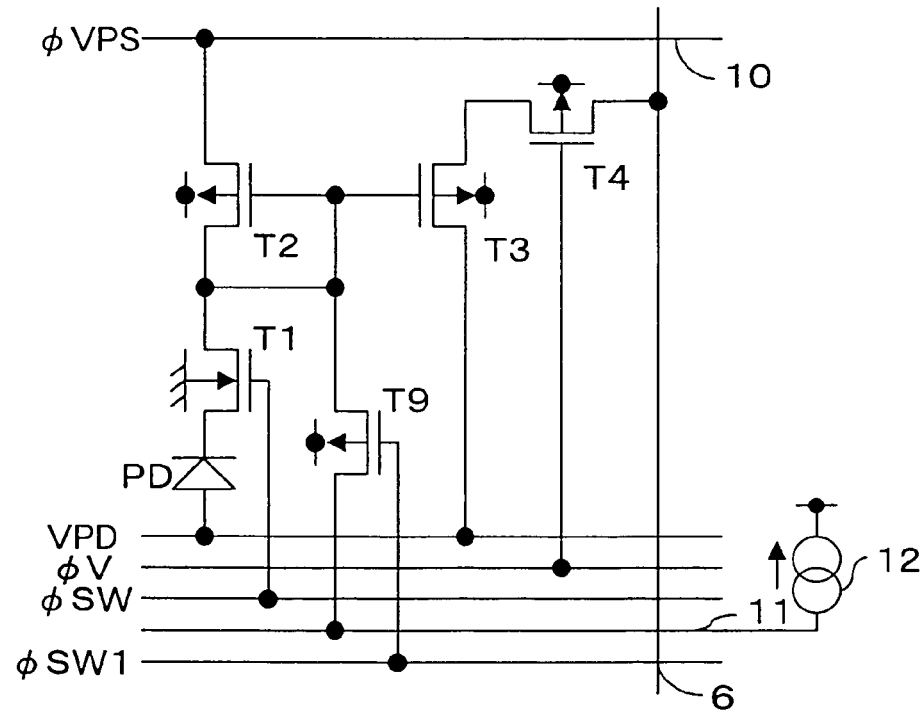
FIG. 91 is a circuit diagram showing another example of the configuration of each pixel in the thirty-seventh embodiment.
Figure 92:
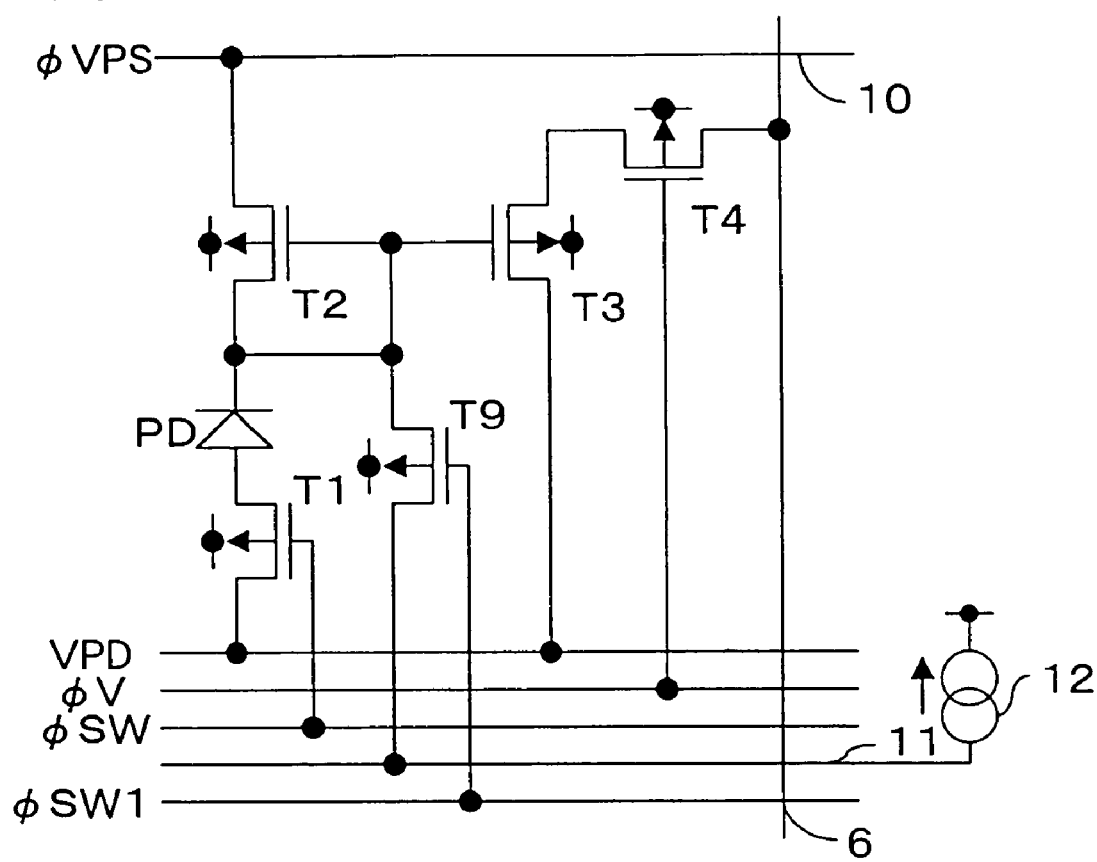
FIG. 92 is a circuit diagram showing another example of the configuration of each pixel in the thirty-seventh embodiment.
Figure 93:
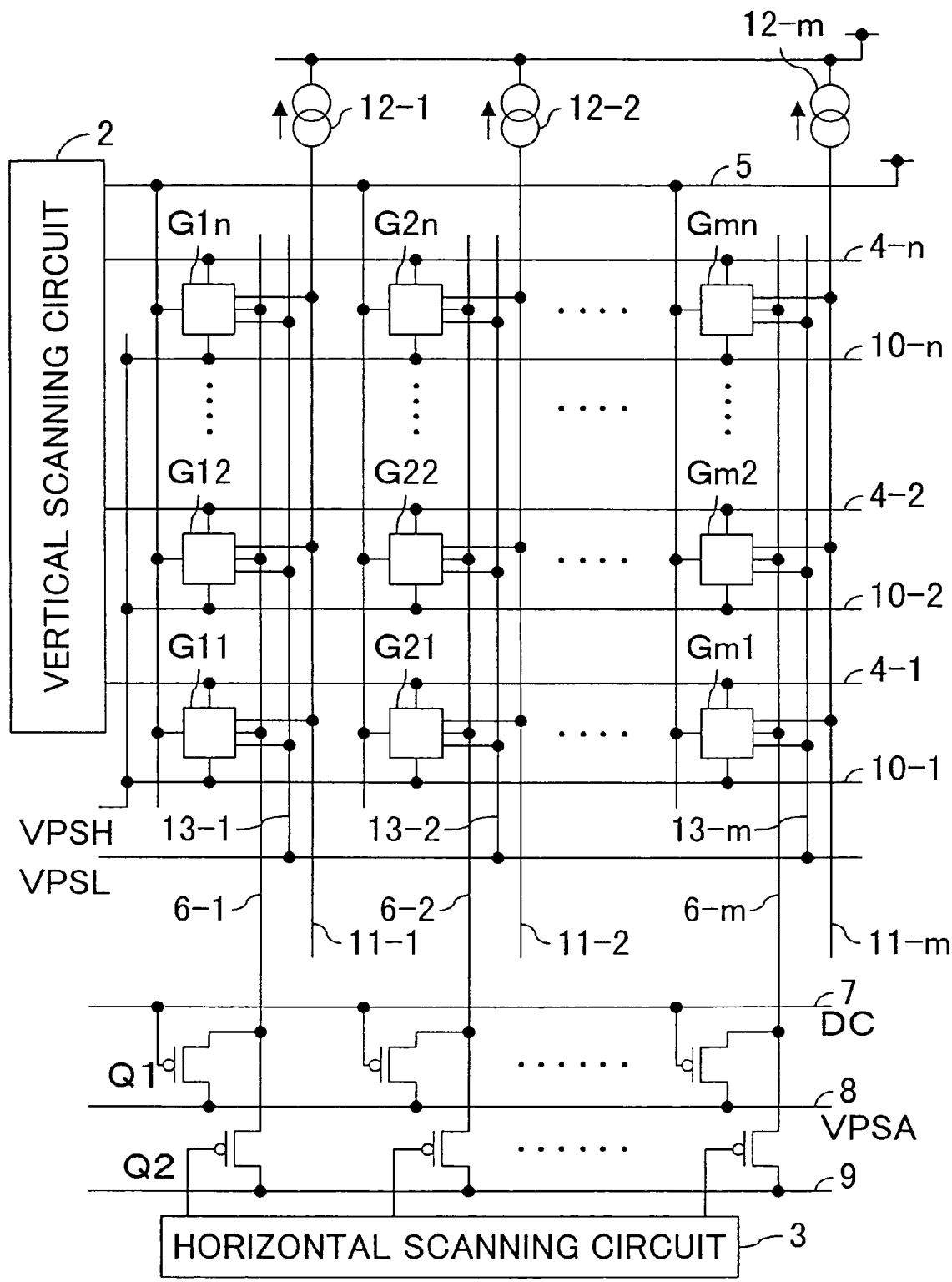
FIG. 93 is a block circuit diagram illustrating the overall configuration of another two-dimensional solid-state image-sensing device embodying the invention, in a case where the active elements within a pixel are composed of P-channel MOS transistors.
Figure 94:
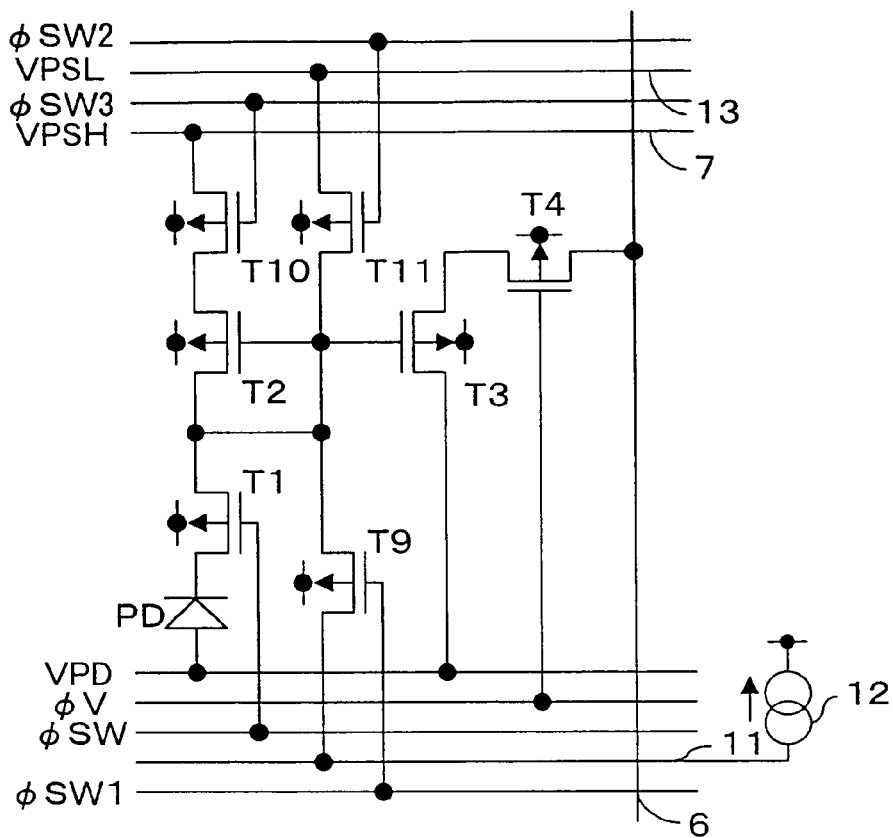
FIG. 94 is a circuit diagram showing the configuration of each pixel in a thirty-eighth embodiment of the invention.

FIG. 59 is a block circuit configuration diagram illustrating the overall configuration of a solid-state image-sensing device having pixels configured according to one of the twentieth to twenty-third embodiments. FIG. 64 is a block circuit configuration diagram illustrating the overall configuration of a solid-state image-sensing device having pixels configured according to one of the twenty-third to thirty-second embodiments. FIG. 83 is a block circuit configuration diagram illustrating the overall configuration of a solid-state image-sensing device having pixels configured according to the thirty-third embodiment. FIG. 85 is a block circuit configuration diagram illustrating the overall configuration of a solid-state image-sensing device having pixels configured according to one of the thirty-fourth to thirty-seventh embodiments. FIG. 93 is a block circuit configuration diagram illustrating the overall configuration of a solid-state image-sensing device having pixels configured according to the thirty-eight embodiment. As to FIGS. 59, 64, 83, 85, and 93, such elements as are found also (i.e. as play the same roles as) in FIGS. 2, 13, 42, 45, and 56 are identified with the same reference symbols, and their descriptions will be omitted.

Here, a brief description will be given of the configuration shown in FIG. 64. A P-channel MOS transistor Q1 and a P-channel MOS transistor Q2 are connected to each of output signal lines 6-1, 6-2, . . . , 6-m that are laid in the column direction. The MOS transistor Q1 has its gate connected to a direct-current voltage line 7, has its drain connected to the output signal line 6-1, and has its source connected to a direct-current voltage VPSA line 8.

Figure 65A:
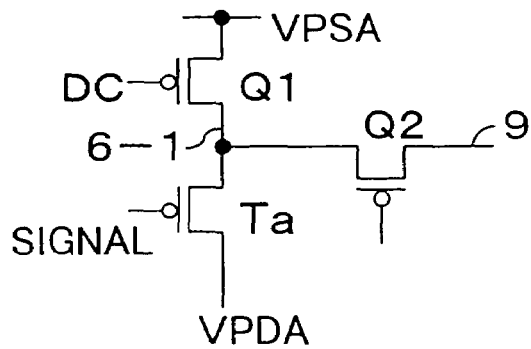
FIGS. 65A and 65B are circuit diagrams of a portion of the circuit shown in FIG. 64.

On the other hand, the MOS transistor Q2 has its drain connected to the output signal line 6-1, has its source connected to a signal line 9 serving as a final destination line, and has its gate connected to a horizontal scanning circuit 3. Here, the MOS transistor Q1, together with a P-channel MOS transistor Ta provided within each pixel, constitutes an amplifier circuit as shown in FIG. 65A. This MOS transistor Ta corresponds to the MOS transistor T7 in the twenty-fourth, twenty-fifth, thirtieth, and thirty-first embodiments, and corresponds to the MOS transistor T3 in the twenty-sixth to twenty-ninth and thirty-second embodiments.

Figure 65B:
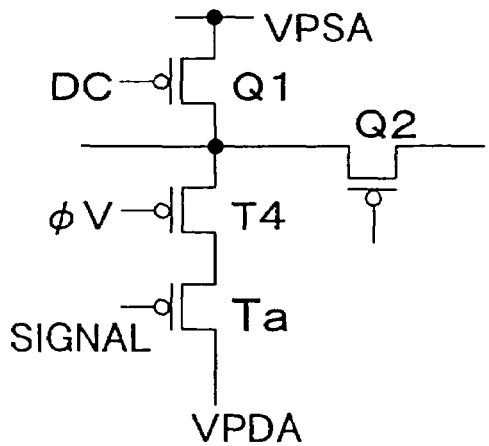
Figure 66:
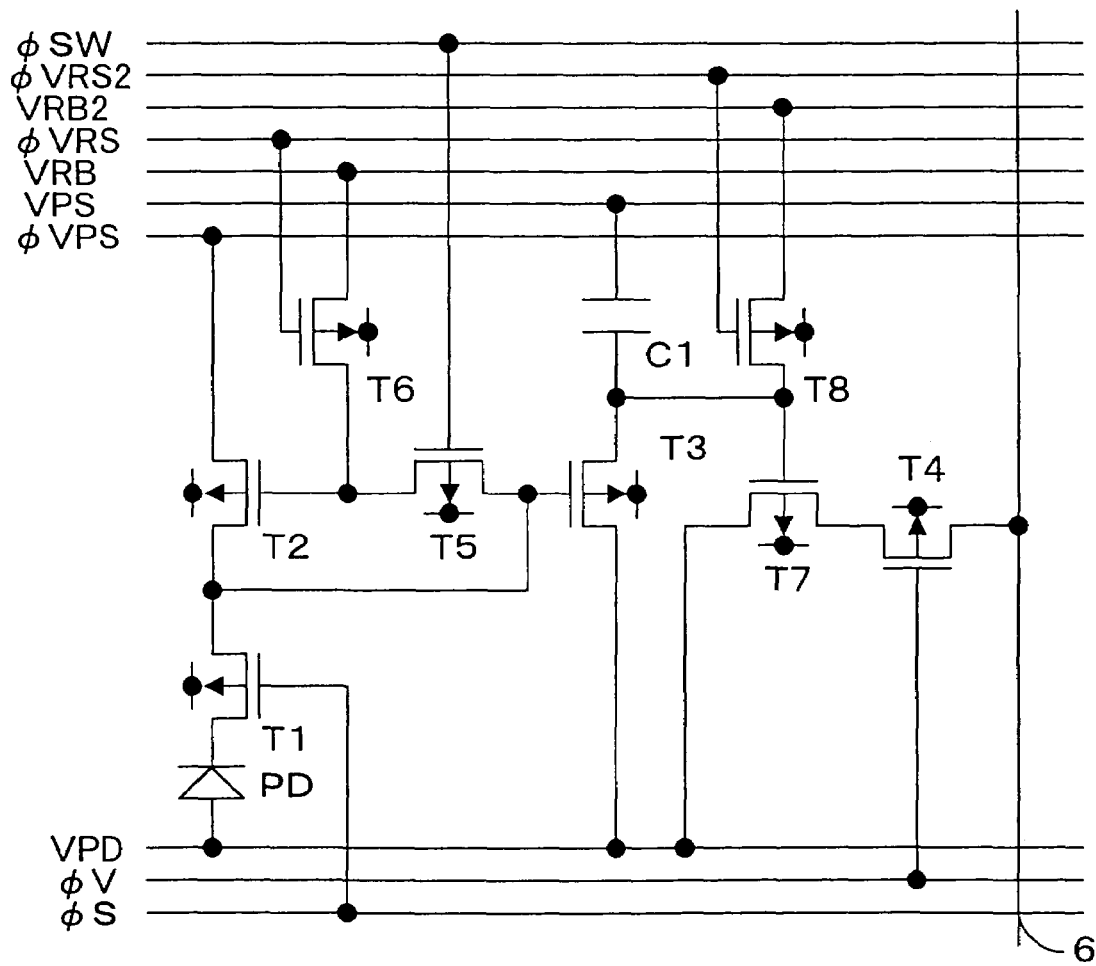
FIG. 66 is a circuit diagram showing the configuration of each pixel in a twenty-fourth embodiment of the invention.
Figure 67:
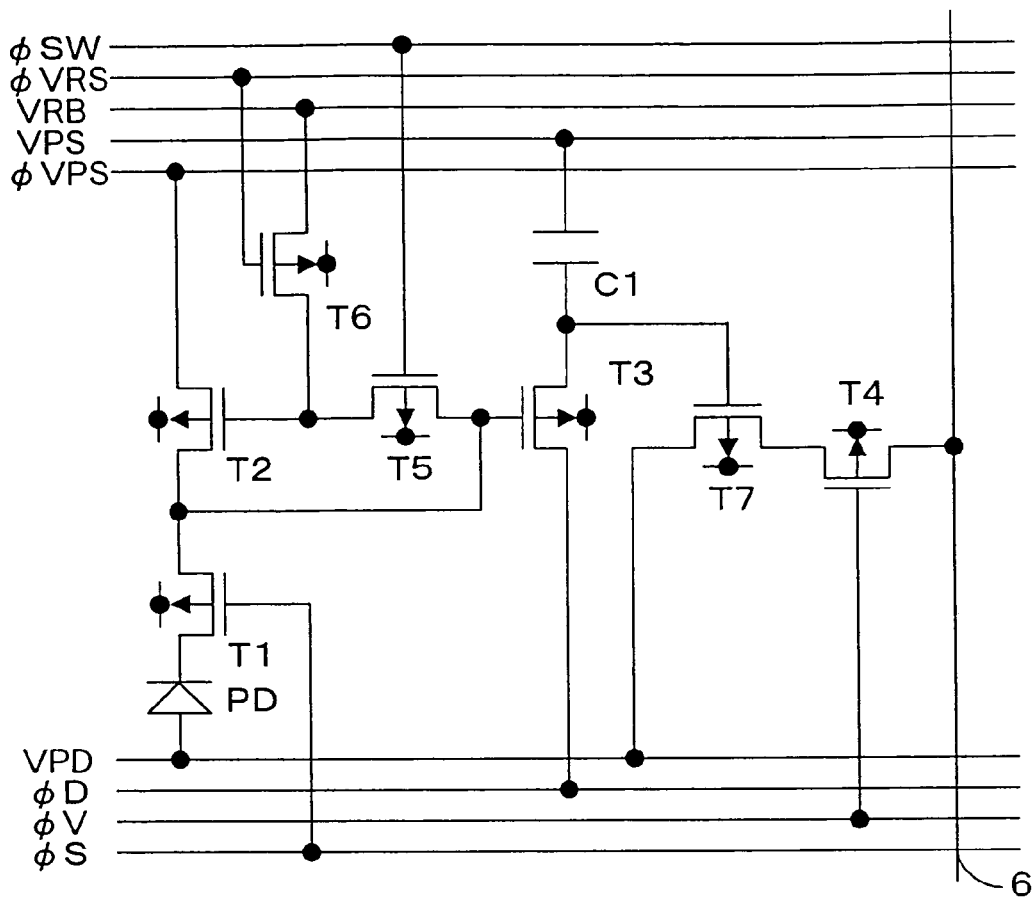
FIG. 67 is a circuit diagram showing the configuration of each pixel in a twenty-fifth embodiment of the invention.
Figure 68:
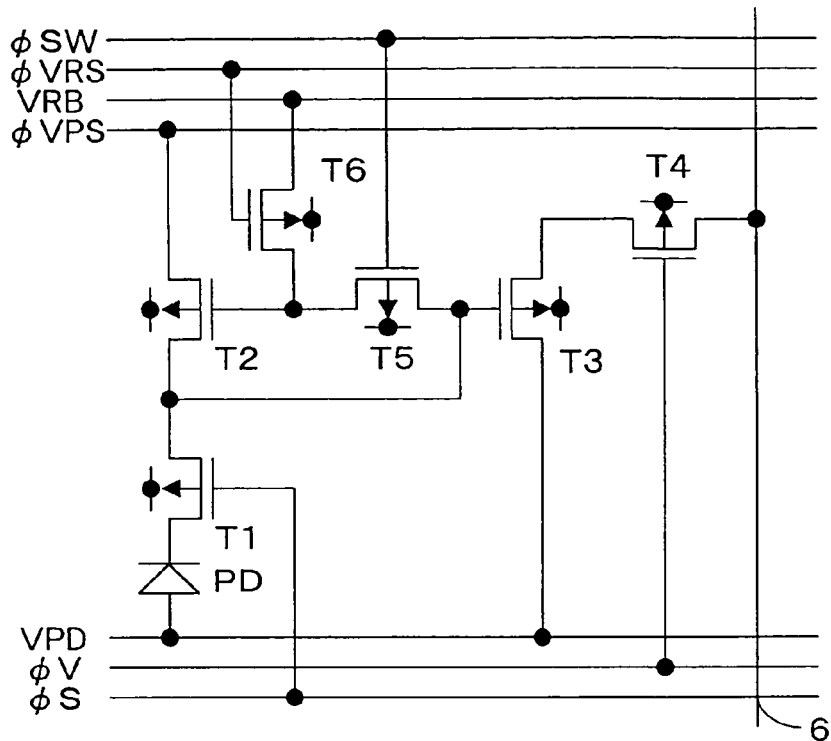
FIG. 68 is a circuit diagram showing the configuration of each pixel in a twenty-sixth embodiment of the invention.
Figure 69:
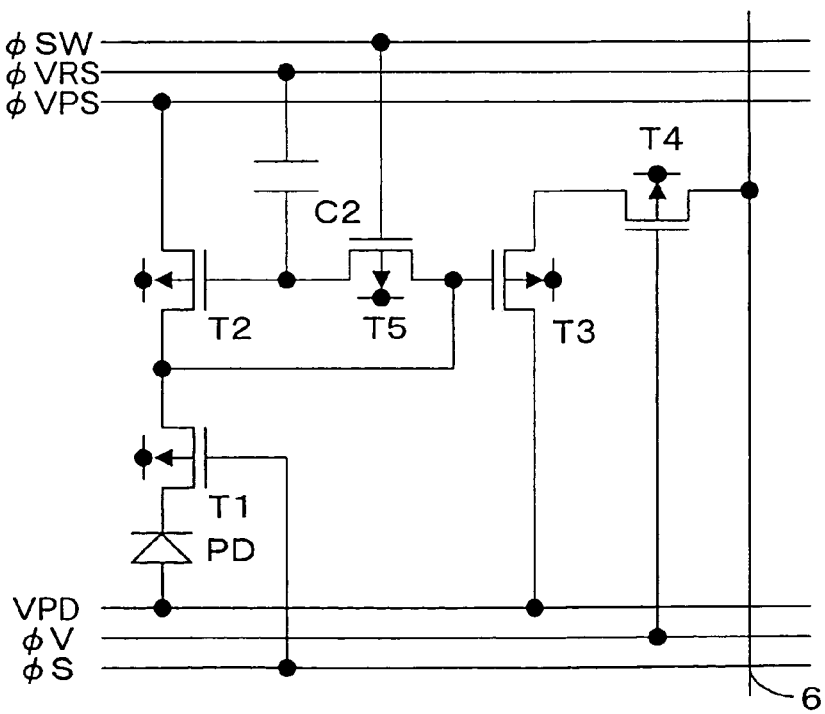
FIG. 69 is a circuit diagram showing the configuration of each pixel in a twenty-seventh embodiment of the invention.
Figure 70:
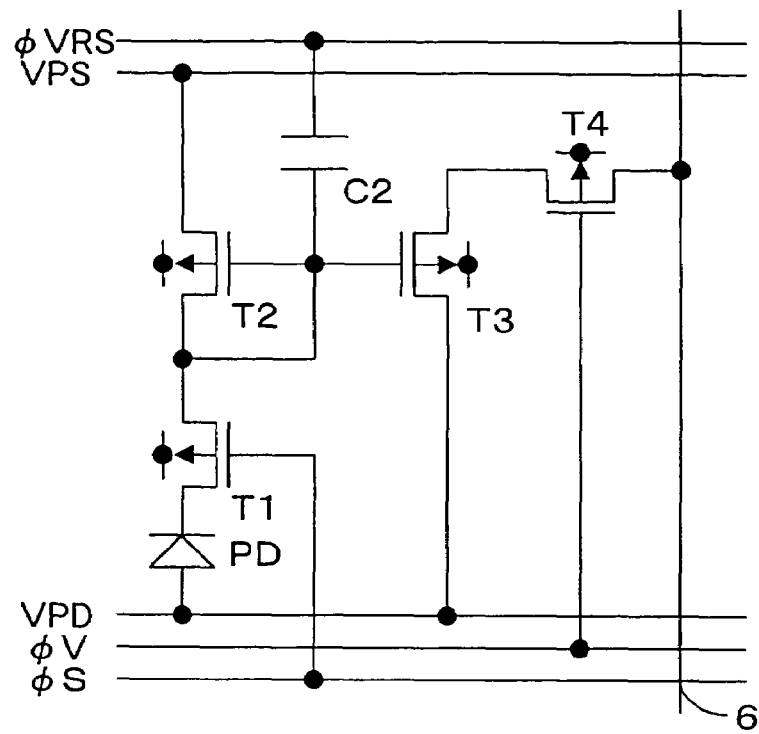
FIG. 70 is a circuit diagram showing the configuration of each pixel in a twenty-eighth embodiment of the invention.
Figure 71:
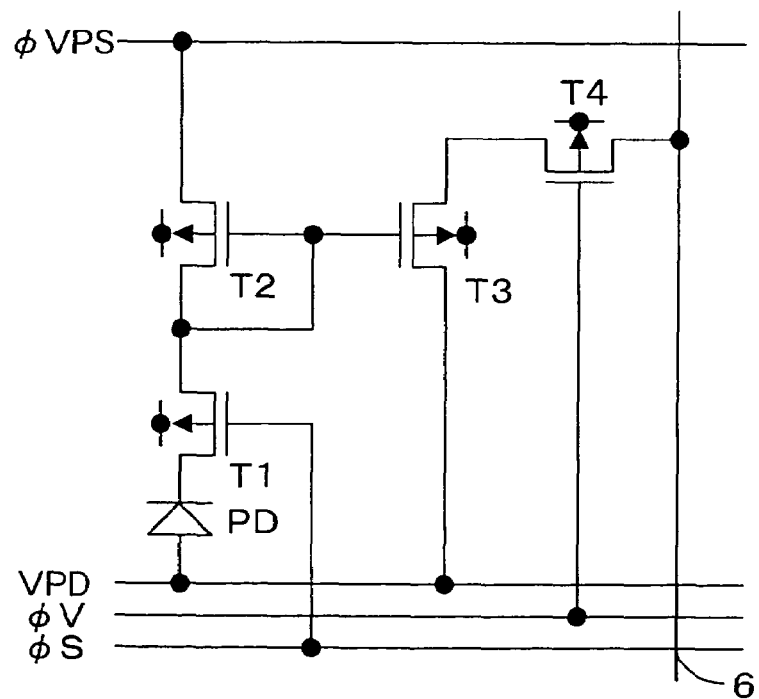
FIG. 71 is a circuit diagram showing the configuration of each pixel in a twenty-ninth embodiment of the invention.
Figure 72:
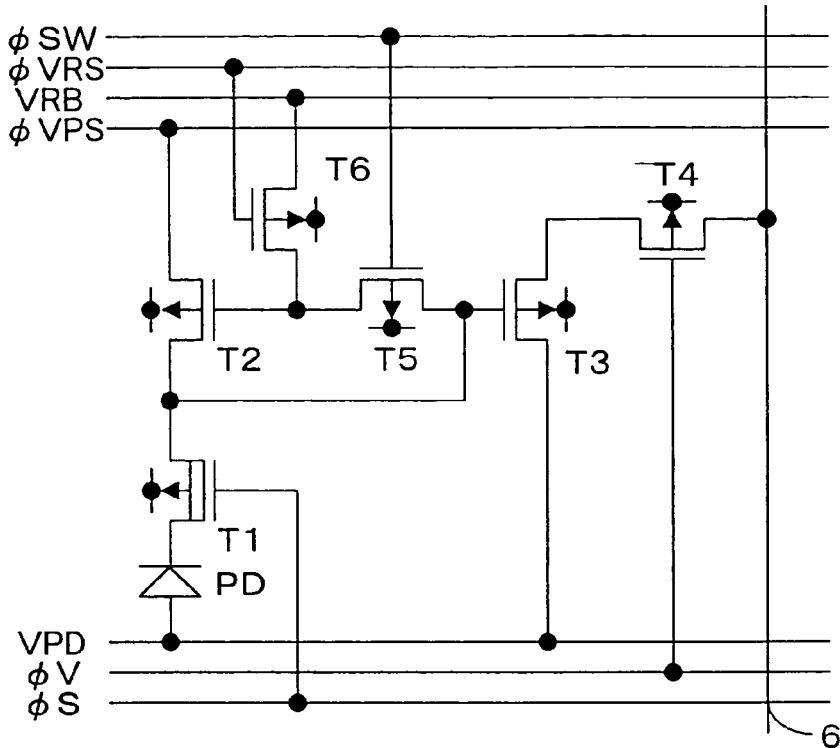
FIG. 72 is a circuit diagram showing an example of the configuration of each pixel in the twenty-sixth embodiment.
Figure 73:
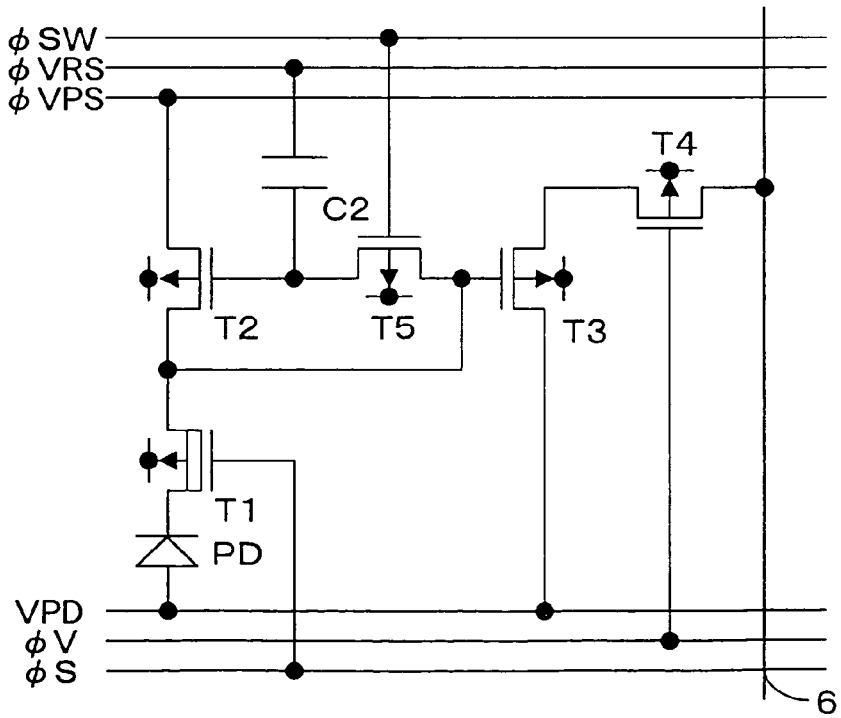
FIG. 73 is a circuit diagram showing an example of the configuration of each pixel in the twenty-seventh embodiment.
Figure 74:
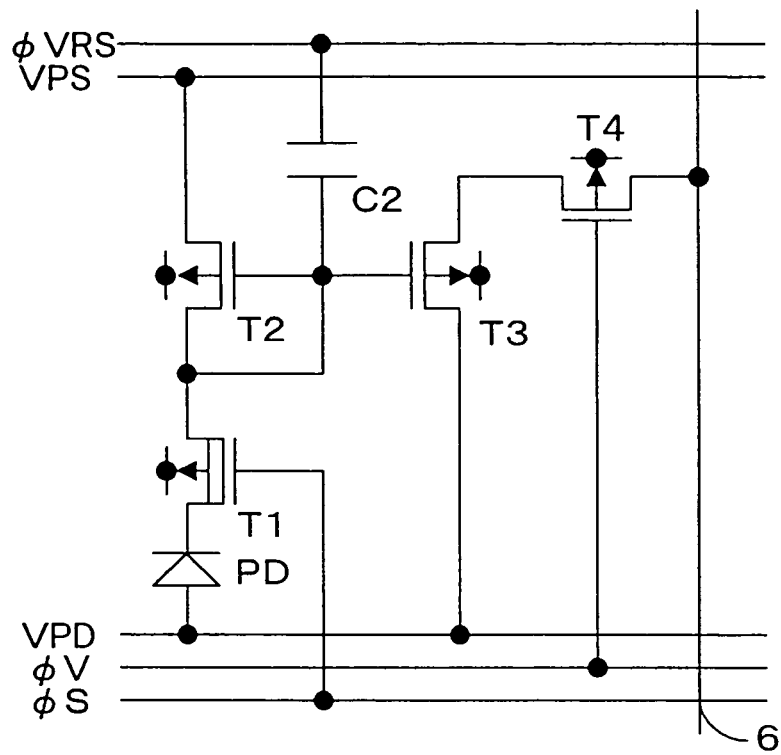
FIG. 74 is a circuit diagram showing an example of the configuration of each pixel in the twenty-eighty embodiment.
Figure 75:
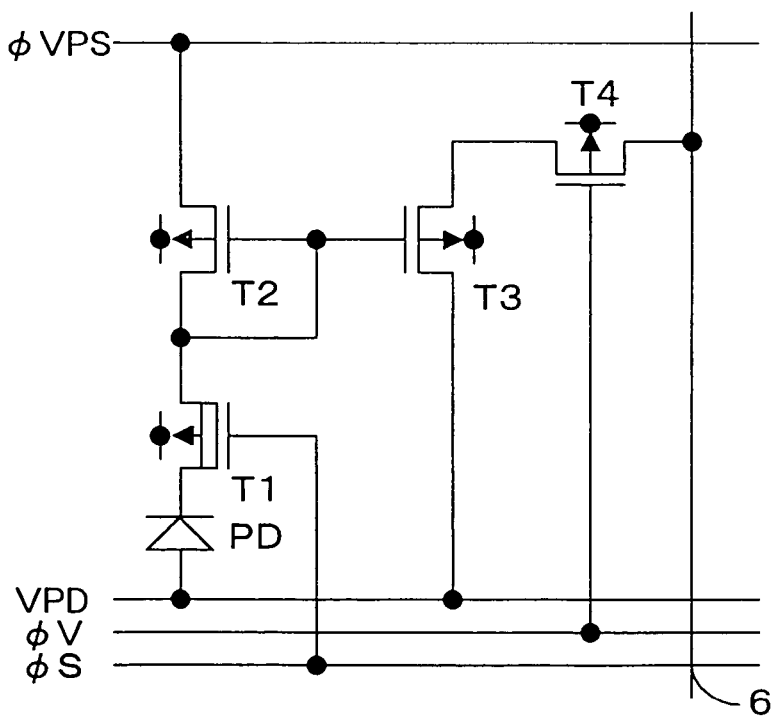
FIG. 75 is a circuit diagram showing an example of the configuration of each pixel in the twenty-ninth embodiment.
Figure 76:
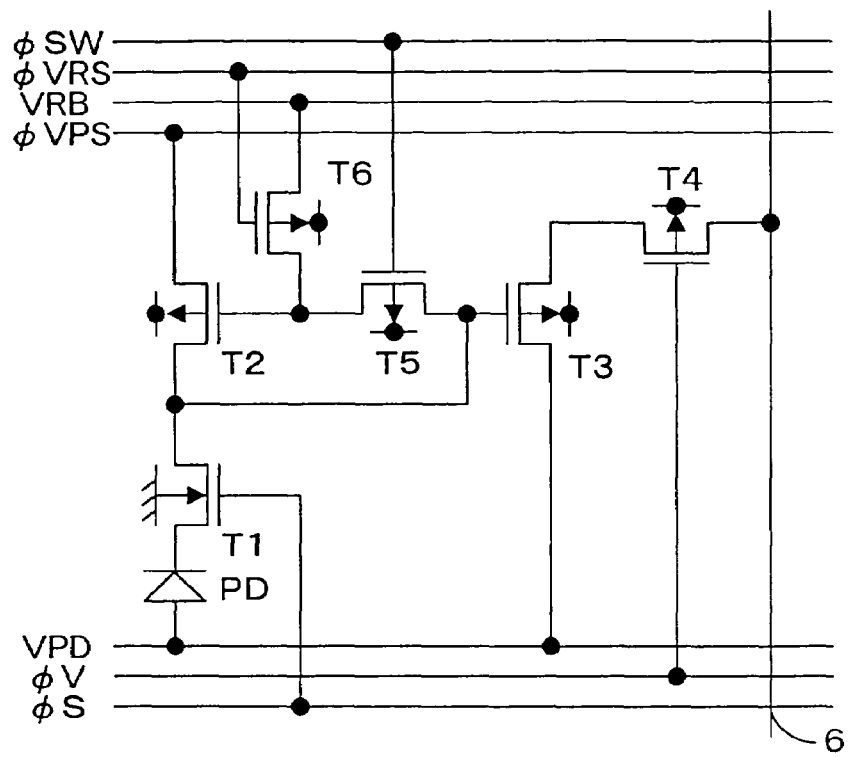
FIG. 76 is a circuit diagram showing another example of the configuration of each pixel in the twenty-sixth embodiment.
Figure 77:
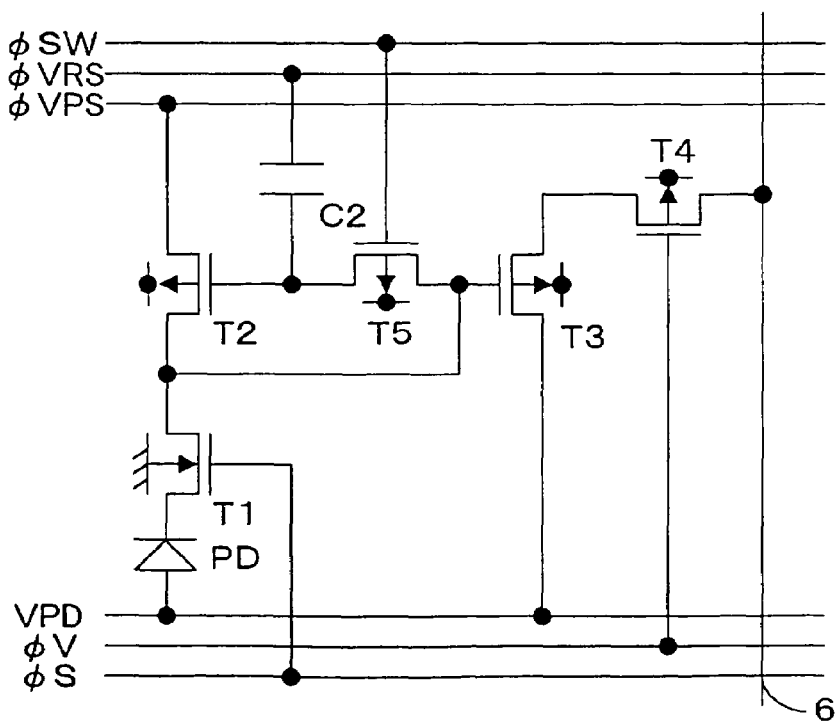
FIG. 77 is a circuit diagram showing another example of the configuration of each pixel in the twenty-seventh embodiment.
Figure 78:
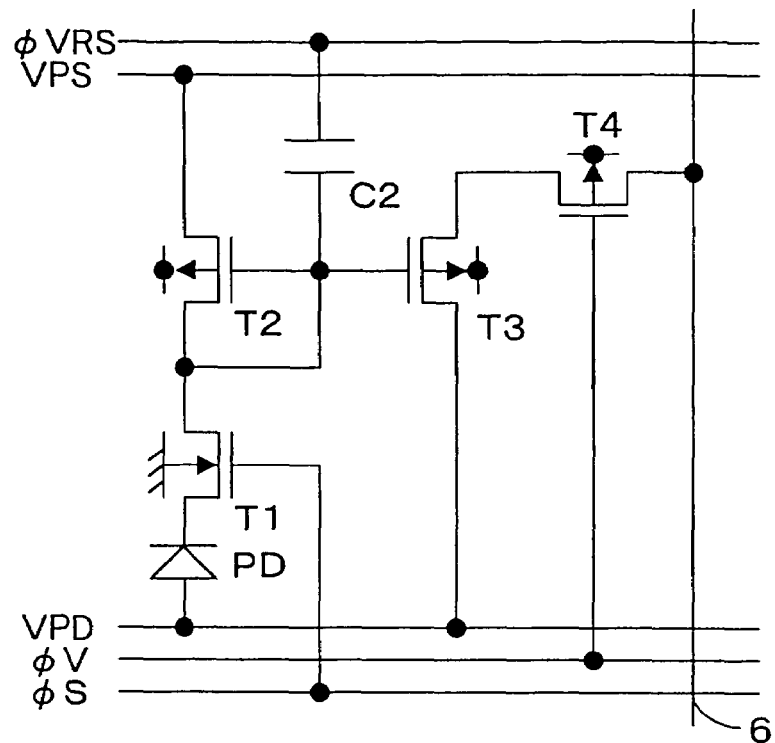
FIG. 78 is a circuit diagram showing another example of the configuration of each pixel in the twenty-eighty embodiment.
Figure 79:
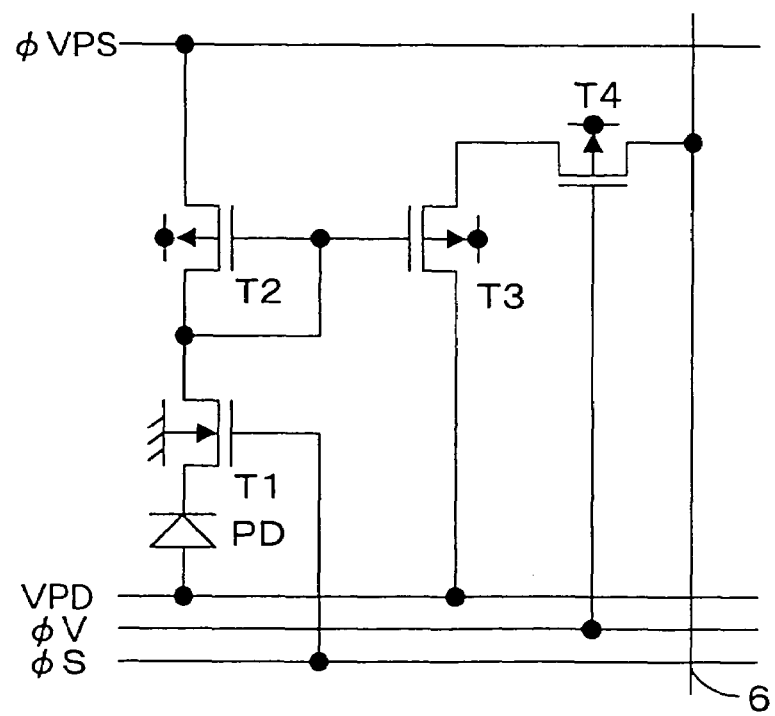
FIG. 79 is a circuit diagram showing another example of the configuration of each pixel in the twenty-ninth embodiment.
Figure 80:
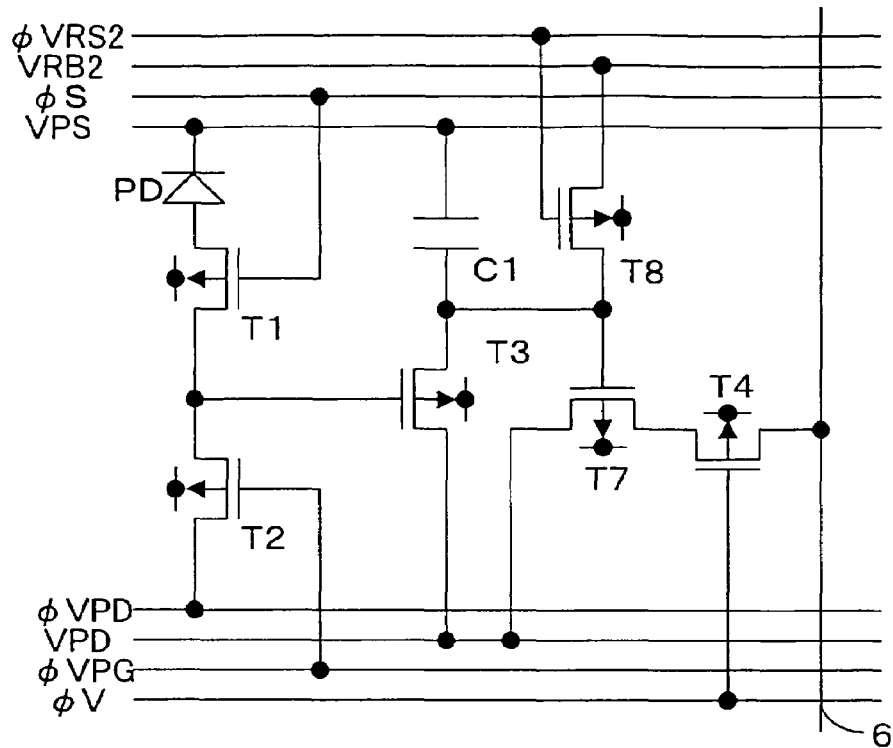
FIG. 80 is a circuit diagram showing the configuration of each pixel in a thirtieth embodiment of the invention.
Figure 81:
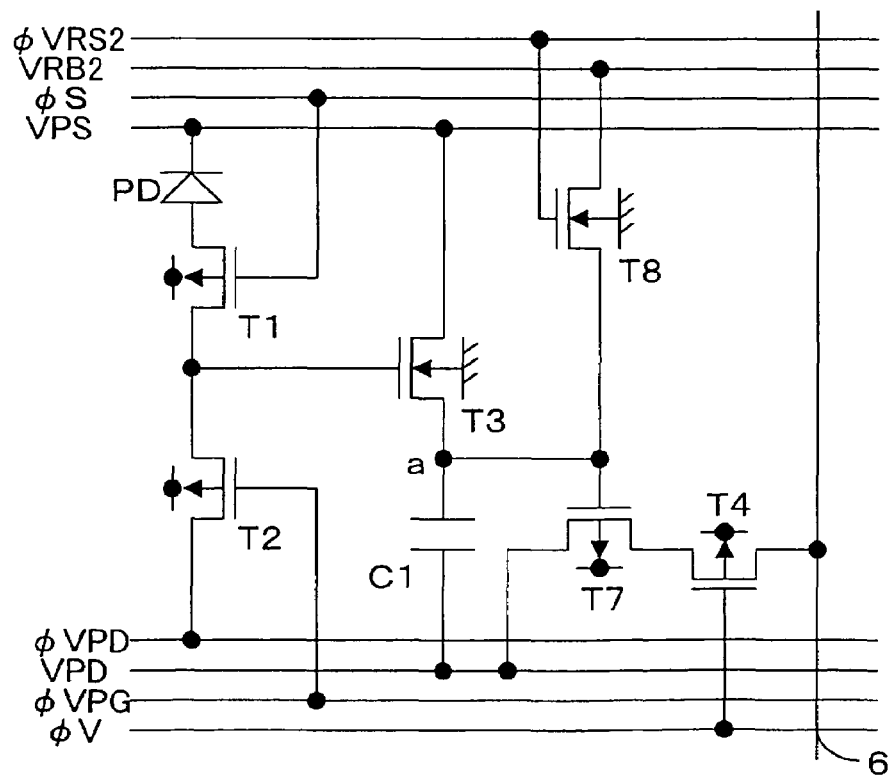
FIG. 81 is a circuit diagram showing the configuration of each pixel in a thirty-first embodiment of the invention.
Figure 82:
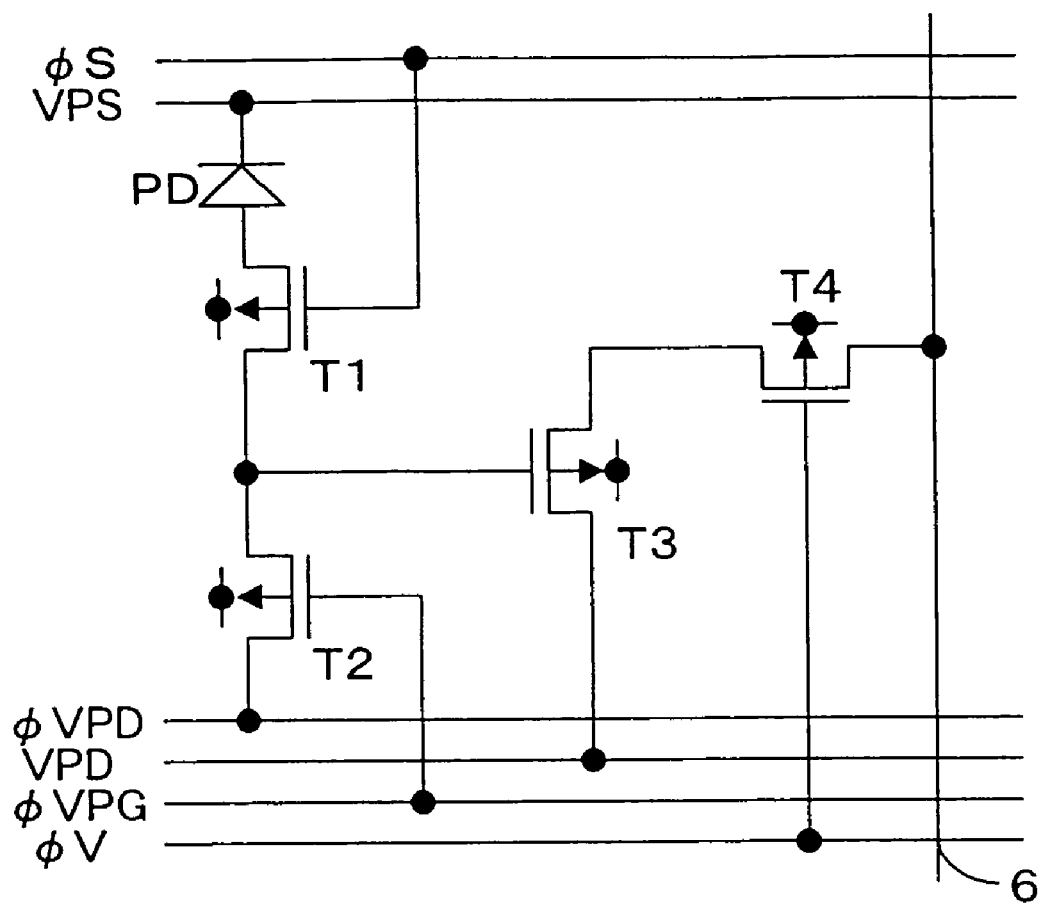
FIG. 82 is a circuit diagram showing the configuration of each pixel in a thirty-second embodiment of the invention.

Here, the MOS transistor Q1 serves as a load resistor or constant-current source for the MOS transistor Ta. Accordingly, the direct-current voltage VPSA connected to the source of this MOS transistor Q1 and the direct-current voltage VPDA connected to the drain of the MOS transistor Ta fulfill the relation VPDA<VPSA, where the direct-current voltage VPDA is equal to, for example, the ground-level voltage. The MOS transistor Q1 has its drain connected to the MOS transistor Ta, and receives a direct-current voltage at its gate. The P-channel MOS transistor Q2 is controlled by the horizontal scanning circuit 3 so as to feed the output of the amplifier circuit to the signal line 9 that serves as the final destination line. If, as in the twenty-fourth to thirty-second embodiments, the MOS transistor T4 provided within each pixel is explicitly illustrated, the circuit shown in FIG. 65A has a circuit configuration as shown in FIG. 65B.

How to Correct Image Data

Now, with reference to the drawings, an image input apparatus, such as a digital camera, embodying the invention will be described that employs a solid-state image-sensing device having pixels configured according to one of the first to thirty-eighth embodiments described above.

The image input apparatus shown in FIG. 95 includes the following components. An objective lens 51 introduces the light from a subject into the image input apparatus. A solid-state image-sensing device 52 outputs an electric signal in accordance with the amount of light introduced through the objective lens 51. A memory 53 receives the electric signal (hereafter referred to as the "image data") from the solid-state image-sensing device 52 and stores it temporarily during image sensing. Another memory 54 receives the electric signal (hereafter referred to as the "compensation data") from the solid-state image-sensing device 52 and stores it temporarily during resetting. A compensation circuit 55 corrects the image data stored in the memory 53 in accordance with the compensation data stored in the memory 54 by performing predetermined compensation calculation. A signal processor 56 performs predetermined processing on the image data corrected in accordance with the compensation data by the compensation circuit 55 and feeds out the processed image data. Here, the solid-state image-sensing device 52 has pixels configured according to one of the first to thirty-eighth embodiments.

This image input apparatus configured as described above operates as follows. First, image sensing is performed and image data is output pixel by pixel from the solid-state image-sensing device 52 to the memory 53. Then, after image sensing by the individual pixels, resetting is performed, and meanwhile, as described above, variations in sensitivity of the individual pixels are detected and output, as compensation data, to the memory 54. The image data stored in the memory 53 and the compensation data stored in the memory 54 are fed pixel by pixel to the compensation circuit 55.

The compensation circuit 55 corrects the image data fed from the memory 53 in accordance with the compensation data fed from the memory 54 by performing predetermined compensation calculation between the image data and compensation data of corresponding pixels. The image data thus corrected is fed to the signal processor 56, which performs predetermined processing on this image data and then feeds it out. As the memories 53 and 54, line memories or the like are used that can store the data that is output line by line from the solid-state image-sensing device 52. This makes incorporation of these memories 53 and 54 into the solid-state image-sensing device easy.

As described above, according to the present invention, in a solid-state image-sensing device provided in an image-sensing apparatus, a switch is provided between a photosensitive element and a first transistor having the first electrode thereof electrically connected to the photosensitive element, and resetting is performed with this switch off and with the first transistor in a state in which it permits a higher current to flow therethrough than during image sensing. This helps prevent the light incident on the photosensitive element from affecting resetting, and thereby ensure accurate resetting. Moreover, resetting makes the initial states of the individual pixels identical, and thereby reduce variations in sensitivity among the individual pixels.

Moreover, by detecting variations in sensitivity among the individual pixels by turning off two switches, one provided between a photosensitive element and a first transistor and the other provided between the control electrode and first electrode of the first transistor, or alternatively one provided between a photosensitive element and a second MOS transistor and the other provided between the gate electrode and first electrode of the second MOS transistor, and in addition varying the voltage fed to the control electrode and second electrode of the first transistor, or alternatively the voltage fed to the gate electrode and second electrode of the second MOS transistor, it is possible to detect variations in sensitivity among the individual pixels accurately. Moreover, using MOS transistors to form active elements makes high-density integration possible, and thus makes it possible to form them on a single chip together with peripheral processing circuits such as A/D converters, digital system processors, and memories.

Moreover, it is possible to reset the individual pixels quickly, and therefore it is possible to obtain quick response in image sensing. This makes it possible to obtain images free from after-images even when a dimly-lit subject is shot. As a result, there is no need to irradiate uniform light, as with a conventional solid-state image-sensing device, to obtain compensation data to be used to correct the outputs from the individual pixels during actual image sensing.

What is claimed is:

1. An image-sensing apparatus comprising:
   a plurality of pixels, the pixels each including a photoelectric conversion portion that outputs an electric signal produced in accordance with amount of incident light and converted natural-logarithmically and a lead-out path by way of which the electric signal output from the photoelectric conversion portion is fed to an output signal line, the photoelectric conversion portion comprising:
      a photosensitive element having a first electrode and a second electrode to which a direct-current voltage is applied;
      a first switch having one contact connected to the first electrode of the photosensitive element;
      a first transistor having a first electrode, a second electrode connected to another contact of the first switch, and a control electrode; and
      a second transistor having a first electrode to which a direct-current voltage is applied, a second electrode from which an electric signal is output, and a control electrode connected to the second electrode of the first transistor; and a controller that makes the individual pixels perform image sensing by turning on the first switch so that the first transistor operates in a subthreshold region and that detects variations in sensitivity of the individual pixels by turning off the first switch and varying a voltage fed to the first electrode of the first transistor.

2. An image-sensing apparatus as claimed in claim 1, wherein the first switch is a transistor.

3. An image-sensing apparatus as claimed in claim 1, wherein the pixels are arranged in a matrix.

4. An image-sensing apparatus comprising:
a plurality of pixels, the pixels each including:
- a photodiode having two electrodes, the photodiode producing an electric signal in accordance with amount of incident light;
- a first MOS transistor having a first electrode, a second electrode connected to one electrode of the photodiode, and a gate electrode;
- a second MOS transistor having a first electrode, a second electrode connected to the first electrode of the first MOS transistor, and a gate electrode; and
- a third MOS transistor having a first electrode, a second electrode, and a gate electrode connected to the second electrode of the second MOS transistor; and a controller that makes the individual pixels perform image sensing by turning on the first MOS transistor so that the second MOS transistor operates in a subthreshold region below a threshold voltage thereof and that detects variations in sensitivity of the individual pixels due to variations in the threshold voltage of the second MOS transistors by turning off the first MOS transistor and then varying a voltage fed to the first electrode of the second MOS transistor.

5. An image-sensing apparatus as claimed in claim 4, wherein the pixels each further include a fifth MOS transistor having a first electrode connected to the second electrode of the third MOS transistor, a second electrode connected to an output signal line, and a gate electrode connected to a line select line.

6. An image-sensing apparatus as claimed in claim 4, wherein the pixels each further include a fourth MOS transistor having a first electrode connected to a direct-current voltage, a second electrode, and a gate electrode connected to the second electrode of the third MOS transistor, the fourth MOS transistor amplifying a signal output from the second electrode of the third MOS transistor.

7. An image-sensing apparatus as claimed in claim 6, wherein the pixels each further include a fifth MOS transistor having a first electrode connected to the second electrode of the fourth MOS transistor, a second electrode connected to an output signal line, and a gate electrode connected to a line select line.

8. An image-sensing apparatus as claimed in claim 6, wherein the pixels each further include a capacitor having one end connected to the second electrode of the third MOS transistor and having another end connected to a direct-current voltage, the capacitor being reset through the third MOS transistor when a reset voltage is fed to the first electrode of the third MOS transistor.

9. An image-sensing apparatus as claimed in claim 8, wherein the third MOS transistor is a MOS transistor of an opposite polarity to the first and second MOS transistors.

10. An image-sensing apparatus as claimed in claim 6, wherein the first electrode of the third MOS transistor is connected to a direct-current voltage, and
wherein the pixels each further include:
- a sixth MOS transistor having a first electrode connected to the second electrode of the third MOS transistor, a second electrode connected to a direct-current voltage, and a gate electrode; and
- a capacitor having one end connected to the second electrode of the third MOS transistor and having another end connected to a direct-current voltage, the capacitor being reset through the sixth MOS transistor when a reset voltage is fed to the gate electrode of the sixth MOS transistor.

11. An image-sensing apparatus as claimed in claim 10, wherein the third and sixth MOS transistors are MOS transistors of an opposite polarity to the first and second MOS transistors.

* * * * *